United States Patent [19]
Takeyabu et al.

[11] Patent Number: 6,011,435
[45] Date of Patent: Jan. 4, 2000

[54] TRANSMISSION-LINE LOSS EQUALIZING CIRCUIT

[75] Inventors: Masato Takeyabu; Norio Murakami, both of Sapporo; Yasutaka Yamagata; Toshiyuki Sakai, both of Kawasaki, all of Japan

[73] Assignee: Fujitsu Limited, Kanagawa, Japan

[21] Appl. No.: 08/778,791

[22] Filed: Jan. 6, 1997

[30]     Foreign Application Priority Data

Jun. 12, 1996   [JP]   Japan ................................. 8-150825

[51] Int. Cl.[7] ........................................................ H03F 3/45
[52] U.S. Cl. ........................... 330/252; 330/258; 330/260
[58] Field of Search ................................ 330/9, 69, 252, 330/258, 260, 310

[56]                References Cited

U.S. PATENT DOCUMENTS

| | | | |
|---|---|---|---|
| 4,065,075 | 12/1977 | Holcomb | 242/199 |
| 4,108,004 | 8/1978 | Murakami | 73/432 R |
| 4,668,919 | 5/1987 | de Weck | 330/253 |
| 4,749,956 | 6/1988 | Torelli et al. | 330/260 X |
| 4,825,173 | 4/1989 | Cornett | 330/252 |
| 5,117,199 | 5/1992 | Wang et al. | 330/252 |
| 5,136,255 | 8/1992 | Fattaruso et al. | 330/9 |
| 5,621,357 | 4/1997 | Botti et al. | 330/260 X |

OTHER PUBLICATIONS

Tadakatsu Kimura, et al., "CMOS LSIs for a "Ping Pong" Transmission System", Kenkyu Zitsuyouka Houkoku 33–Kan 9–Gou, 1984, pp. 2085–2090.

Timothy H. Hu, et al., "A Monolithic 480Mb/s Parallel AGC/Decision/Clock–Recovery Circuit in 1.2–$\mu$m CMOS", IEEE Journal of Solid–State Circuits. vol. 28 No. 12, Dec. 1993, pp. 1314–1320.

Mihai Banu, et al., "Fully Differential Operational Amplifiers With Accurate Output Balancing", Dec. 1988, pp. 1410–1414.

Miran Milkovic, "Current Gain High–Frequency CMOS Operational Amplifiers", IEEE Journal of Solid–State Circuits, vol. SC–20 No. 4, Aug. 1985, pp. 845–851.

Ivars G. Finvers, et al., "A High Temperature Precision Amplifier", IEEE Journal of Solid–State Circuits, vol. 30 No. 2, Feb. 1995, pp. 120–128.

James H. Atherton, et al., "An Offset Reduction Technique for Use With CMOS Integrated Comparators and Amplifiers", Aug. 1992, pp. 1168–1175.

Yannis Tsividis, et al., "Continuous–Time MOSFET–C Filters in VLSI", IEEE Journal of Solid–State Circuits, vol. SC–21 No. 1, Feb. 1986, p.15–p.30.

*Primary Examiner*—Steven Mottola
*Attorney, Agent, or Firm*—Helfgott & Karas, P.C.

[57]              ABSTRACT

A transmission-line loss equalizing circuit includes an equalizer, a gain control circuit for controlling the gain of the equalizer based upon the peak value of an equalized output, a slicer for slicing the equalized output and outputting a data pulse, a timing extraction pulse and an equalization control pulse, a DC feedback level detector for detecting a DC component of the equalized output and feeding the DC component back to the equalizer, and an attenuating circuit provided as an initial stage of the equalizer. A plurality of √fAGC circuits constructing the equalizer are cascade-connected and constructed by a differential non-inverting amplifier.

29 Claims, 43 Drawing Sheets

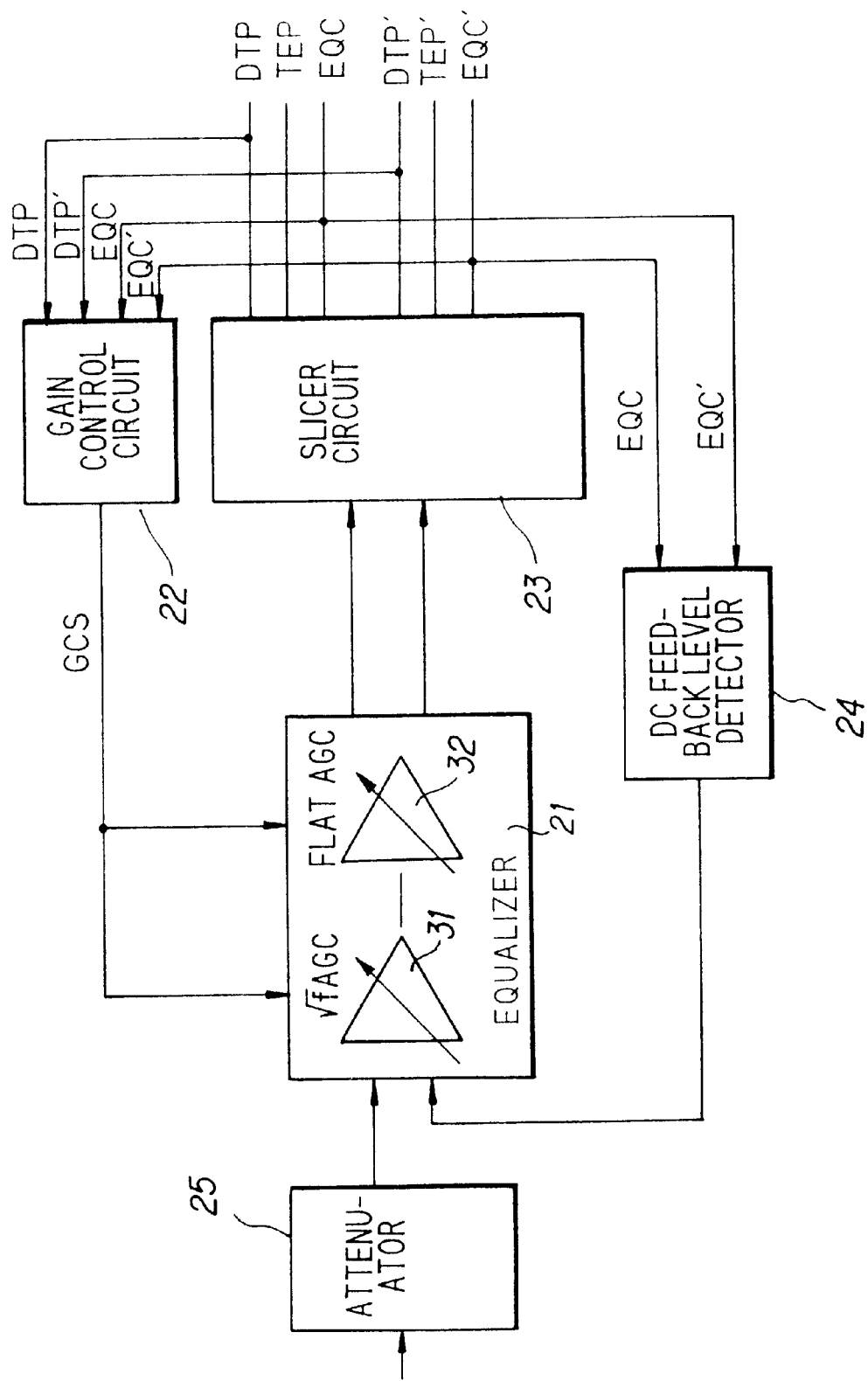

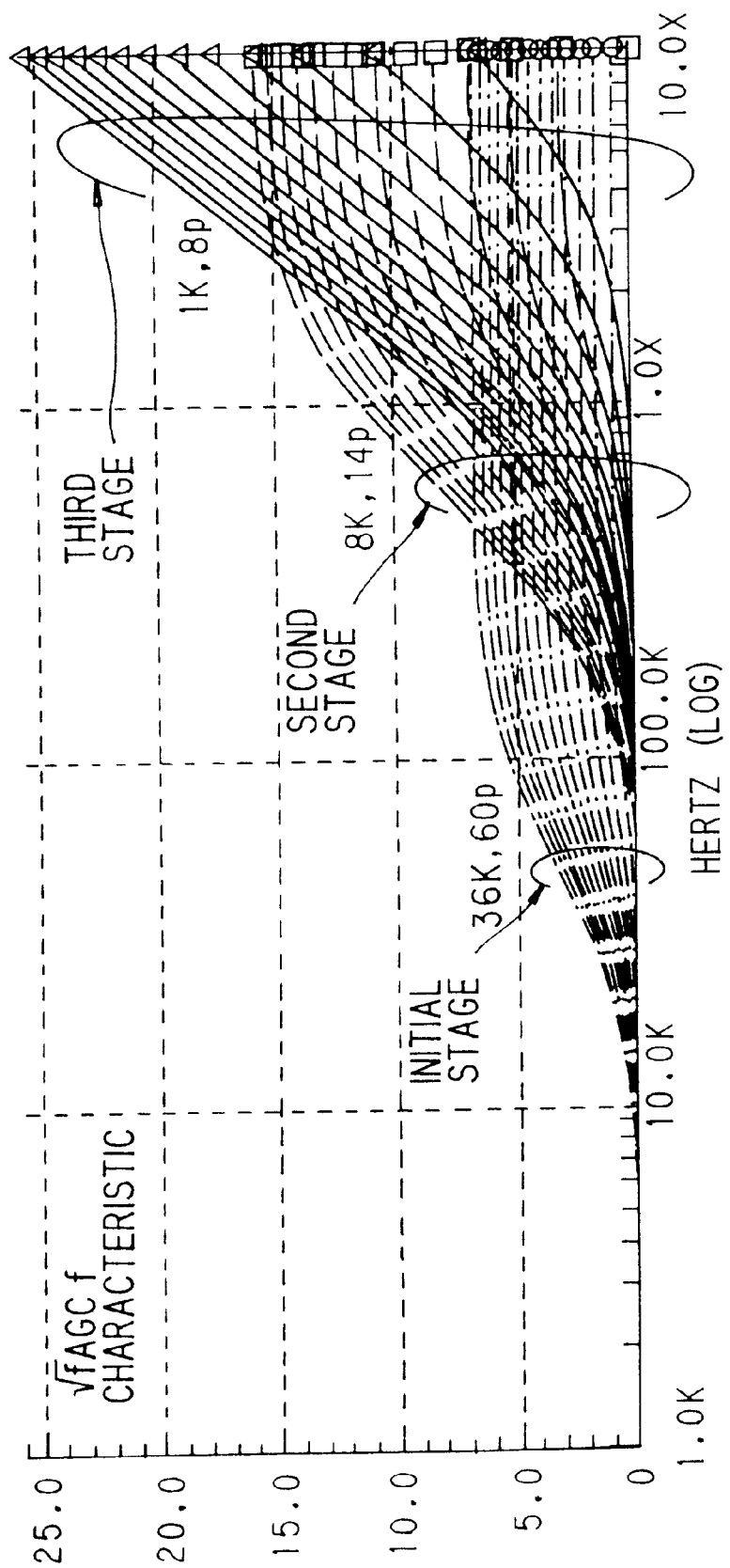

SINGLE-ENDED (PRIOR ART)

OP AMP WITH TWO PAIRS OF DIFFERENTIAL INPUTS AND ONE PAIR OF DIFFERENTIAL OUTPUTS

SINGLE-ENDED (PRIOR ART)

TRANSMISSION-LINE LOSS EQUALIZING CIRCUIT

BACKGROUND OF THE INVENTION

This invention relates to a transmission-line loss equalizing circuit and to various circuits which constitute this equalizing circuit. More particularly, the invention relates to a transmission-line loss equalizing circuit for automatically equalizing transmission-line loss and reproducing a signal at the receiving end of a system which transmits a PCM (pulse-code modulated) signal by a coaxial or balanced cable, as well as to various circuits for this transmission-line loss equalizing circuit.

In a signal transmission system which transmits a PCM signal by a coaxial or balanced cable, signal level declines with distortion of the signal waveform as the signal propagates through the transmission line. For this reason a transmission-line loss equalizing circuit is provided at a suitable location to equalize transmission-line loss automatically and reproduce the transmitted signal.

FIG. 37 is a diagram showing the architecture of a transmission-line loss equalizing circuit according to the prior art. The circuit includes a waveshaping equalizer 11 having a characteristic which is the inverse of the transmission-line loss and comprising a $\sqrt{f}$AGC circuit 11a, which is a primary high-pass filter the gain whereof varies as a function of the level of a gain control signal GCS, a flat AGC circuit 11, which is an amplifier circuit the gain whereof varies as a function of the level of the gain control signal GCS while a flat f characteristic is maintained, a low-pass filter (LPF1) 11c for reducing thermal noise produced mainly in these two amplification stages, and a differential amplifier 11d for outputting a signal conforming to the difference between the DC component of the equalized output and a reference voltage Vref4.

An equalization controller 12 has a peak detector 12a for detecting the peak value of the equalized output waveform, and a differential amplifier 12b for outputting, as the gain control signal GCS, a signal conforming to the difference between peak value of the equalized output waveform and a reference voltage Vref1.

A slicer 13 has a first comparator 13a for comparing the equalized output waveform and a reference voltage Vref2 and outputting a pulse TEP for timing extraction, and a second comparator 13b for comparing the equalized output waveform and a reference voltage Vref3 and outputting a data pulse DTP. The timing extraction pulse TEP, which enters a ELL circuit (not shown), serves as a data clock pulse in sync with which "1" and "0" logic levels of the data pulse DTP are output. In case of a bipolar signal (AMI signal or the like), non-inverting and inverting outputs are produced and therefore a total of four comparators and reference levels will be required.

An equalizing network 14 decides the time constant of the $\sqrt{f}$AGC circuit 11a, an LPF network 15 decides the time constant of the low-pass filter 11c, and a low-pass filter 16 converts the equalized output waveform to a direct current. The equalizer 11, equalization controller 12 and slicer 13 are provided in an integrated circuit, and the equalizing network 14, LPF network 15 and low-pass filter 16 are attached to the integrated circuit externally.

(1) Problem 1

FIG. 38 is a diagram showing the construction of the $\sqrt{f}$AGC circuit 11a. The latter includes an operational amplifier 11a-1, a variable resistor 11a-2 for feedback, a resistor 11a-3 and a capacitor 11a-4. As shown in FIG. 39, the f characteristic of the $\sqrt{f}$AGC circuit 11a compensates for transmission-line loss in the high-frequency region which increases in accordance with the square root of f in such a manner that high-frequency gain of the $\sqrt{f}$AGC circuit becomes large when variable resistance $r_x$ is increased and rises nearly in accordance with $\sqrt{f}$. If this is implemented by an MOS process, the variable resistor 11a-2 used is one in which drain-source impedance varies in dependence upon the gate voltage level. Such variation is reported in FIG. 6 of the IEEE Journal of Solid-State Circuits, Vol. Sc. 21, No. 1, February 1986.

In this conventional $\sqrt{f}$AGC circuit, the operational amplifier is single-ended. Consequently, the effects of a fluctuation in power-supply voltage, ground bounce (a fluctuation in ground voltage), power-supply noise and ground noise are significant.

A differential amplifier having a pair of differential inputs and a pair of differential outputs is reported in FIG. 6 of the IEEE Journal of Solid-State Circuits, Vol. Sc. 23, No. 6, December 1988. With this type of differential operational amplifier, however, a non-inverting amplifier circuit such as the $\sqrt{f}$AGC circuit of FIG. 38 cannot be implemented differentially. The above-mentioned literature also reports on a differential operational amplifier having two pairs of differential inputs and one pair of differential outputs. In this case, however, the differential outputs and a feedback input are directly coupled with in the integrated circuit. As a consequence, application of this amplifier is limited to a voltage follower.

(2) Problem 2

In a case where a transmission-line loss equalizing circuit is constructed in an integrated circuit, generally use is made of a simple equalizing circuit which, as shown in FIG. 40A, is provided with one $\sqrt{f}$AGC circuit 11a and one flat AGC circuit 11b. In other words, two circuits having the f characteristics shown in FIGS. 40B and 40C are connected to obtain the overall characteristic illustrated in FIG. 40D.

In this instance, a problem which arises is that the passive elements, namely the resistors and capacitors, that decide the time constant of the $\sqrt{f}$AGC circuit 11a must be constructed exterior to the integrated circuit (see the equalizing network 14 of FIG. 37). The reason for this is that the manufacturing dispersion of externally mounted parts is very small in comparison with the elements within an integrated circuit, and such parts are more stable with respect to variations in temperature. In a case where elements in an integrated circuit exhibit deviate greatly from a design reference value, the f characteristic of FIG. 40D moves parallel to the frequency axis and, hence, equalization error becomes very large and the eye aperture ratio of the equalized outputs becomes small. Even if external parts, which have little deviation, are used, equalization error differs markedly depending upon transmission line length; the greater the distance, the larger the equalization error, as is obvious from FIG. 40D.

(3) Problem 3

FIGS. 41A through 41D are diagrams showing configurations of transmission-line loss equalizing circuits for transmission lines of short and intermediate/long distance. These will be described taking a synchronous primary rate (1.544 Mbps) as an example. Numeral 1 denotes a transmission generator for generating transmitted waves, 2 a transmission line, 3 an attenuating circuit for attenuating the input signal level to an IC level and matching the level for terminating purposes, 4 a reproducing integrating circuit (short-distance reproducing IC) for short distance, and 5 a reproducing integrating circuit (intermediate/long-distance reproducing IC) for intermediate to long distances.

In the prior art, two types of arrangements are provided, namely the short-distance arrangement (FIG. 41A) mainly for interconnecting intra-office devices, and the intermediate/long-distance arrangement (FIG. 41B) used mainly in repeaters. These are selected depending upon transmission line length.

In this case, the transmission-line loss equalizing circuit often is not incorporated in the short-distance reproducing IC 4. This is because the loss in a transmission line of short distance is small (0~6 dB; see section 4.4 of the specifications ITU-T I.431 ISDN Primary-group Rate User Network Interface Layer 1) and also because deterioration of the eye aperture rate is not large enough to hamper transmission. In particular, with the synchronous primary rate interface, pre-equalization which subjects an overshoot or undershoot to the transmission waveform so as to cancel out several decibels of transmission-line loss, is carried out (see the pulse mask in FIG. 4-1 of the above-mentioned literature). Hence there is even less need of an equalizing circuit.

In the case of intermediate-to-long distance transmission, however, the maximum reception level is low. Accordingly, though it is not required that the attenuating circuit 3 be provided in front of the reproducing integrated circuit 5, as is done in short-distance transmission, the equalizing circuit is essential.

Transmission by optical fiber has recently come to be used instead of balanced or coaxial cable and repeaters in long-distance transmission. Since transmission by optical fiber requires costly opto-electric and electro-optical converters, there is increasing demand to achieve coverage over short to intermediate distances using the more economical balanced or coaxial cables. To meet this demand in the prior art, therefore, the measures shown in FIG. 41C have been adopted.

However, since the long-distance reproducing IC 5 cannot handle large input signals, the attenuating circuit 3 is necessary. In order to equalize transmission-line loss independently of transmission line length, the low-pass filter 6 for dealing with the loss of short-distance transmission lines is inserted in back of the attenuating circuit 3 to remove pre-equalized components that were applied to the transmission wave. Consequently, in addition to the passive elements mentioned in Problem 2 above, passive elements constructing the attenuating circuit 3 and low-pass filter 6 are required externally of the regenerating IC.

(4) Problem 4

The flat AGC circuit 11b is often used as shown in FIG. 42 as means for obtaining a change in the gain of a flat frequency characteristic.

In this arrangement, signals are attenuated by the attenuating circuit 3 irrespective of input level. In case of long-distance transmission, therefore, the input level in the amplification segment is very low and a large amount of noise is produced by the amplifier stage. The result is that the dynamic range of the equalizing circuit is limited.

(5) Problem 5

FIGS. 43A~43C are diagrams useful in describing arrangements for canceling DC offset, in which numeral 11 denotes an equalizer and 16 an externally mounted low-pass filter for converting an equalized output waveform to direct current.

In a case where a single-phase signal is handled, the DC feedback is applied, as shown in FIG. 43A, in order that the reference levels (Vref2, Vref3) and the DC component of the equalized output will maintain a constant voltage difference in the slicer 13 (FIG. 37). Further, in a case where differential signals are handled, DC feedback of the kind shown in FIGS. 43B and 43C is applied in such a manner that the non-inverting and inverting equalized output DC components will become equal. In FIG. 43C, the amplifier used is one having a pair of auxiliary differential inputs in addition to the ordinary pair of differential inputs.

In these examples, passing the output signal through the low-pass filter 16 is adopted as the method of extracting the DC components of the equalized output. This method requires that the time constant of the low-pass filter 16 be large, and the elements constructing the low-pass filter must be disposed externally of the integrated circuit. In general, values allowed for resistance and capacitance capable of being built in an integrated circuit are very small in comparison with external elements.

(6) Problem 6

When a bipolar signal is processed in a single phase and is sliced at two (positive and negative) reference levels in the slicer circuit 13, the duties of the positive and negative pulses are not in good balance, as shown in FIG. 44. More specifically, when an offset $V_{of}$ is superposed on normal reference levels Vref1', Vref2' in the same direction, the reference levels Vref1, Vref2 change, a difference appears in the pulse width (duty) of the slicer data and poor balance results.

(7) Problem 7

The comparator constituting the slicer circuit 13 has an input offset. In case of a CMOS, the offset is large, on the order of several tens of millivolts. Such offsets lower the substantial eye aperture ratio and worsens the positive/negative balance of the slice data pulse width.

As an example of a method of canceling offset of a MOS differential pair, see the IEEE Journal of Solid-state Circuits, Vol. 27, No. 8, August 1992, "An Offset Reduction Technique for use with CMOS Integrated Comparators and Amplifiers," pp. 1168~1175, and the IEEE Journal of Solid-state Circuits, Vol. 30, No. 2, February 1995, "A High-Temperature Precision Amplifier," pp. 120~128. However, the former requires complex digital control and the latter is an operational amplifier and must be used as a negative feedback circuit. Both, therefore, are unsuited for slicers.

(8) Problem 8

FIG. 45 is a diagram showing the construction of the peak detecting circuit 12a according to the prior art. The circuit includes a comparator or differential amplifier 12a-1 for comparing the magnitudes of the equalized output signal and of a held peak signal, a switch 12a-2 that turns ON (closes) when the equalized output signal is larger than the peak signal and that turns OFF (opens) when the equalized output signal is smaller, a peak holding capacitor 12a-3, a current source 12a-4 of a constant current $i_1$ for charging the capacitor, and a current source 12a-5 of a constant current $i_2$ ($<i_1$) for discharging the capacitor.

In terms of basic operation, the switch 12a-2 turns ON when a level higher than the output enters, whereby the current $i_1$ flows into the capacitor 12a-3 and the output level rises. When a level lower than the output enters, the switch 12a-2 turns OFF so that the electric charge that has accumulated in the capacitor 12a-3 is discharged, as a result of which the level falls. The foregoing is for a single-ended arrangement but the fundamental operation is the same even in a differential arrangement.

In the arrangement of FIG. 45, the discharge current is constant and independent of input and output. This means that the waveform changes depending upon the pulse density (the "1"s percentage) of the input data pattern. In order to prevent this in the prior art, the capacitor 12a-3 is provided externally and the time constant must be enlarged.

SUMMARY OF THE INVENTION

Accordingly, an object of the present invention is to provide a differential operational amplifier for a √fAGC circuit capable of solving Problem 1, i.e., of diminishing the influence of a fluctuation in power-supply voltage, a fluctuation in ground voltage, power-supply noise and ground noise, as well as a differential non-inverting amplifier circuit and a differential voltage follower.

A second object of the invention is to provide a transmission-line loss equalizing circuit that solves Problem 2, the equalizing circuit making it possible to set an equalization curve in precise fashion and to realize smaller equalization deviation without external elements mounted externally of an integrated circuit.

A third object of the invention is to provide a transmission-line loss equalizing circuit that solves Problem 3, the equalizing circuit making it possible to deal with short-to-intermediate distance transmission lines and to obtain an equalized waveform that is independent of transmission line length.

A fourth object of the invention is to provide a transmission-line loss equalizing circuit that solves Problem 4, the equalizing circuit making it possible to reduce thermal noise and to broaden dynamic range correspondingly.

A fifth object of the invention is to provide a DC feedback level detecting circuit that solves Problem 5 by making it possible to detect and feed back DC components of an equalized output without using a external low-pass filter.

A sixth object of the invention is to provide a slicer that solves Problem 6, the slicer making it possible to hold slice-data pulse width constant, to perform a level shift irrespective of variances in resistance elements and to reduce equalization deviation.

A seventh object of the invention is to solve Problem 7 by keeping input offset sufficiently small and slicing an equalized output waveform, which is a continuous signal, to improve the pulse waveform balance between positive and negative slice data.

An eighth object of the invention is to provide a gain control circuit that solves Problem 8 by making it possible to control equalization independently of input-data pulse density without using external elements.

In accordance with the present: invention, the first object is attained by providing an operational amplifier having two differential input circuit, one circuit comprising a non-inverting input terminal and an inverting feedback input terminal end the other circuit comprising an inverting input terminal and a non-inverting feedback input terminal, one pair of differential output terminals and a balance-level input means for deciding average DC levels of the pair of differential output terminals, or an operational amplifier having two differential input circuit, one circuit comprising a non-inverting input terminal and an inverting feedback input terminal and the other circuit comprising an inverting input terminal and a non-inverting feedback input terminal, one pair of differential output terminal, a first balance level input for deciding an average DC level of a non-inverted output of the pair of differential output terminals, and a second balance-level input for deciding an average DC level of an inverted output of the pair of differential output terminals.

Further, in accordance with the invention, the first object is attained by providing a differential non-inverting amplifier circuit in which the non-inverting input, inverting input, non-inverting output and inverting output of the operational amplifier serve as a first input, second input, first output and second output, respectively, a first passive element is connected between the inverting feedback input and ground, a second passive element having an impedance equal to that of the first passive element is connected between the non-inverting feedback input and ground, a third passive element is connected between the inverting feedback input and the non-inverting output, and a fourth passive element having an impedance equal to that of the third passive element is connected between the non-inverting feedback input and the inverting output.

Further, in accordance with the invention, the first object is attained by using a differential variable high-pass filter as a √fAGC circuit, the differential variable high-pass filter having the above-described differential non-inverting amplifier circuit, having circuits, which are obtained by serially connecting a resistor and a capacitor, as the first and second passive elements of the differential non-inverting amplifier circuit, and having variable resistors as the third and fourth passive elements of the differential non-inverting amplifier circuit.

In accordance with the invention, the second object is attained by providing a transmission-line loss equalizing circuit having differential variable high-pass filters cascade-connected in a plurality of stages within an integrated circuit, wherein a first resistor and a first capacitor of the variable high-pass filters and variable resistors are provided within the integrated circuit.

In accordance with the invention, the third object is attained by providing a transmission-line loss equalizing circuit in which one ends of resistors of equal resistance values are connected to respective differential outputs of a differential variable high-pass filter, other ends of these resistors are adopted as respective differential outputs, and a circuit having an impedance value equal to that of the serially connected resistor-capacitor circuit: serving as the first or second passive element of the differential variable high-pass filter is provided between the differential outputs.

In accordance with the invention, the fourth object is attained by providing a transmission-line loss equalizing circuit in which a variable attenuating circuit is provided in front of a differential variable high-pass filter.

In accordance with the invention, the fifth object is attained by providing a DC feedback level detecting circuit comprising a first current source for charging, a first switch for controlling the first current source, a second current source for discharging, a second switch for controlling the second current source, a slicer circuit for outputting a first control signal when a first differential signal (equalizing non-inverted signal) output by an equalizer has exceeded a set level, and for outputting a second control signal when a second differential signal (equalized inverted signal) exceeds the set level, means for controlling on/off operation of the first switch in response to the first control signal and on/off controlling the second switch in response to the second control signal, and an integrating circuit for integrating a difference between a charging current and a discharging current and delivering an integrated output as a DC component of an equalized output.

In accordance with the invention, the sixth object is attained by providing a slicer circuit having a resistance-divided level shifter, characterized by having, as a current source of the slicer circuit, an operational amplifier in which a stabilized voltage is applied to a non-inverting input terminal, a resistor, which is an internal element of an integrated circuit, provided between an inverting input terminal of the operational amplifier and ground, and an N-channel MOSFET in which an output of the operational amplifier is connected to a gate and a source is connected to the inverting input terminal of the operational amplifier, a drain of the N-channel MOSFET serving as an output terminal.

In accordance with the invention, the seventh object is attained by providing a comparator comprising non-inverting input, inverting input and output terminals, an amplifier having differential inputs and auxiliary differential inputs, first switch means for short-circuiting the non-inverting And inverting sides of the differential inputs of the amplifier circuit in a first state and short-circuiting the inverting input terminal and the inverting input of the amplifier circuit in a second state, and a second switch for connecting an output from the amplifier circuit and the inverting auxiliary input of the amplifier circuit via a resistor and short-circuiting the output terminal to ground in a first state and short-circuiting the output terminal and the output of the amplifier circuit in a second state, wherein the non-inverting input terminal and the non-inverting side of the differential inputs of the amplifier circuit being connected, a reference voltage being applied to the non-inverting auxiliary input of the amplifier circuit, and a charge preserving circuit being connected to the inverting auxiliary input of the amplifier circuit.

In accordance with the invention, the eighth object is attained by providing a transmission-line loss equalizing circuit comprising a first current source for charging, a first switch for controlling the first current source, a second current source for discharging, a second switch for controlling the second current source, means for turning the first switch ON when signal amplitude of an equalizer output exceeds a reference level, means for turning the second switch ON for a predetermined period of time whenever the equalizer output attains a high level, an integrating circuit for integrating a difference between a charging current and a discharging current, and a gain control circuit for delivering an output from the integrating circuit as a gain control signal of the equalizer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a diagram showing the configuration of a transmission-line loss equalizing circuit according to the present invention;

FIG. 3 shows the f characteristic of √fAGC;

Figure 2A:
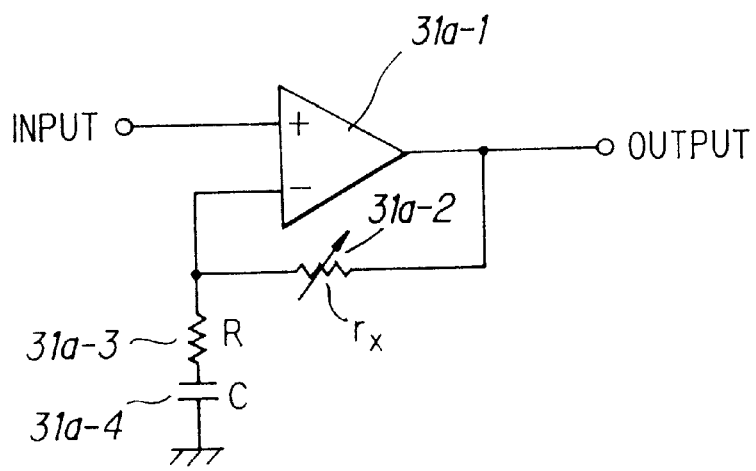
FIGS. 2A and 2B are circuit diagrams of a √fAGC circuit.

DESCRIPTION OF THE PREFERRED EMBODIMENTS (A) Overall configuration

FIG. 1 is a diagram showing the overall configuration of a transmission-line loss equalizing circuit according to the present invention. All the circuit blocks are implemented in a same integrated circuit chip.

The circuit includes a waveshaping equalizer 21 having a characteristic which is the inverse of transmission-line loss. The equalizer 21 has a $\sqrt{f}$AGC circuit 31, which is a primary high-pass filter the gain whereof varies as a function of the level of a gain control signal GCS, and a flat AGC circuit 32, which is an amplifier circuit the gain whereof varies as a function of the level of the gain control signal GCS while a flat f characteristic is maintained. A gain controller 22 detects the peak value of an equalized output waveform and outputs the gain control signal GCS based upon the peak value. A differential equalized non-inverted output signal and a differential equalized inverted output signal enter a slicer circuit 23, which outputs data pulses DTP, DTP', timing extraction pulses TEP, TEP' and equalization control pulses EQC, EQC' for peak-value detection from non-inverting and inverting sides, respectively. A DC feedback level detector 24 detects the difference between DC components (in case of single-phase signals) or between non-inverted and inverted DC levels (in case of differential signals) of the equalized output and feeding the difference back to the input side of the equalizer 21. An attenuating circuit 25 attenuates the transmission signal level.

A signal that has arrived from a transmission line on the input side is attenuated to a predetermined level by the attenuating circuit and then fed into the equalizer 21. The latter equalizes the input signal using a characteristic that is the inverse of the loss characteristic of the transmission line and applies the equalized signal to the slicer circuit 23. The latter generates data pulses, timing extraction pulses and equalization control signal pulses for peak-value detection. A data regenerating unit (not shown) reads the data pulses in sync with the timing extraction pulses and sends the data pulses to the transmission line on the output side.

The gain control circuit 22 detects the peak value of the equalized output and, on the basis of the peak value, outputs the gain control signal GCS that controls the gain of the $\sqrt{f}$AGC circuit 31 and flat AGC 32 of the equalizer 21. The gain of the equalizer 21 is controlled in such a manner that the peak value of the equalized output is rendered constant. The DC feedback level detecting circuit 24 detects the difference between non-inverted and inverted DC levels (in case of differential signals), feeds the difference back to the input side of the equalizer 21 and exercises control in such a manner that the difference becomes zero.

Figure 2B:
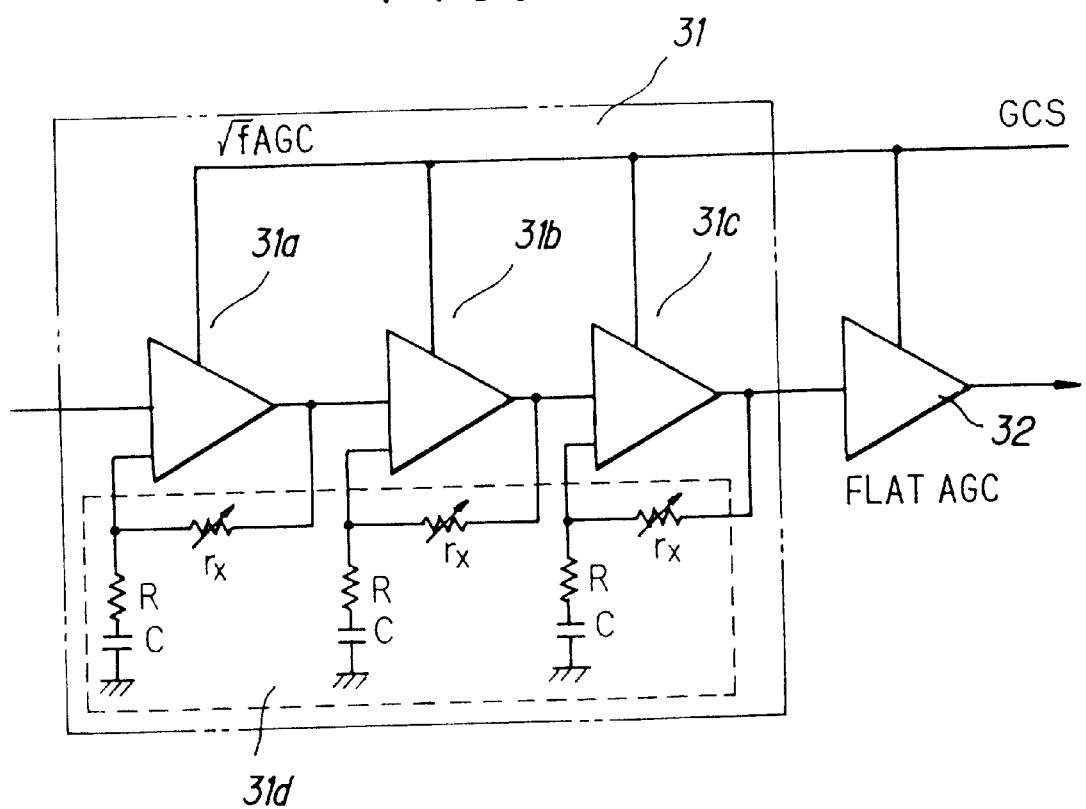
Figure 38:
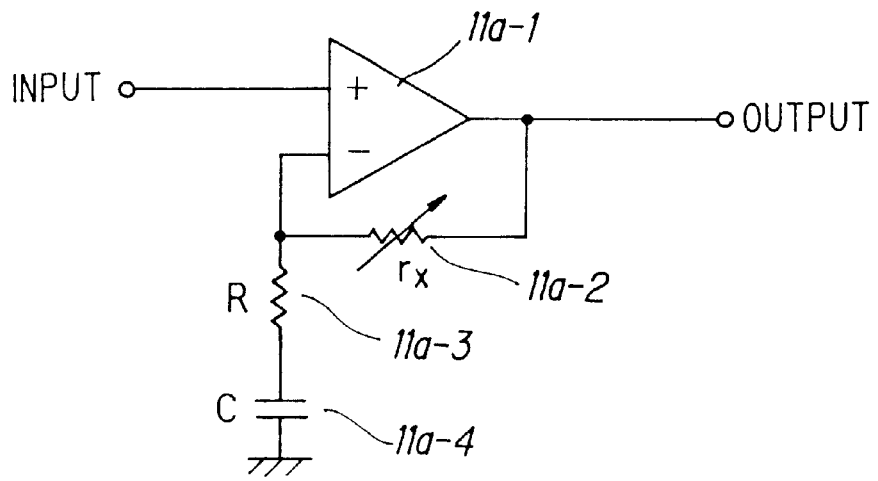
FIG. 38 is a diagram showing the construction of a $\sqrt{f}$AGC circuit.
Figure 39:
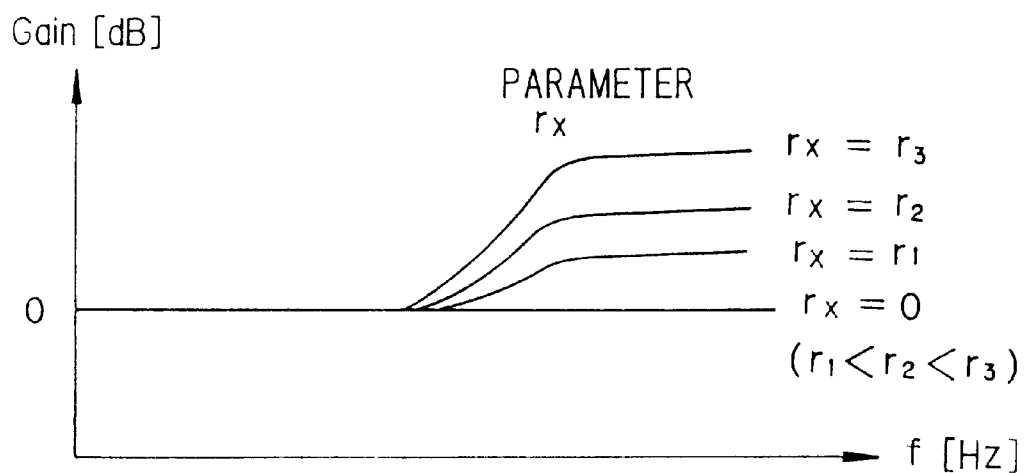
FIG. 39 is a diagram showing the f characteristic of a $\sqrt{f}$AGC circuit.
Figure 40A:
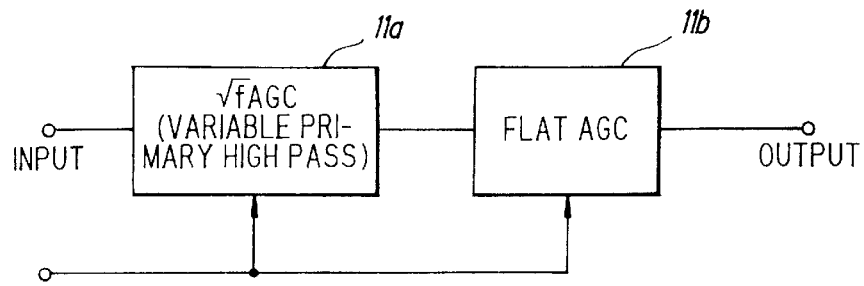
FIGS. 40A illustrates the construction of a simple equalizing circuit.
Figure 40B:
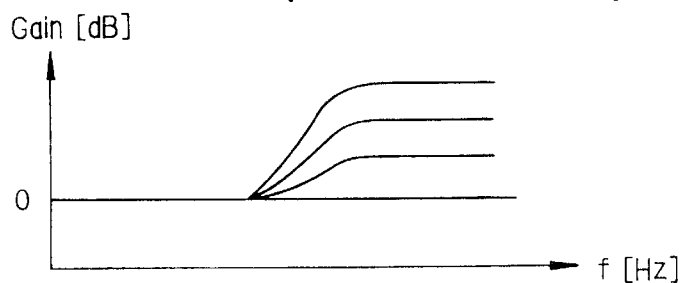
FIGS. 40B, 40C and 40D are f characteristic diagrams.
Figure 40C:
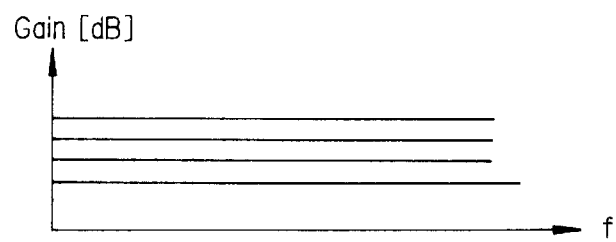
Figure 40D:
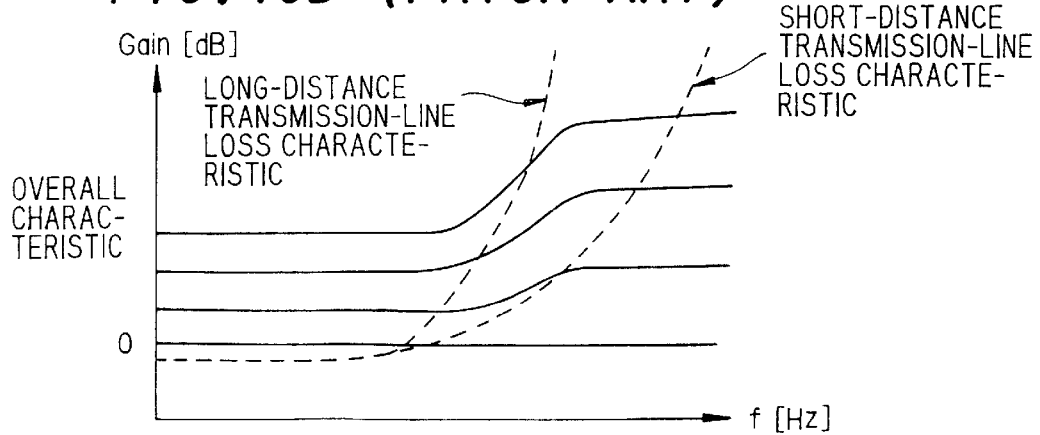
Figure 41A:
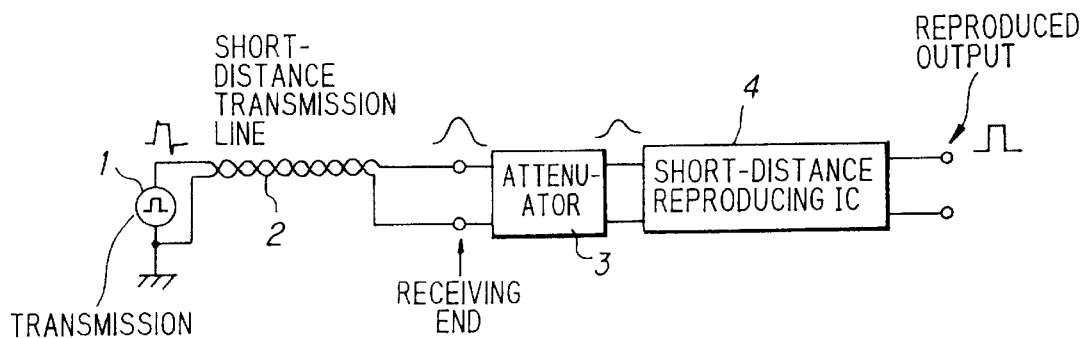
FIGS. 41A, 41B and 41C are diagrams showing configurations of transmission-line loss equalizing circuits for transmission lines of various lengths.
Figure 41B:
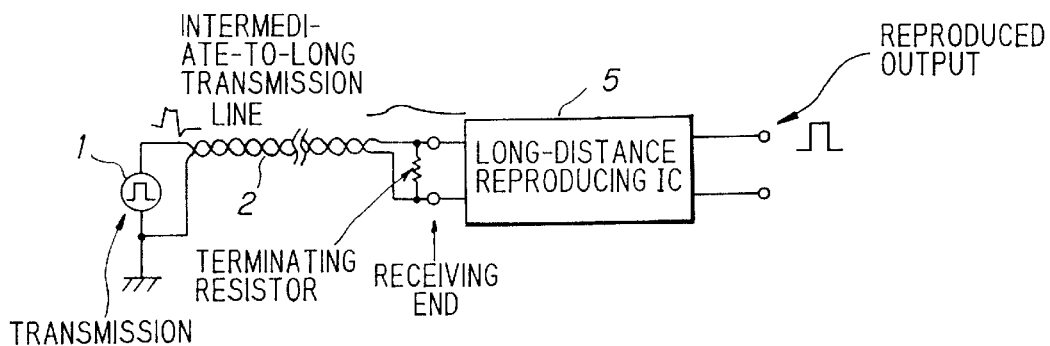
Figure 41C:
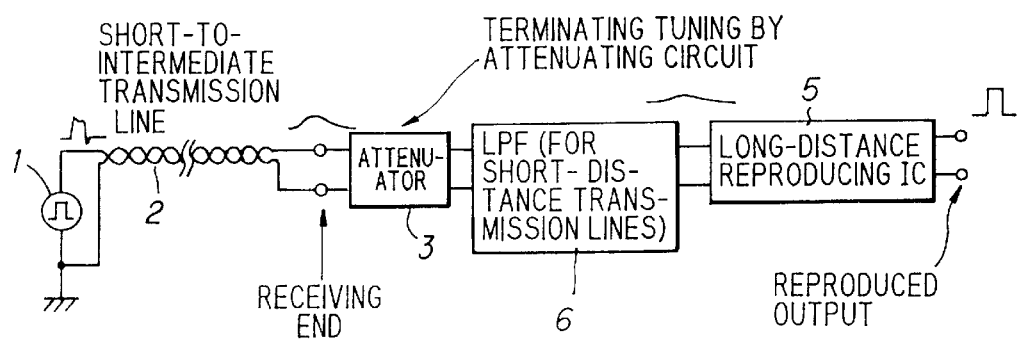

(B) Equalizer (a) Incorporating a $\sqrt{f}$AGC circuit and equalizing Network within an Integrated Circuit As shown in FIG. 2A, the $\sqrt{f}$AGC circuit has the same construction as that of the prior art (see FIG. 38). Such $\sqrt{f}$AGC circuits 31a~31c are constructed in a plurality of stages within an integrated circuit, as shown in FIG. 2B, and an equalizing network (R, C, $r_x$) 31d also uses internal elements of the integrated circuit. More specifically, the individual $\sqrt{f}$AGC circuits (variable filters) 31a~31c are composed of a single-ended output operational amplifier 31a-1, a variable resistor 31a-2 provided between the inverting input and the output of the operational amplifier 31a-1, and a series circuit provided between inverting input of the operational amplifier and ground and obtained by serially connecting a first resistor 31a-3 and a first capacitor 31a-4. The $\sqrt{f}$AGC circuits (variable filters) 31a ~31c are cascade-connected and provided within the integrated circuit, and the first resistor R and first capacitor C of each $\sqrt{f}$AGC circuit, as well as the variable resistors $r_x$, are also provided in the integrated circuit, thereby constructing the $\sqrt{f}$AGC circuit 31.

Figure 4:
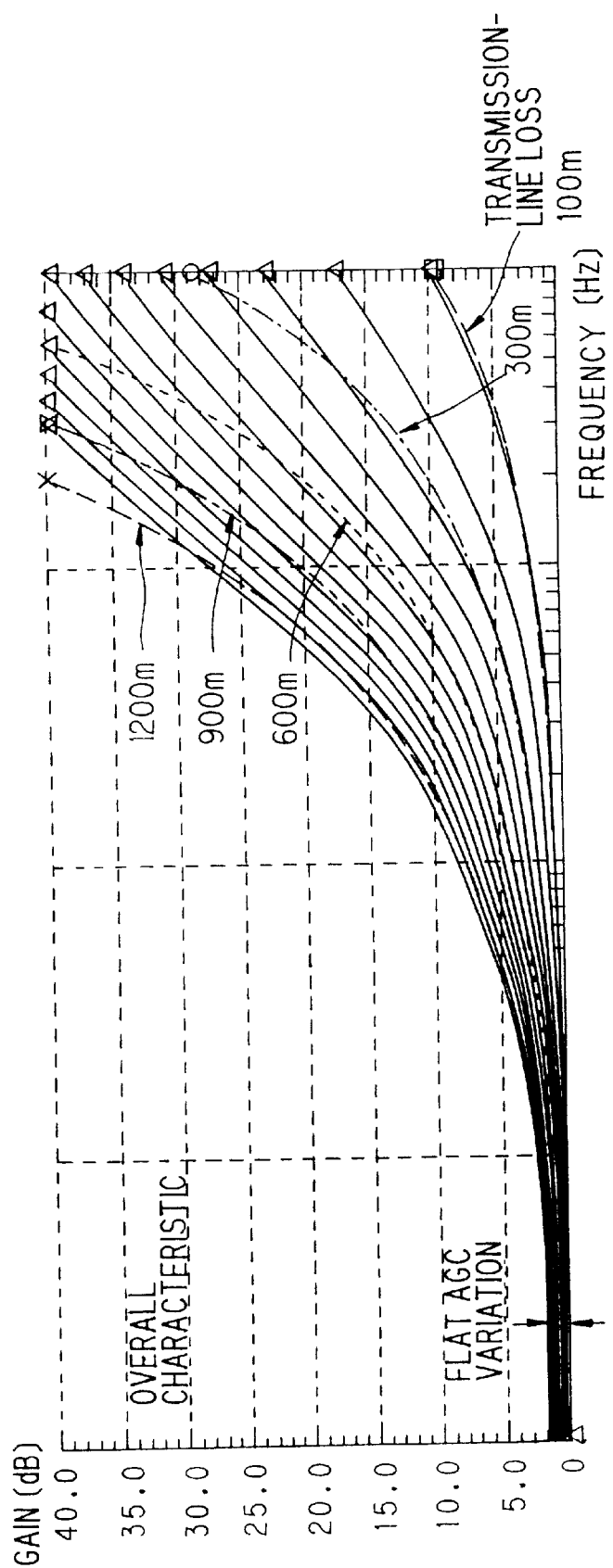
FIG. 4 shows the overall frequency characteristics of an equalizer circuit.

In accordance with this cascade-connected $\sqrt{f}$AGC, the equalization curve can be set more precisely in comparison with the prior art of FIG. 38 using only a single stage. FIG. 3 shows a frequency characteristic (f characteristic) in a case where the variable resistor $r_x$ of the $\sqrt{f}$AGC circuit 31 using three stages of $\sqrt{f}$AGC is changed. FIG. 4 shows the overall frequency characteristics of the equalizing circuit 21. It should be noted that the broken lines in FIG. 4 are transmission-line loss curves for transmission lines of various lengths.

It is obvious from FIG. 4 that an equalizing circuit can be provided with a frequency characteristic which substantially approximates transmission loss. As a result, equalization deviation can be made much smaller in comparison with the prior art, and differences due to transmission distance are small as well. Since equalization deviation is smaller, it is possible to deal with process variations in the internal elements of the integrated circuit. The reason for this is that a transmission-line loss curve L (f,d) (where f represents frequency and d stands for distance) possesses the following characteristic:

$$L(f+\Delta f, d) \approx L(f, d+\Delta d)$$

Even if the equalization curve is shifted by $\Delta f$ along the frequency axis owing to process variations in the internal elements of the integrated circuit, the curve will correspond to a different transmission distance $d + \Delta d$. As a result, an equalization error that is smaller than that of the prior art can be realized without external elements. This makes it possible to solve Problem 2 of the prior art.

(b) Dealing with Transmission Lines Lengths of Short to Intermediate Distance

Figure 5:
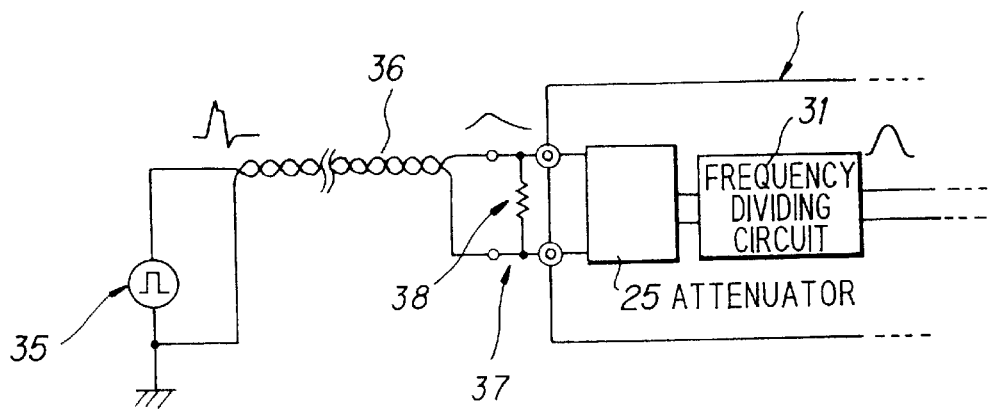
FIG. 5 is a diagram useful in describing how to deal with change to short-to-intermediate distance of a communication line between devices according to the prior art.

As shown in FIG. 5, the attenuating circuit 25 is provided as the initial stage in an integrated circuit (transmission-line loss equalizing circuit), and the $\sqrt{f}$AGC equalizing circuit 31, whose characteristic varies from low-pass to flat to high-pass depending upon the variable resistor $r_x$, is provided as the next stage in the integrated circuit. Also shown in FIG. 5 are a transmission wave generator 35, a transmission line 36, a receiving end 37 and a terminating resistor 38.

Figure 6A:
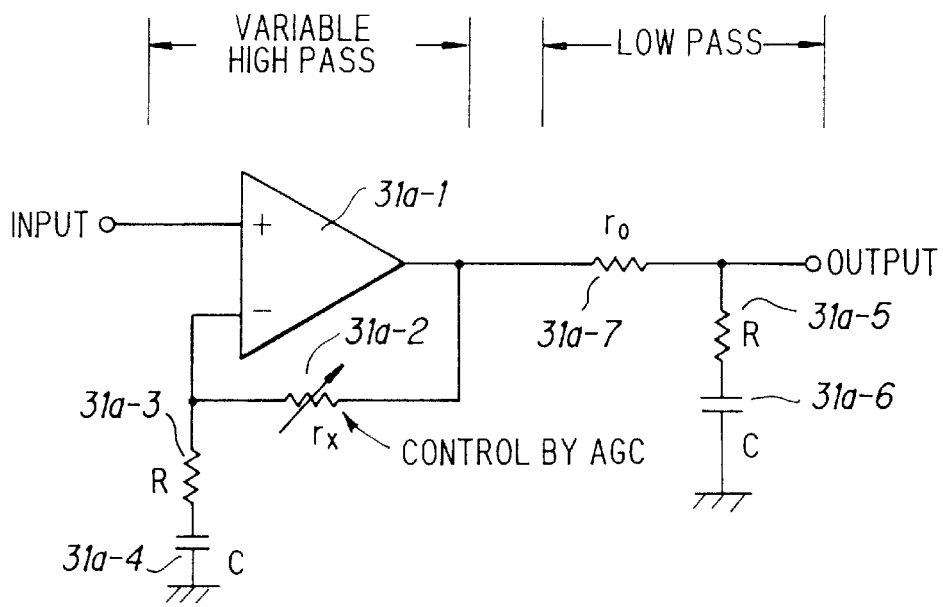
FIGS. 6A and 6B illustrate √fAGC in which the characteristic varies from low-pass to flat to high-pass.
Figure 6B:
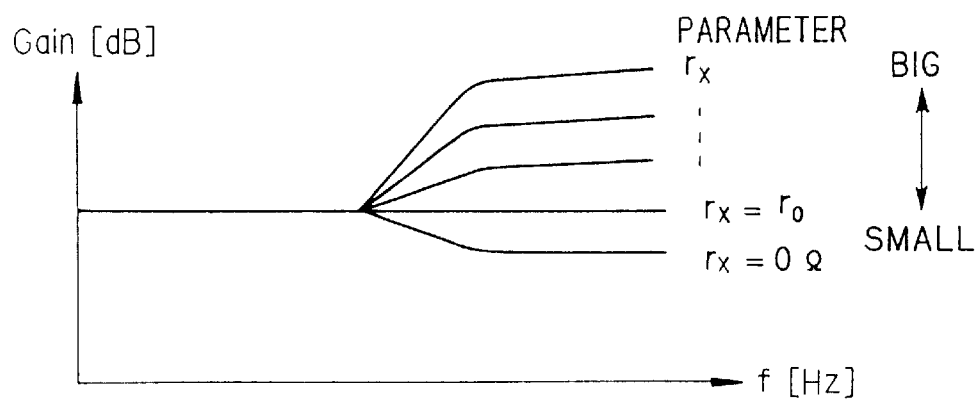

A variable filter of the kind shown in FIG. 6A is used as the √fAGC equalizing circuit 31 that varies from low-pass to flat to high-pass. This variable filter has a single-ended output operational amplifier 31a-1; a variable resistor ($r_x$) 31a-2, having the non-inverting input terminal of the operational amplifier as its signal input terminal, provided between the inverting input terminal and output terminal of the operational amplifier; a circuit, which is provided between the inverting input terminal of the operational amplifier and ground, obtained by serially connecting a first resistor (R) 31a-3 and a first capacitor (C) 31a-4; a circuit, which is provided between the output and ground, obtained by serially connecting a second resistor 31a-5 whose value is the same as that of the first resistor 31a-3 and a second capacitor whose value is the same as that of the first capacitor 31a-4; and a third resistor 31a-7 provided between the output and the output of the operational amplifier. As shown in FIG. 6B, this variable filter takes on a flat f characteristic when $r_x = r_0$ holds, a high-pass characteristic when $r_x > r_0$ holds and a low-pass characteristic when $r_x < r_0$ holds.

The value of the variable resistor rx is controlled by the gain control signal GCS so that the characteristic becomes a low-pass, flat or high-pass characteristic.

Implementing the attenuating circuit 25 inside the integrated circuit means reducing the number of external elements. Further, by using the √fAGC equalizing circuit whose characteristic may change to a low-pass, flat or high-pass characteristic, there is no influence from pre-equalized components applied to a transmitted waveform and an equalized waveform that is independent of transmission line length is obtained. Accordingly, the external elements mentioned in Problem 3 are unnecessary.

(c) Means for Obtaining a Change in Gain with a Flat Frequency Characteristic

Figure 7:
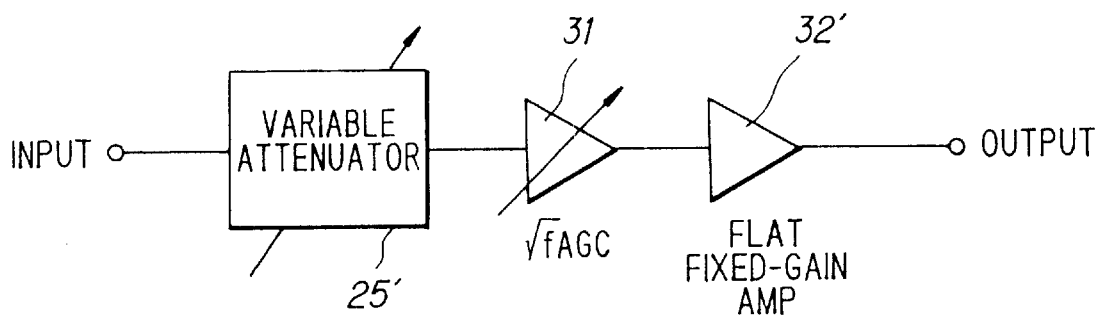
FIG. 7 is a diagram showing an arrangement for obtaining a change in gain in which a frequency characteristic is flat.
Figure 8:
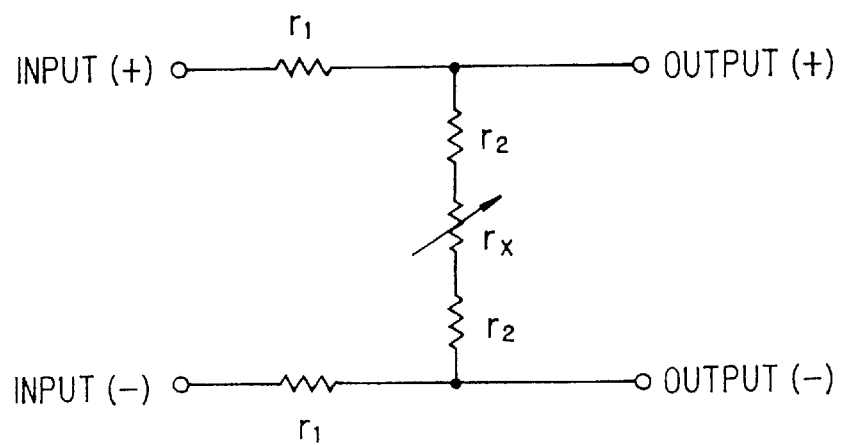
FIG. 8 is a diagram showing an example of a variable attenuating circuit.

As shown in FIG. 7, a variable attenuating circuit 25' is provided as an input stage and a flat amplifier 32' having a fixed gain is provided instead of flat AGC, these circuits serving as means for obtaining a change in gain with a flat frequency characteristic. FIG. 8 is a diagram showing an example of the variable attenuating circuit 25'. Though a method in which the side of resistor $r_1$ is made variable also is conceivable, it is preferable to make the resistor $r_2$ variable to construct an equalizing circuit in cooperation with the √fAGC circuit 31.

Figure 42:
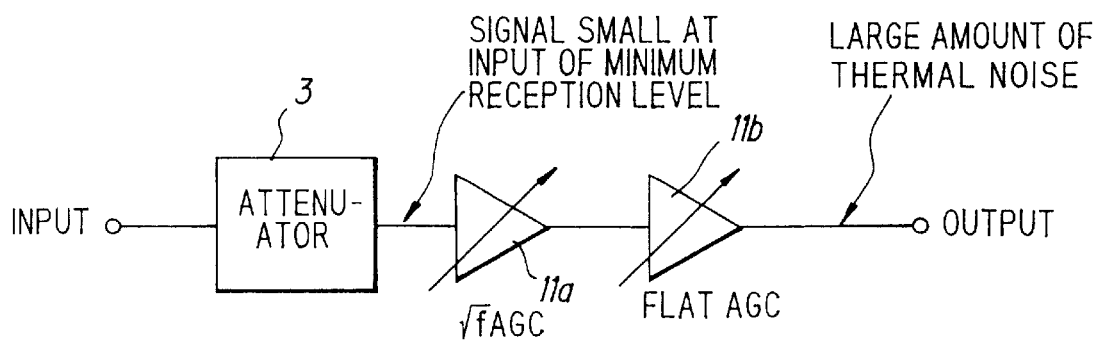
FIG. 42 is a diagram showing an arrangement for obtaining a change in gain with a flat f characteristic.
Figure 43A:
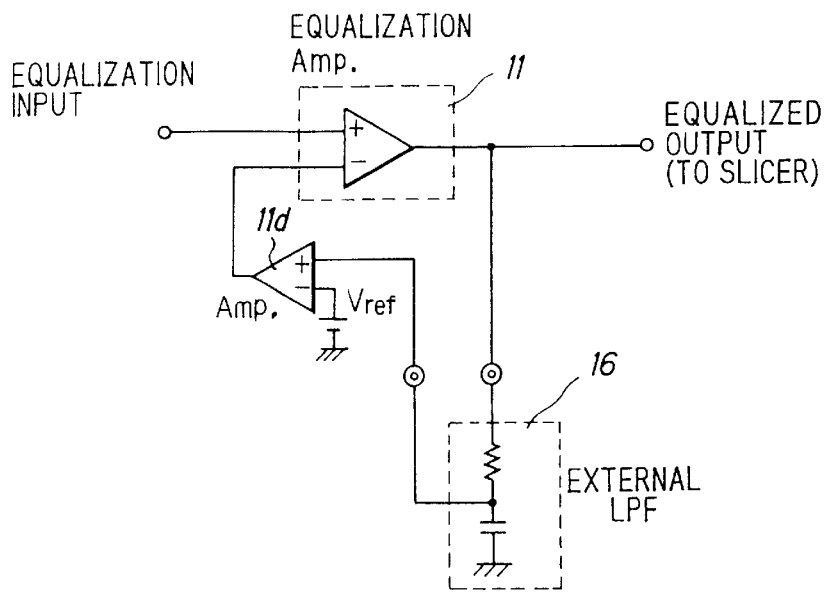
FIGS. 43A, 43B and 43C are diagrams of arrangements for canceling DC offset.
Figure 43B:
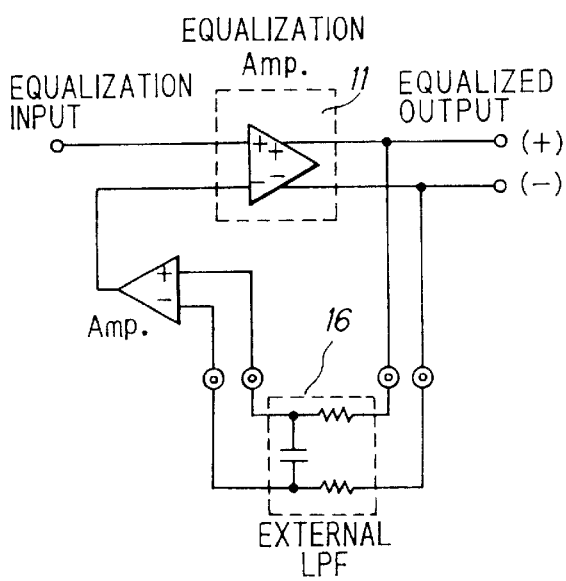
Figure 43C:
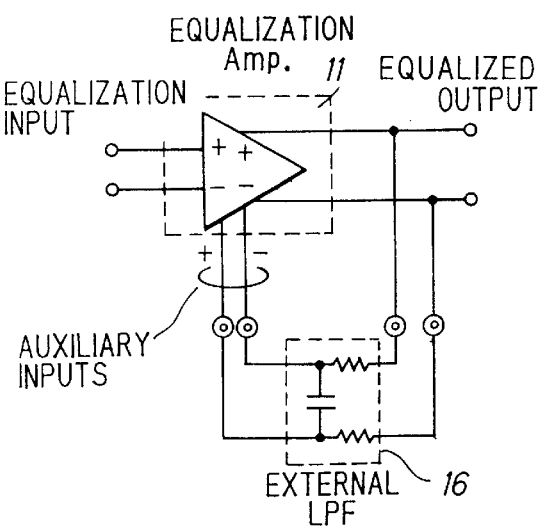
Figure 44:
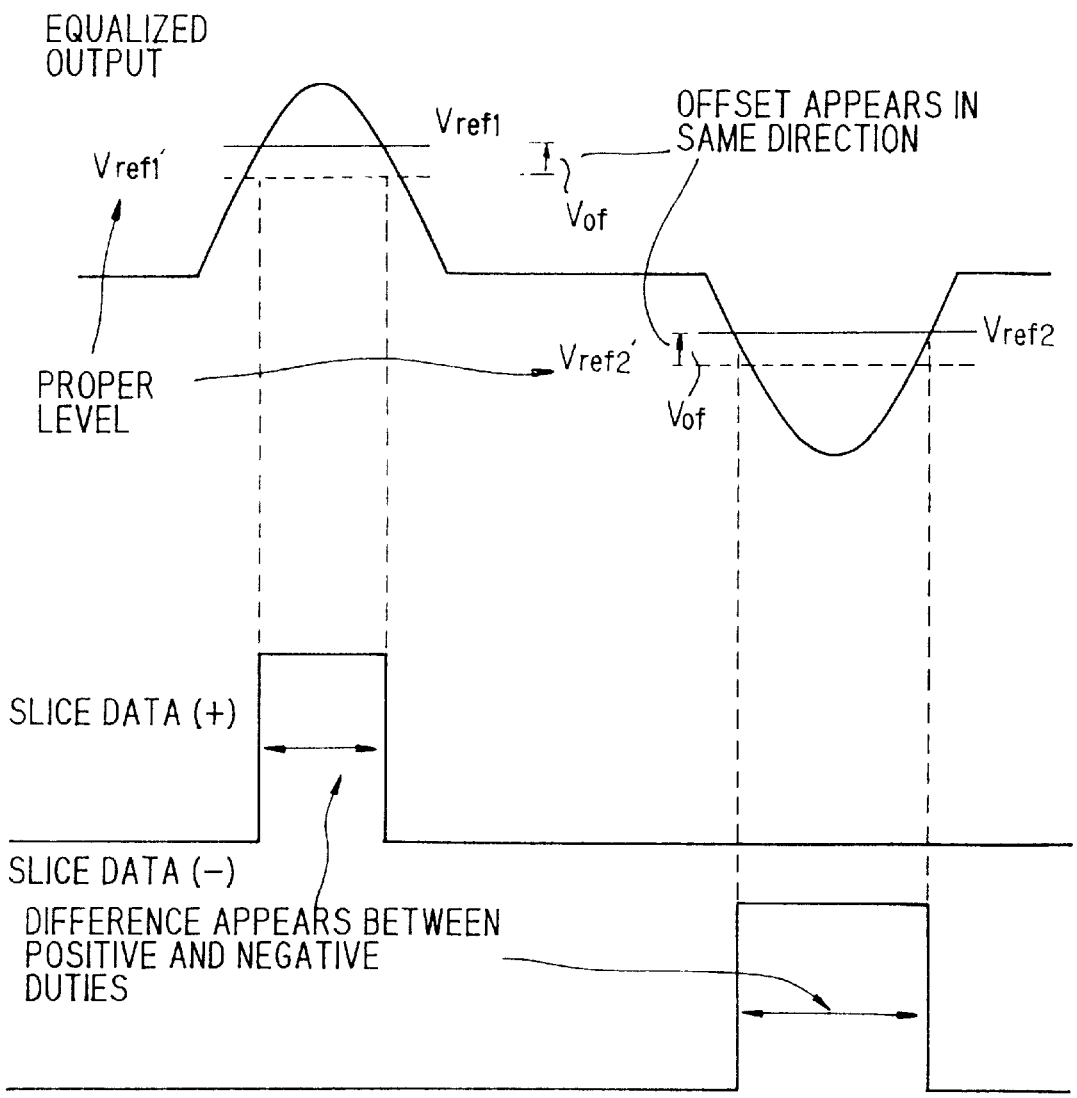
FIG. 44 is a diagram useful in describing single-phase processing of bipolar signals.
Figure 45:
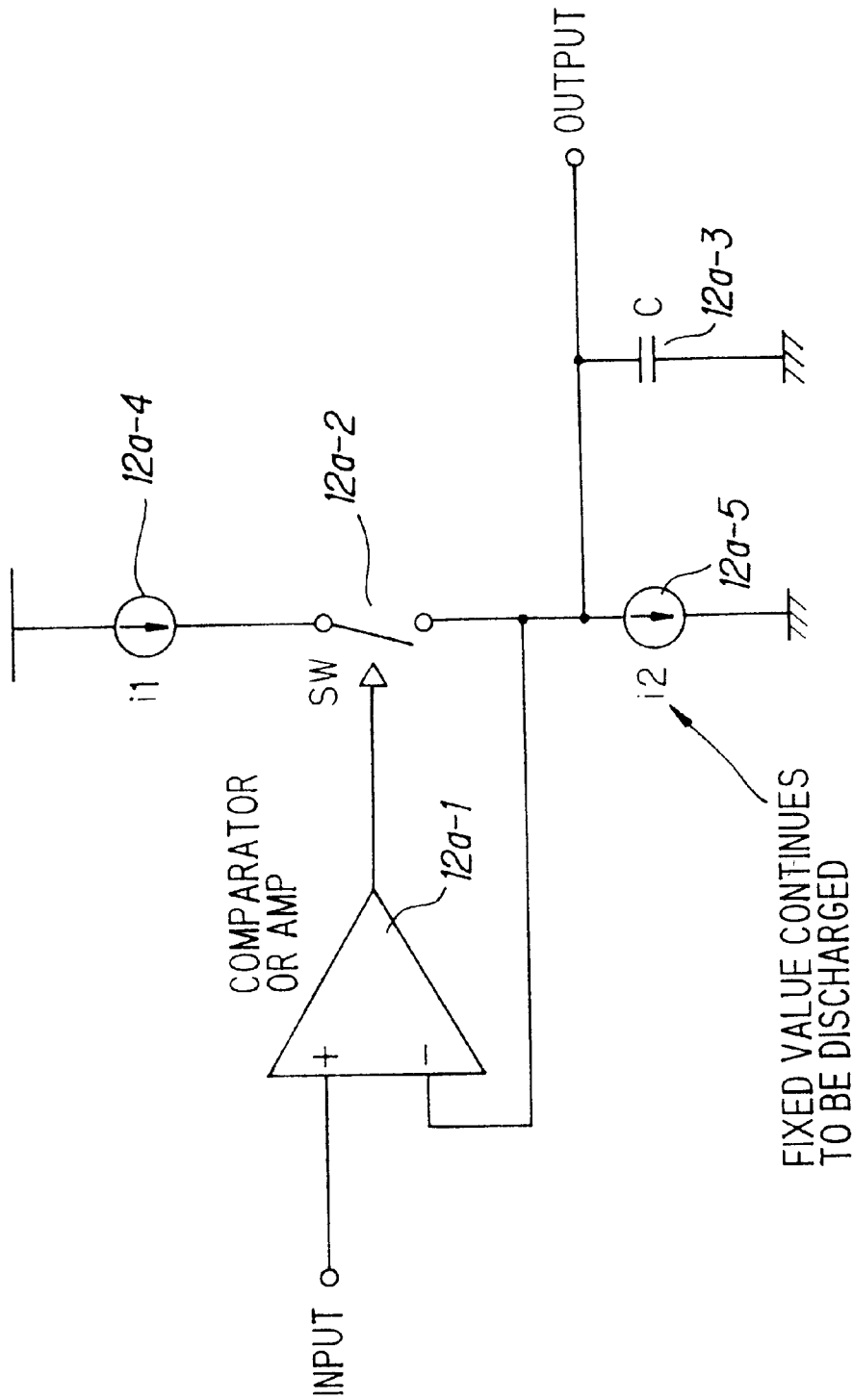
FIG. 45 is a diagram showing the construction (single-ended) of a peak detecting circuit according to the prior art.

In accordance with the arrangement of FIG. 7, the value of the variable resistor $r_x$ is controlled in such a manner that the gain of the variable attenuator 25' is maximum when the received signal level is minimum, thereby making the signal amplitude larger in comparison with the prior art (FIG. 42). As a result, the output of the flat-gain fixed amplifier 32' rises by an amount corresponding to the rise in the gain of the attenuator, thermal noise declines in comparison with the prior art and dynamic range is widened correspondingly. This solves Problem 4 of the prior art.

(d) Differential Non-Inverting Amplifier Circuit Applicable to √fAGC Circuits

Figure 9A:
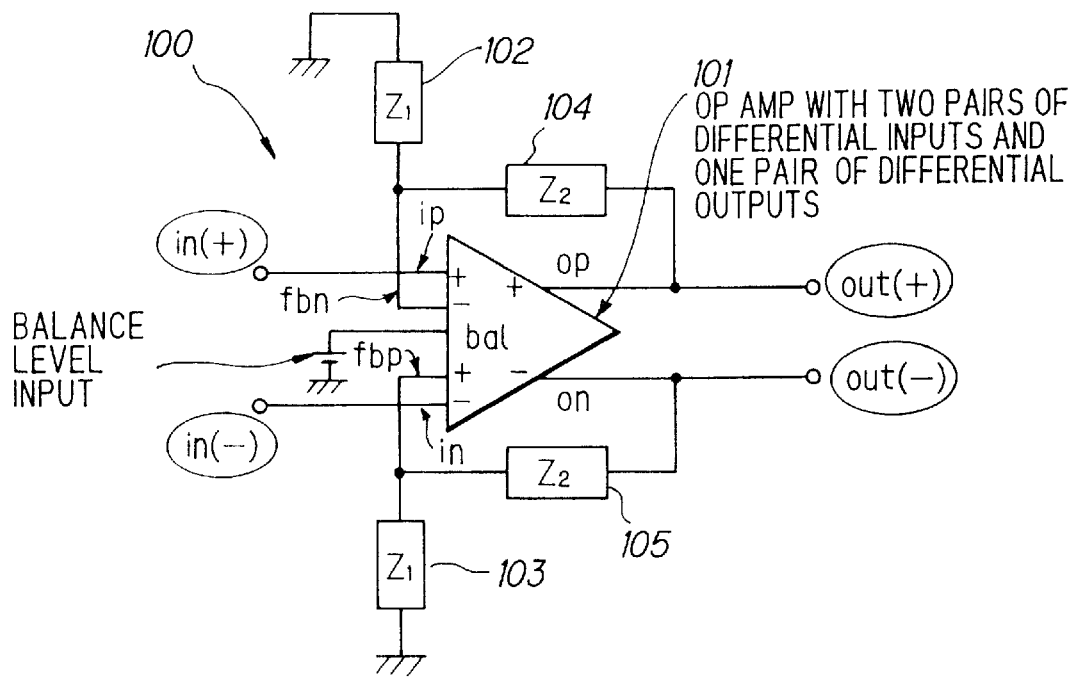
FIGS. 9A and 9B are diagrams showing non-inverting amplifier circuits.
Figure 9B:
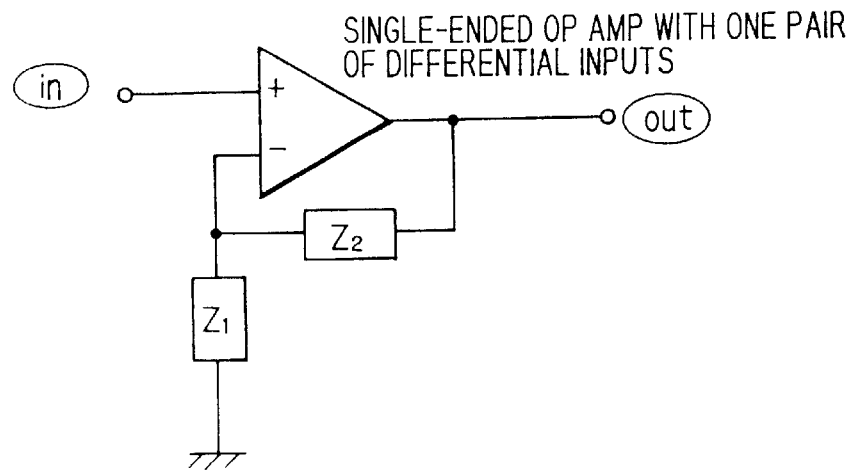

FIG. 9A is a diagram showing the configuration of an inventive differential non-inverting amplifier circuit that can be applied to a √fAGC circuit. For the purpose of comparison, a conventional single-ended non-inverting amplifier circuit is shown alongside in FIG. 9B.

Shown in FIG. 9A is a differential operational amplifier 101 having two differential input circuits one circuit comprising a non-inverting input terminal and an inverting feedback input terminal and the other circuit comprising an inverting input terminal and a non-inverting feedback input terminal, one pair of differential output terminals comprising a non-inverting output terminal and an inverting output terminal and a balance-level input means comprising a balance-level input terminal for deciding average DC levels of the pair of differential output terminals. The amplifier 101 outputs balanced differential signals centered on the balance input level. The differential operational amplifier 101 is used in a differential non-inverting amplifier circuit 100 in which the non-inverting input terminal, the inverting input terminal, the non-inverting output terminal and the inverting output terminal of the differential operational amplifier serve as a first signal input terminal, second signal input terminal, first signal output terminal and second signal output terminal, respectively, a first passive element ($Z_1$) 102 is connected between the inverting feedback input terminal and ground, a second passive element 103 having an impedance equal to that of the first passive element 102 is connected between the non-inverting feedback input terminal and ground, a third passive element ($Z_2$) 104 is connected between the inverting feedback input terminal and the nor-inverting output terminal, and a fourth passive element 105 having an impedance equal to that of the third passive element is connected between the non-inverting feedback input terminal and the inverting output terminal.

Figure 10:
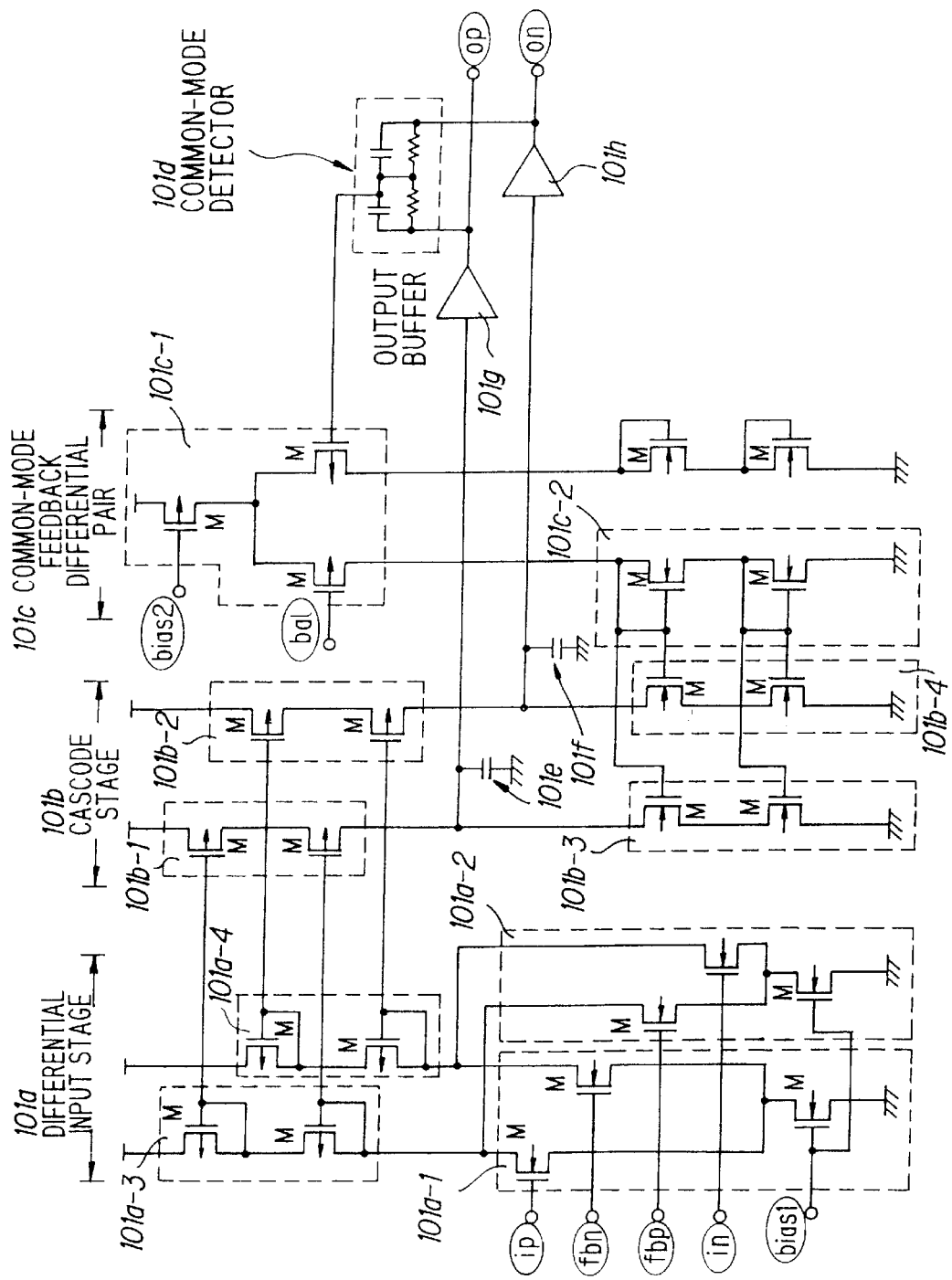
FIG. 10 is a diagram showing the configuration of a differential operational amplifier.

FIG. 10 is a diagram showing an example of the configuration of the differential operational amplifier 101. This has the configuration of a current-mirror type operational amplifier with two differential input circuits and one pair of differential output terminals. The amplifier 101 includes a differential input stage 101a, a cascode stage 101b, a common-mode feedback differential pair 101c, a common-mode detector 101d, phase compensating capacitors 101e, 101f, output buffers 101g, 101h, MOSFETs M, bias input terminals bias 1, bias 2, and a balance input terminal bal.

The differential input stage 101a has two differential input circuits 101a-1, 101a-2, one circuit comprising a non-inverting input terminal ip and an inverting feedback input terminal fbn and the other circuit comprising an inverting input terminal in and a non-inverting feedback input terminal fbp, respectively, current-mirror means 101a-3 for mirroring the sum of currents which flow through the non-inverting sides of these two differential circuits, and current-mirror means 101a-4 for mirroring the sum of currents which flow through the inverting sides of these two differential circuits. The non-inverted and inverted differential signals are transmitted to sides non-inverted and inverted sides of the cascode stage 101b, respectively, by the current mirrors. The cascode stage 101b has cascode amplifier stages 101b-1, 101b-2 on non-inverted and inverted sides in which the two current sums are mirrored, and cascade amplifier stages 101b-3, 101b-4 on non-inverted and inverted sides in which current that flows through one side of the common-mode differential circuit 101c is mirrored. The phase compensating capacitors 101e, 101f are connected to the non-inverted output and inverted output, respectively, of the cascade stage 101b, and the differential outputs are obtained from a non-inverting terminal op and an inverting output terminal on via the output buffers 101g, 101h. It should be noted that the output buffers 101g, 101h can be deleted if the impedance of the circuitry connected to the final stage is large.

The common-mode detector 101d detects the average level of the differential outputs (the common mode of the cascade stage) and feeds the average level back to the common-mode feedback differential circuit 101c. The common-mode feedback differential circuit 101c has one differential pair 101c-1 whose two inputs are the common mode and balance input, and mirror means 101c-2 for mirroring the current that flows through one side of this differential pair in the cascade stages 101b-3, 101b-4 on the non-inverting and inverting sides.

The non-inverted and inverted differential signals in the differential input stage 101a are transmitted to the non-inverted and inverted sides, respectively, of the cascade stage 101b by the current mirror. The cascode stage 101b amplifies each of these differential signals so that differential outputs are generated from the non-inverting output terminal op and inverting output terminal on via the output buffers 101g, 101h, respectively. The common-mode detector 101d detects the average level of the differential outputs and feeds it back to the common-mode feedback differential pair 101c. The common-mode feedback differential pair 101c compares the balance input level and the common mode (average level) and transmits its output to the cascode stages 101b-3, 101b-4 by the current mirrors. As a result, the DC levels of the cascode stages are controlled in conformity with the difference between the balance input level and common mode, and the common mode becomes equal to the balance input level. If this differential operational amplifier is used, it is possible to make the DC levels of the output differential pair equal to the balance input level.

Figure 11:
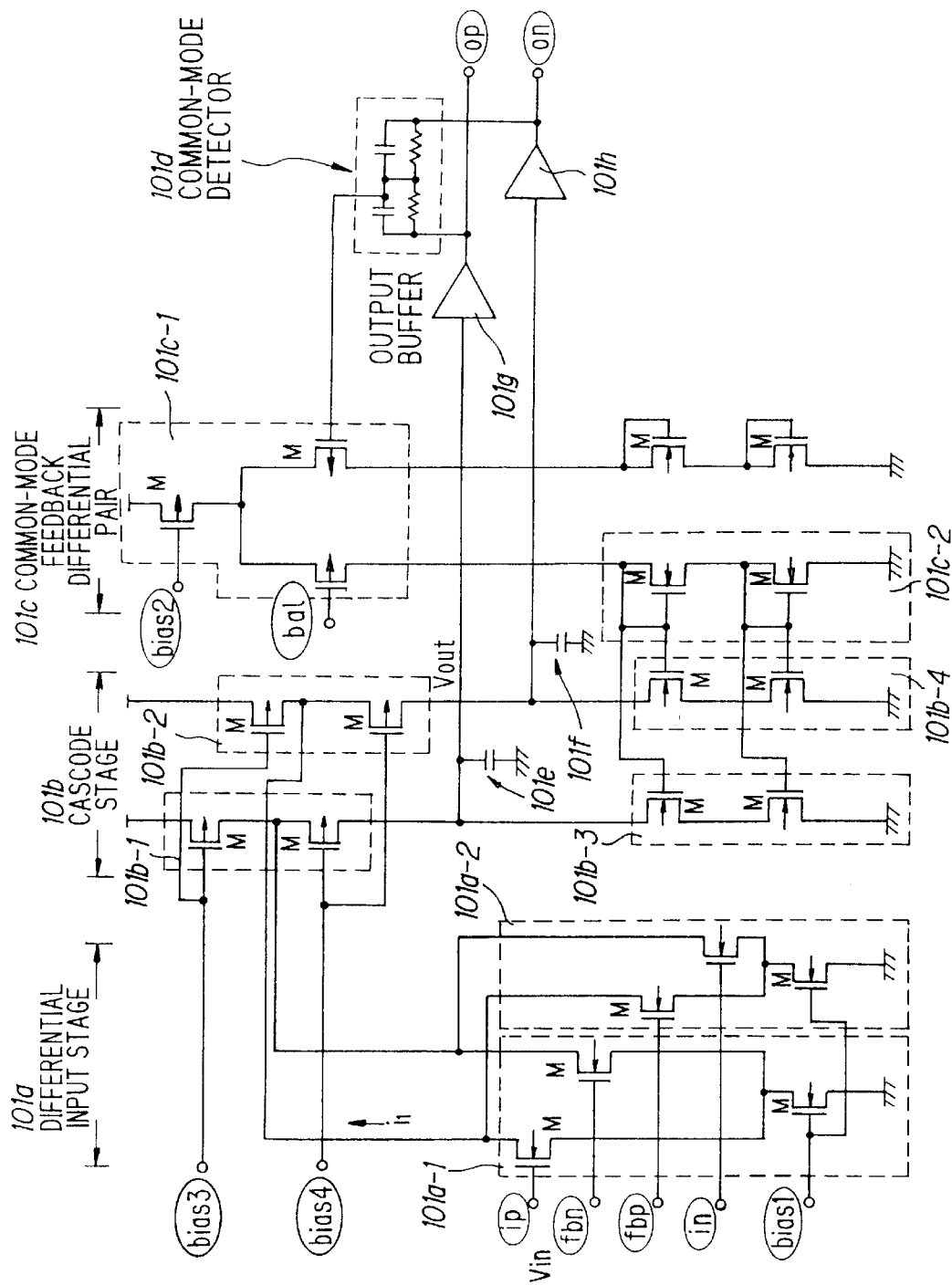
FIG. 11 is a diagram showing a differential operational amplifier having a different configuration.

FIG. 11 is a diagram showing a differential operational amplifier having a different configuration. Elements identical with those in FIG. 10 are designated by like reference characters. This differential operational amplifier differs from that of FIG. 10 in that whereas the current sum obtained by the input differential stage 101a is current-mirrored into the cascode stage 101b in FIG. 10, here the current sum is current-folded from the cascode stage 101b. In other words, the amplifier in FIG. 11 is based upon a folded-cascode operational amplifier. The operating principle of this folded-cascode operational amplifier is as follows: When a signal Vin enters the differential input stage 101a, a current $i_1$, which is indicated by the following equation is generated:

$$i_1 = gm \cdot Vin$$

where gm represents the trans-conductance of the differential input stage 101a. This current flows (is folded) into the cascode stage 101b, and a voltage Vout indicated by the following equation is output from the cascode stage 101b:

$$Vout = r \cdot i_1$$

where r represents the impedance of the cascode stage. Overall, an amplification factor indicated by the following equation is obtained:

$$Vout/Vin = gm \cdot r = \text{amplification factor.}$$

Figure 12:
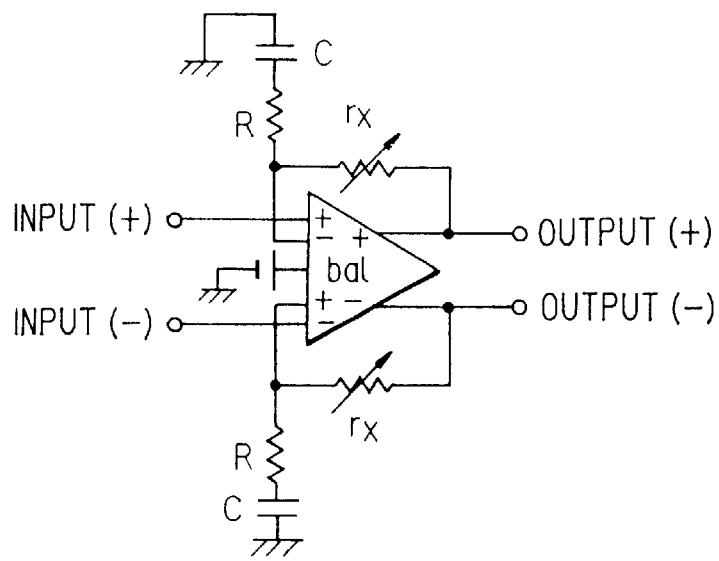
FIG. 12 is a diagram showing the configuration of a differential variable high-pass filter.

Differential-type equalization becomes possible if the differential non-inverting amplifier circuit of FIG. 9A is applied to the √fAGC circuit of FIG. 6A. This makes it possible to solve Problem 1 of the prior art. FIG. 12 shows an example of a differential variable high-pass filter constructed using the differential non-inverting amplifier circuit. The first and second passive elements 102, 103 in the differential non-inverting amplifier circuit of FIG. 9A are replaced by series circuits each composed of a resistor R and capacitor C, and the third and fourth passive elements 104, 105 are replaced by variable resistors rx. This differential variable high-pass filter can be used as a differential-type √fAGC circuit.

Figure 13:
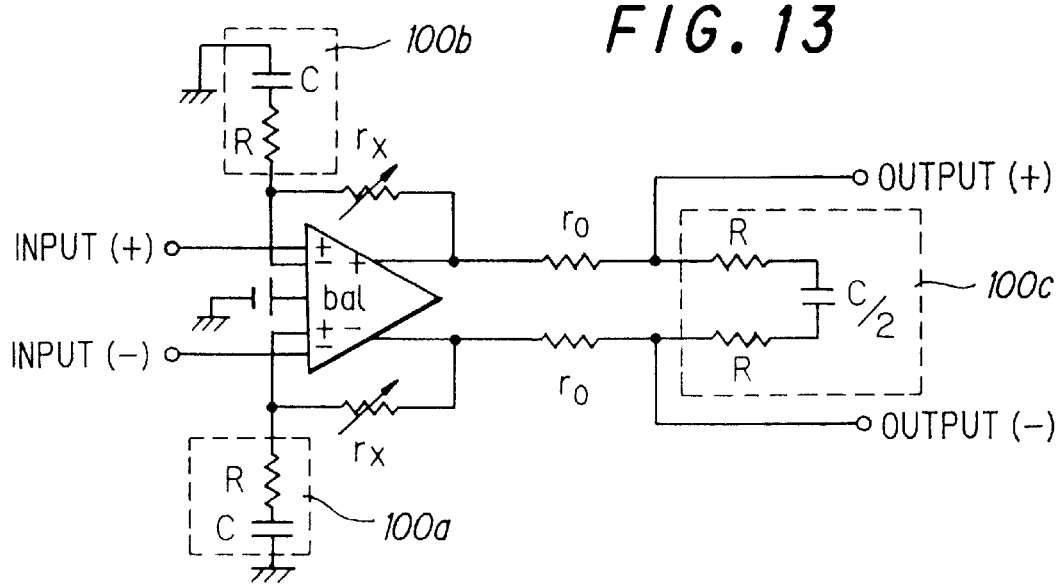
FIG. 13 illustrates a differential √fAGC circuit in which the characteristic varies from low-pass to flat to high-pass.

FIG. 13 illustrates an example in which the √fAGC circuit of FIG. 6A is constructed using a differential variable high-pass filter. One ends of two resistors $r_0$ of equal resistance values are connected to respective differential output terminals of a differential variable high-pass filter, other ends of these resistors $r_0$ are adopted as respective differential outputs, and a circuit 100c having an impedance value equal to that of serially connected resistor-capacitance circuits 100a, 100b which are first and second passive elements of the differential variable high-pass filter is provided between the differential output terminals.

A differential voltage follower capable of making the DC levels of an output differential pair equal to the balance input level can be constructed using the differential amplifier of FIG. 10.

Figure 14A:
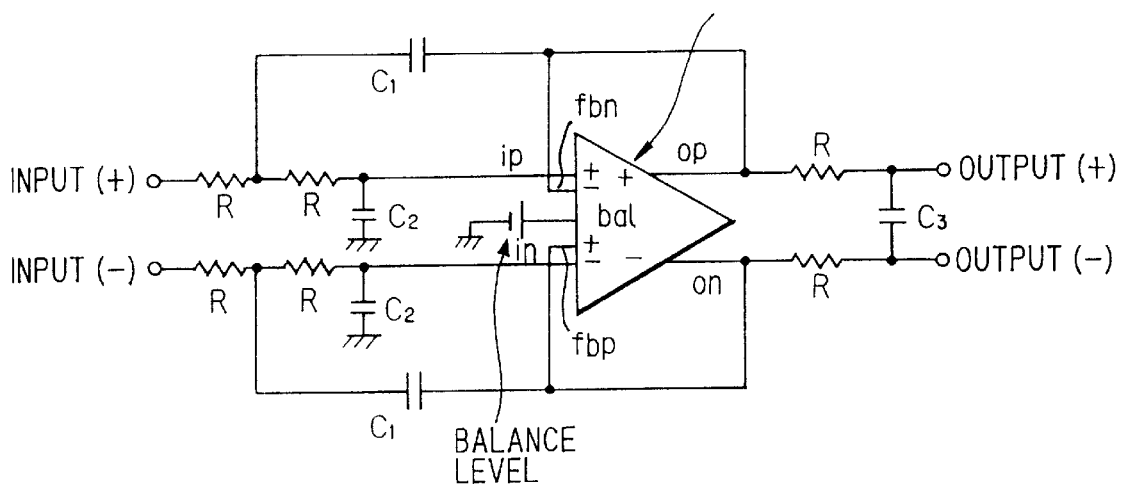
FIGS. 14A and 14B are diagrams illustrating voltage followers.
Figure 14B:
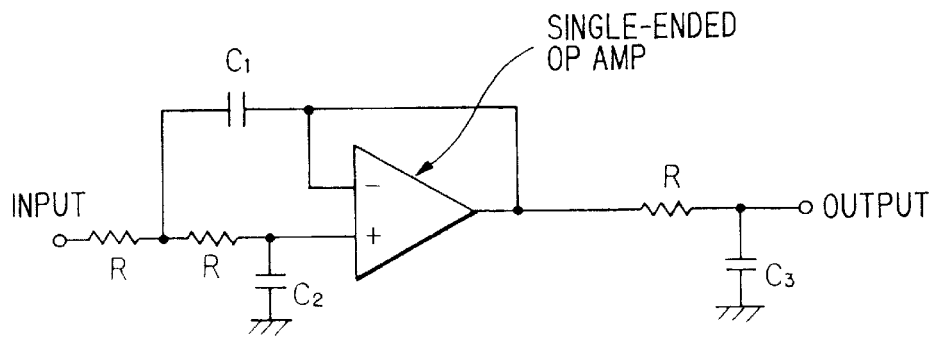

FIG. 14A is a diagram showing an example of the construction of such a differential voltage follower. The differential voltage follower has the non-inverting input terminal ip of the differential operational amplifier of FIG. 10 as a non-inverting signal input terminal, has the inverting input terminal in as an inverting signal input terminal, short-circuits the non-inverting output terminal op and the inverting feedback input terminal fbn and makes op the non-inverting signal output terminal, short-circuits the inverting output terminal on and the non-inverting feedback input terminal fbp and makes on the inverting signal output terminal. FIG. 14B illustrates a conventional single-ended voltage follower.

Figure 15A:
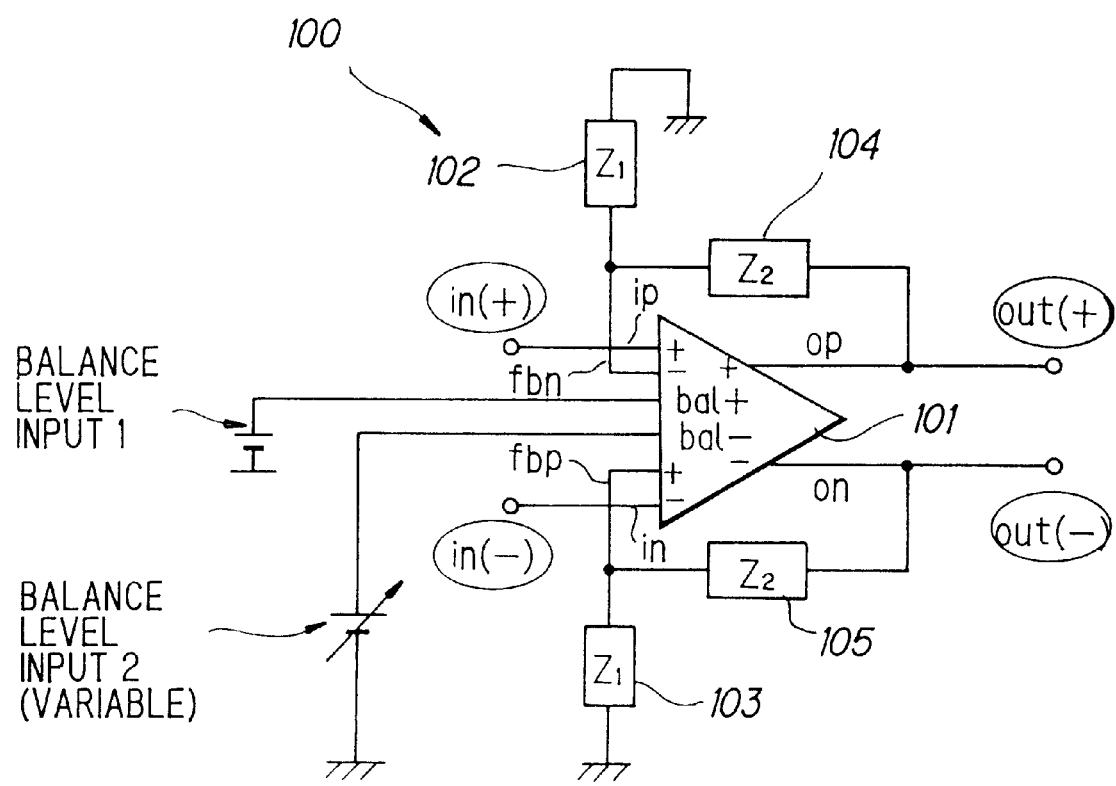
FIG. 15A is a diagram showing a differential non-inverting amplifier circuit having a different configuration.

(e) Different Example of Differential Non-Inverting Amplifier Circuit Applicable to √fAGC Circuits FIG. 15A is a diagram showing an inventive differential non-inverting amplifier circuit having a different configuration. Elements identical with those shown in FIG. 9A are designated by like reference characters. This differential non-inverting amplifier circuit differs from that of FIG. 9A in that it has two balance inputs, one balance input level is fixed and the other balance input is variable. The variable input balance level is assumed to possess information on the amount of offset of the differential outputs. In other words, the variable input balance level varies in dependence upon the amount of offset.

Figure 16:
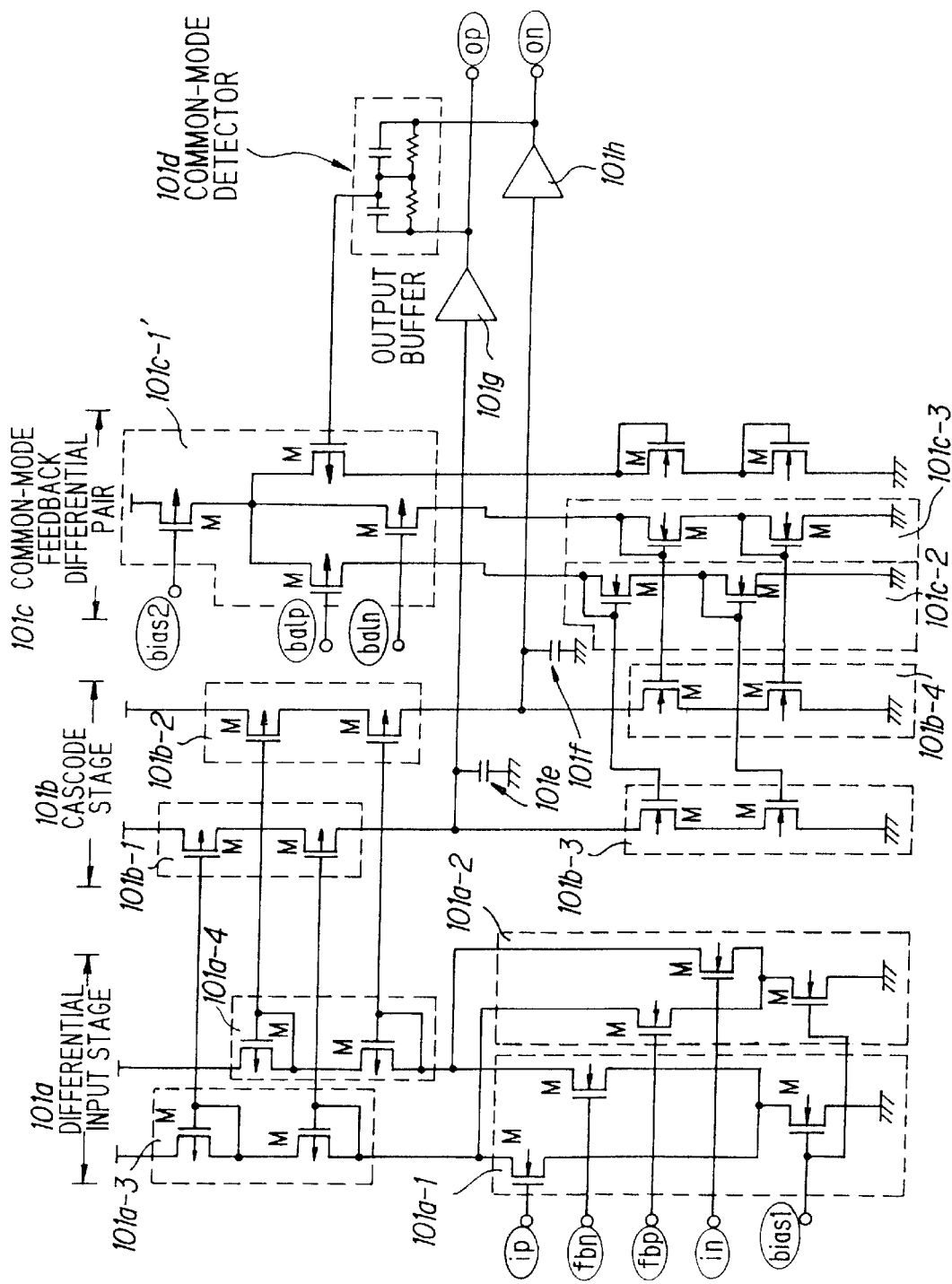
FIG. 16 is a diagram showing the configuration of a differential operational amplifier.

FIG. 16 shows an example of the construction of the differential operational amplifier of FIG. 15A. Elements identical with those shown in FIG. 10 are designated by like reference characters. This arrangement differs from that of FIG. 10 in that the common-mode feedback differential pair 101c comprises (1) a differential pair 101c-1' whose three inputs are balance inputs baln, balp and the common mode, and (2) current mirror means 101c-2, 101c-3 for feeding back the currents which flow through balance input sides of the differential pair 101c-1' to the cascode stages 101b-3, 101b-4 on the non-inverting and inverting sides by current mirrors.

Figure 17:
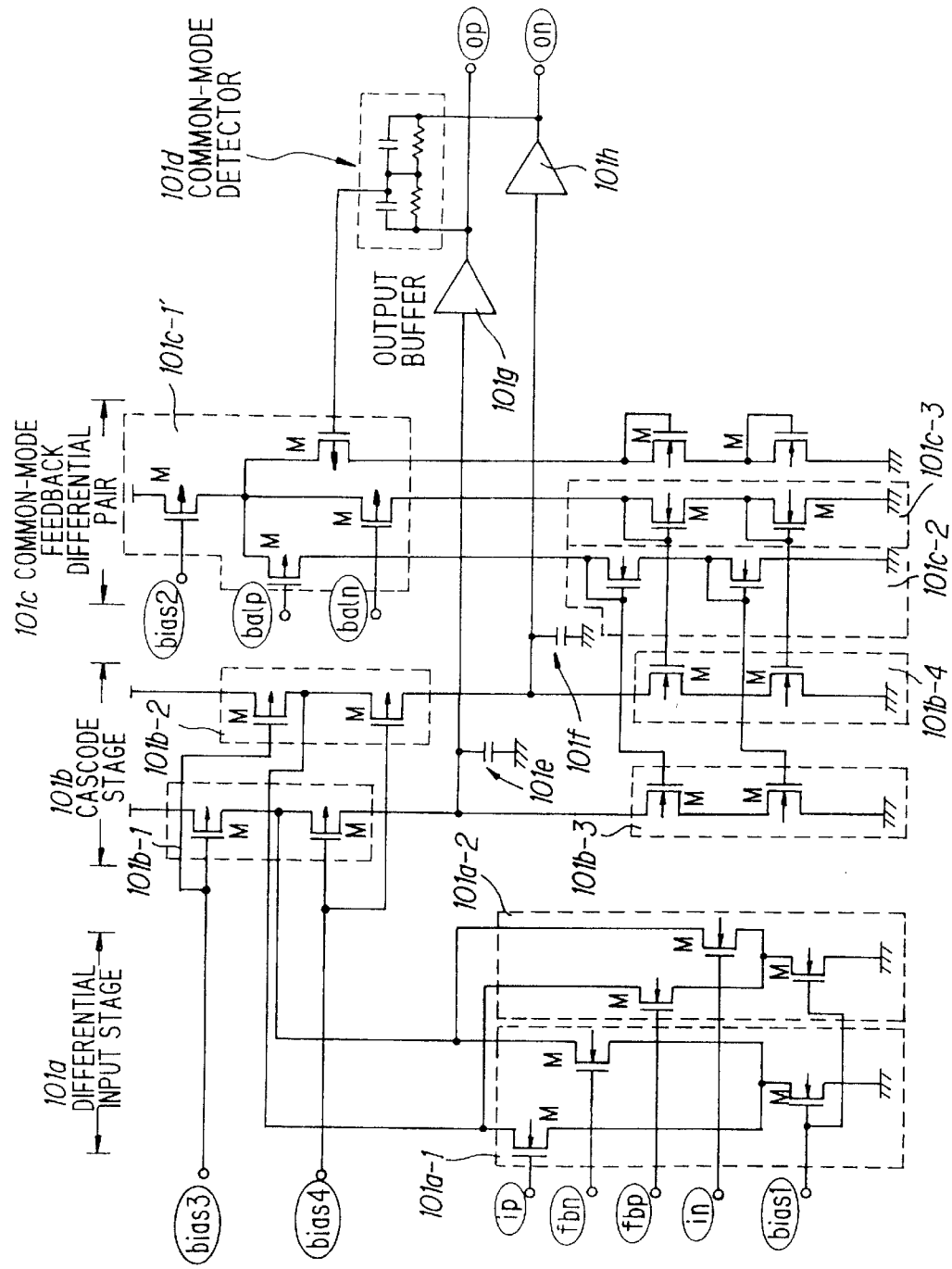
FIG. 17 is a diagram showing a differential operational amplifier having a different configuration.

FIG. 17 is a diagram showing another arrangement of the differential operational amplifier 101 shown in FIG. 15A. Elements identical with those shown in FIG. 16 are designated by like reference characters. This arrangement differs from that of FIG. 16 in that whereas the current sum obtained by the input differential stage 101a is current-mirrored into the cascode stage 101b in FIG. 16, here the current sum is current-folded from the cascode stage.

Figure 18:
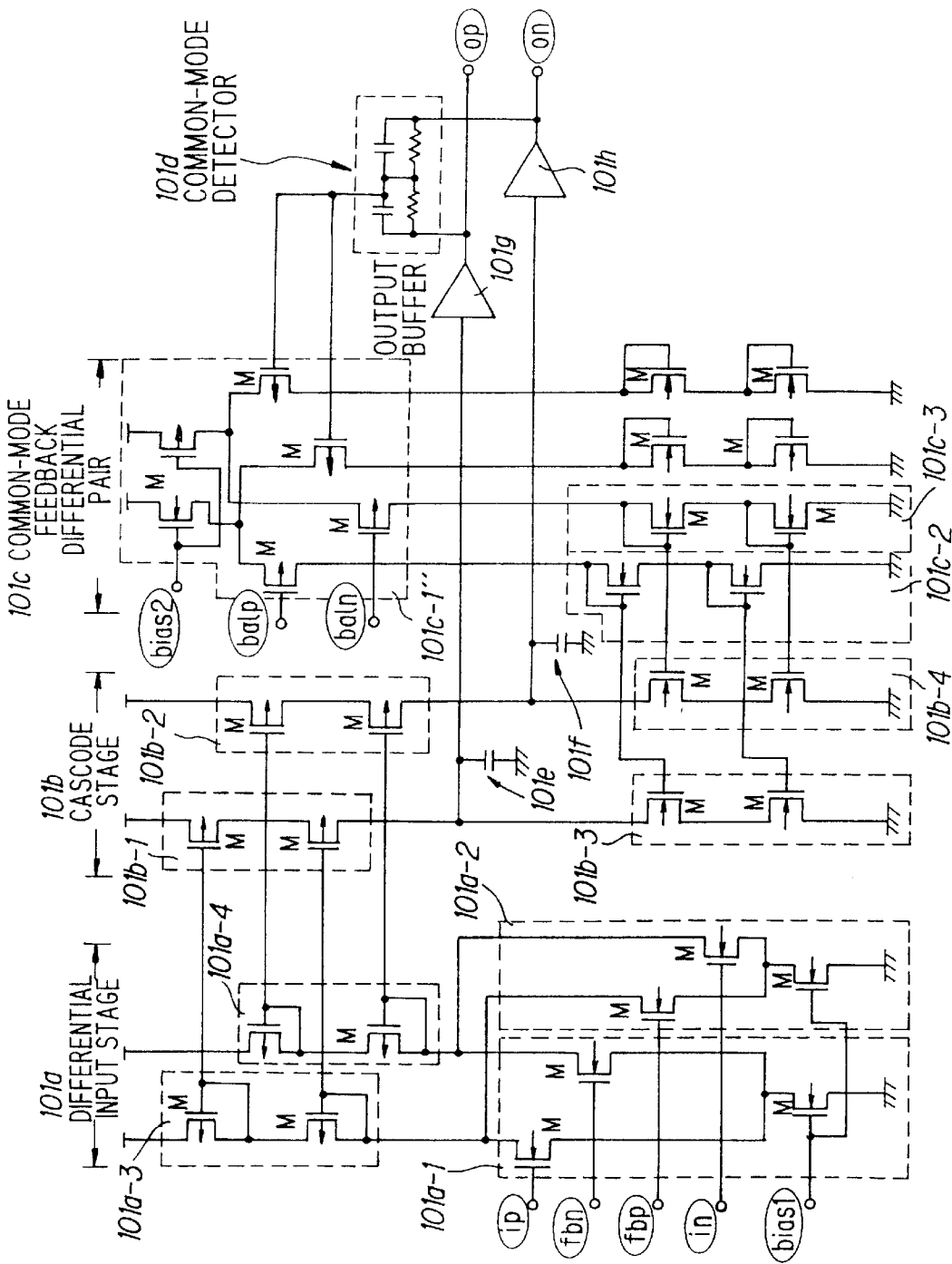
FIG. 18 is a diagram showing a differential operational amplifier having yet another configuration.

FIG. 18 is a diagram showing another arrangement of the differential operational amplifier 101 shown in FIG. 15A. Elements identical with those shown in FIG. 16 are designated by like reference characters. This arrangement differs from that of FIG. 16 in that the common-mode feedback differential stage 101c comprises (1) a four-input differential circuit 101c-1' having a first differential circuit comprising the common mode of the output and the non-inverting balance input balp and a second differential circuit comprising the common mode of the output and the inverting balance input baln, and (2) current mirror means 101c-2, 101c-3 for feeding back the currents which flow through the non-inverted and inverted balance input sides of the differential circuit 101c-1" to the cascode stages 101b-3, 101b-4 on the non-inverting and inverting sides by current mirrors.

Figure 19:
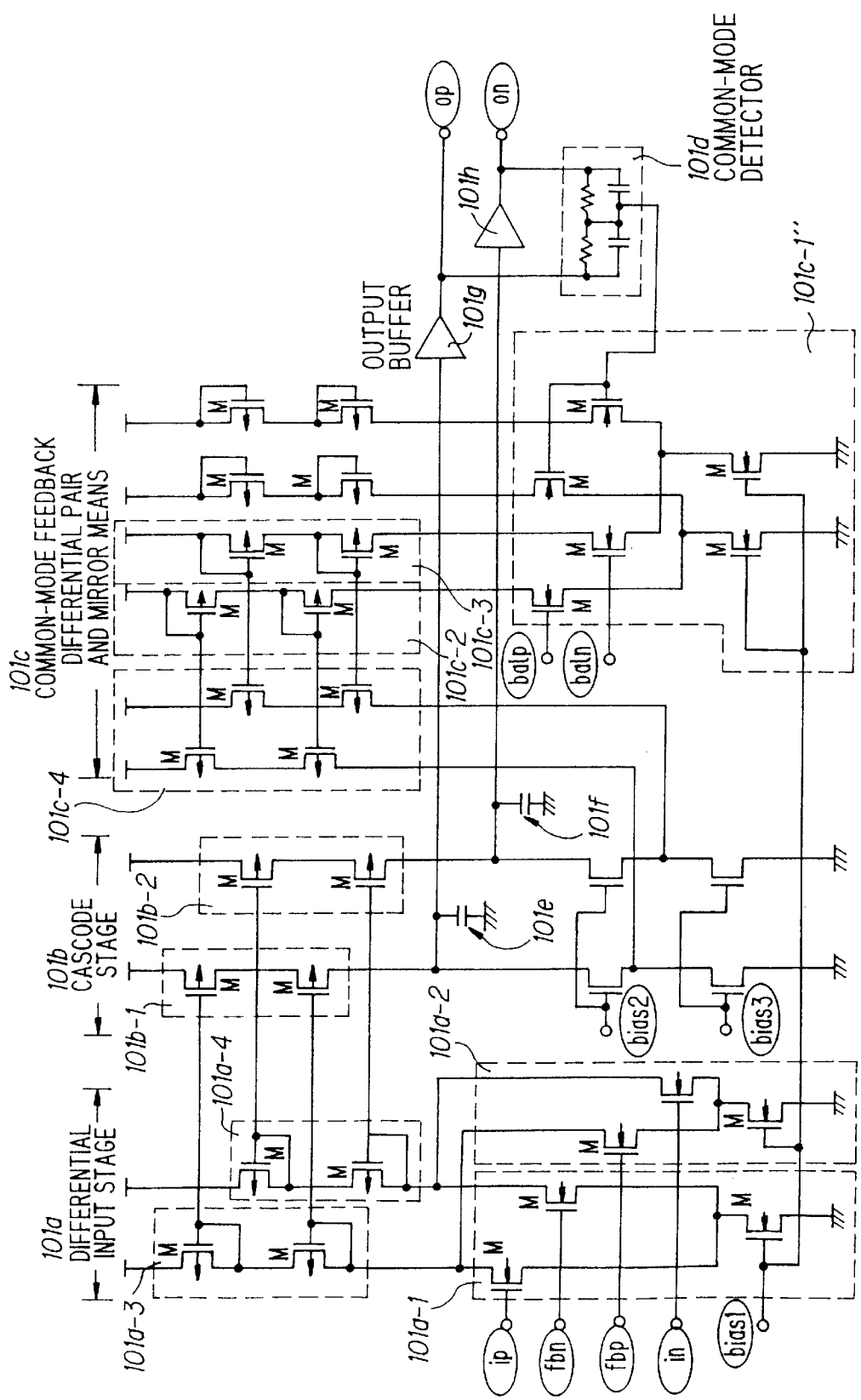
FIG. 19 is a diagram showing a differential operational amplifier having yet another configuration.
Figure 20:
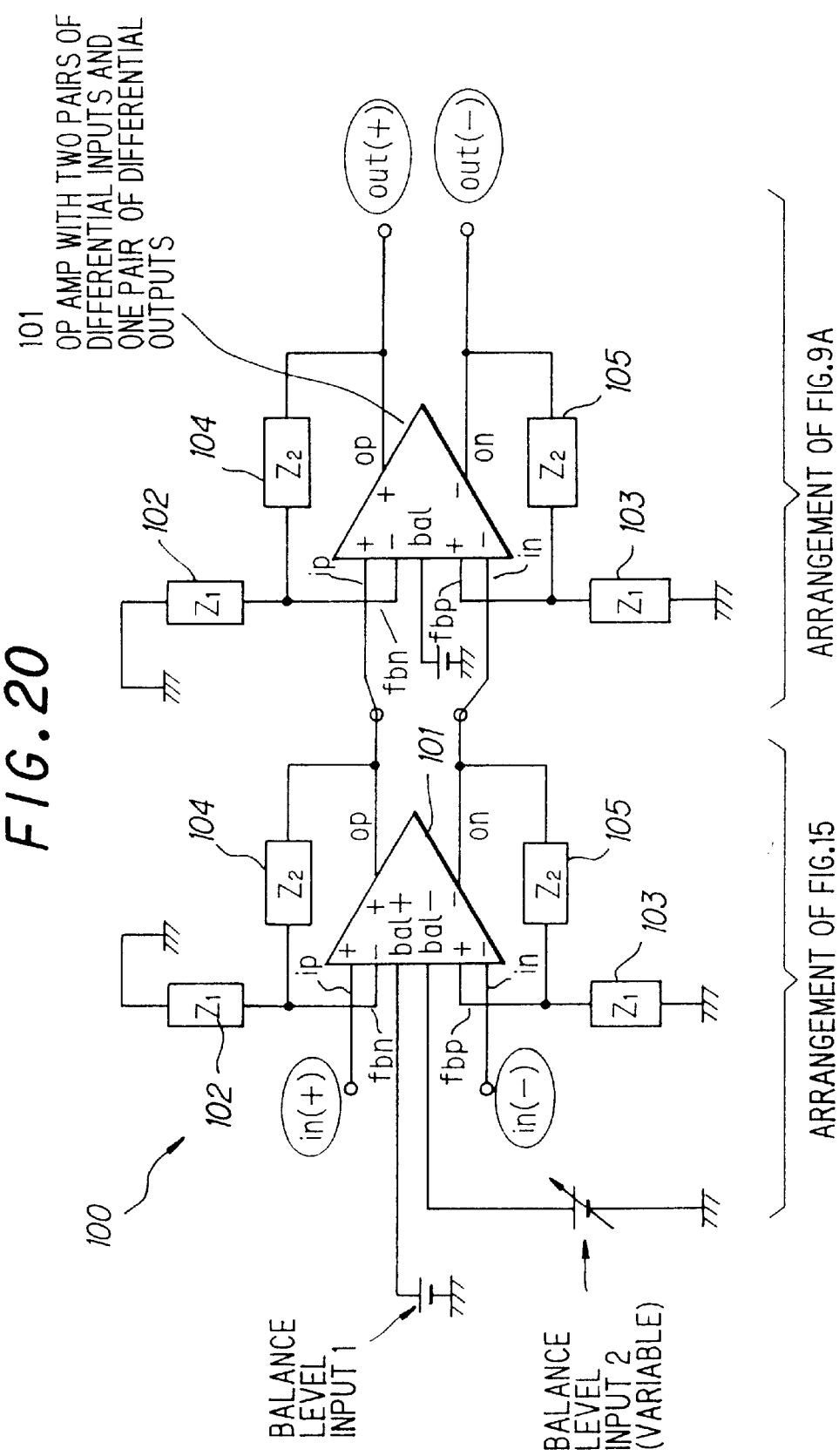
FIG. 20 is a diagram showing the cascaded construction of a differential non-inverting amplifier circuit.

FIG. 19 is a diagram showing another arrangement of the differential operational amplifier 101 shown in FIG. 15A. Elements identical with those shown in FIG. 16 are designated by like reference characters. This arrangement differs from that of FIG. 16 in that the common-mode feedback differential pair 101c comprises (1) the four-input differential pair 101c-1" having the first differential circuit comprising the common mode of the output and the non-inverting balance input balp and the second differential circuit comprising the common mode of the output and the inverting balance input baln, (2) the current mirror means 101c-2, 101c-3 for feeding back the currents which flow through the non-inverted and inverted balance input sides of the differential pair 101c-1" to the non-inverted and inverted sides on the cascode stage 101b by current mirrors, and (3) current folding means 101c-4 for folding current on each cascode stage and feeding the current back to the cascode amplifier stages.

In the operational amplifier configuration described above, the operational amplifier can be realized by reversing the P-channel and N-channel FETs or by mirroring current to the cascode amplifier stage or folding current from the cascode amplifier stage via one stage or plural stages of the current mirror means and current folding means.

In accordance with the differential non-inverting amplifier circuit of FIG. 15A, the variable input balance level changes in a direction to cancel the DC offset between the non-inverting and inverting outputs, thereby canceling the DC offset.

Figure 15B:
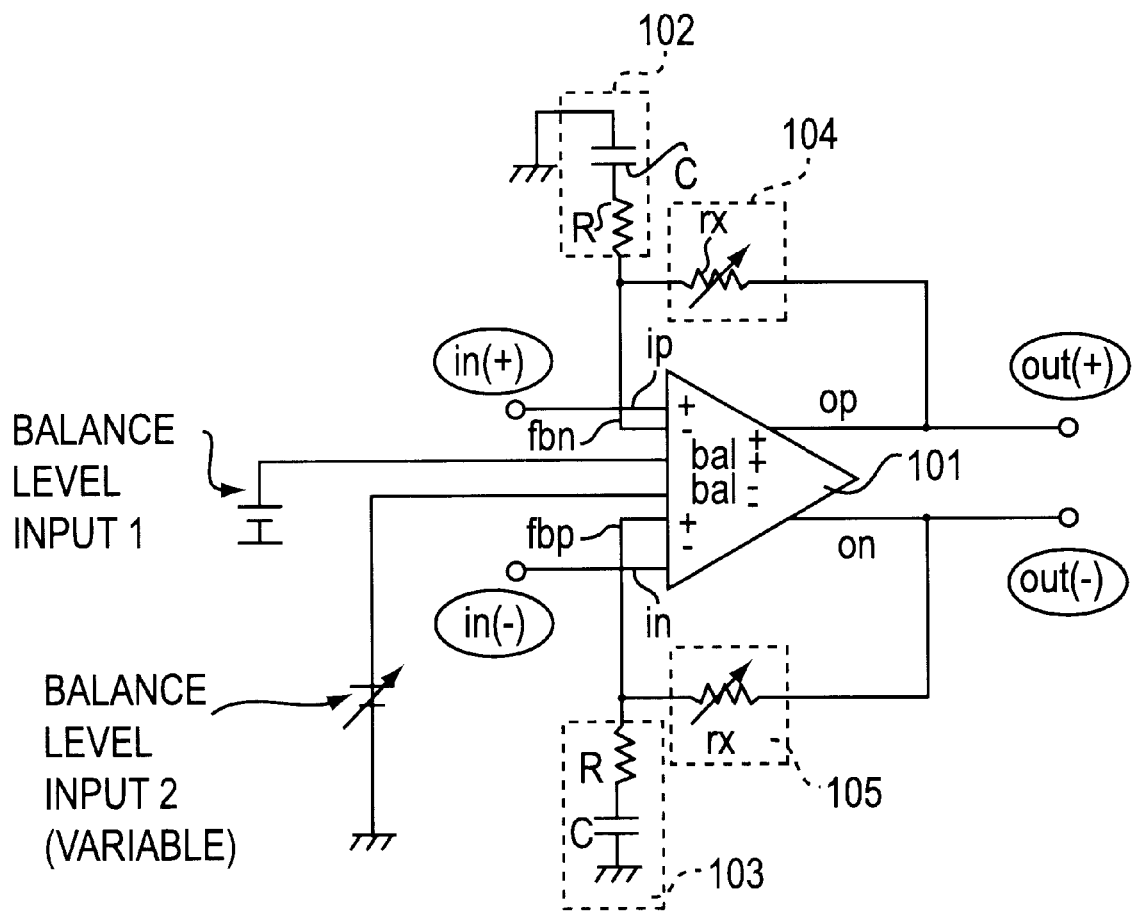
FIG. 15B shows a differential variable high-pass filter.
Figure 15C:
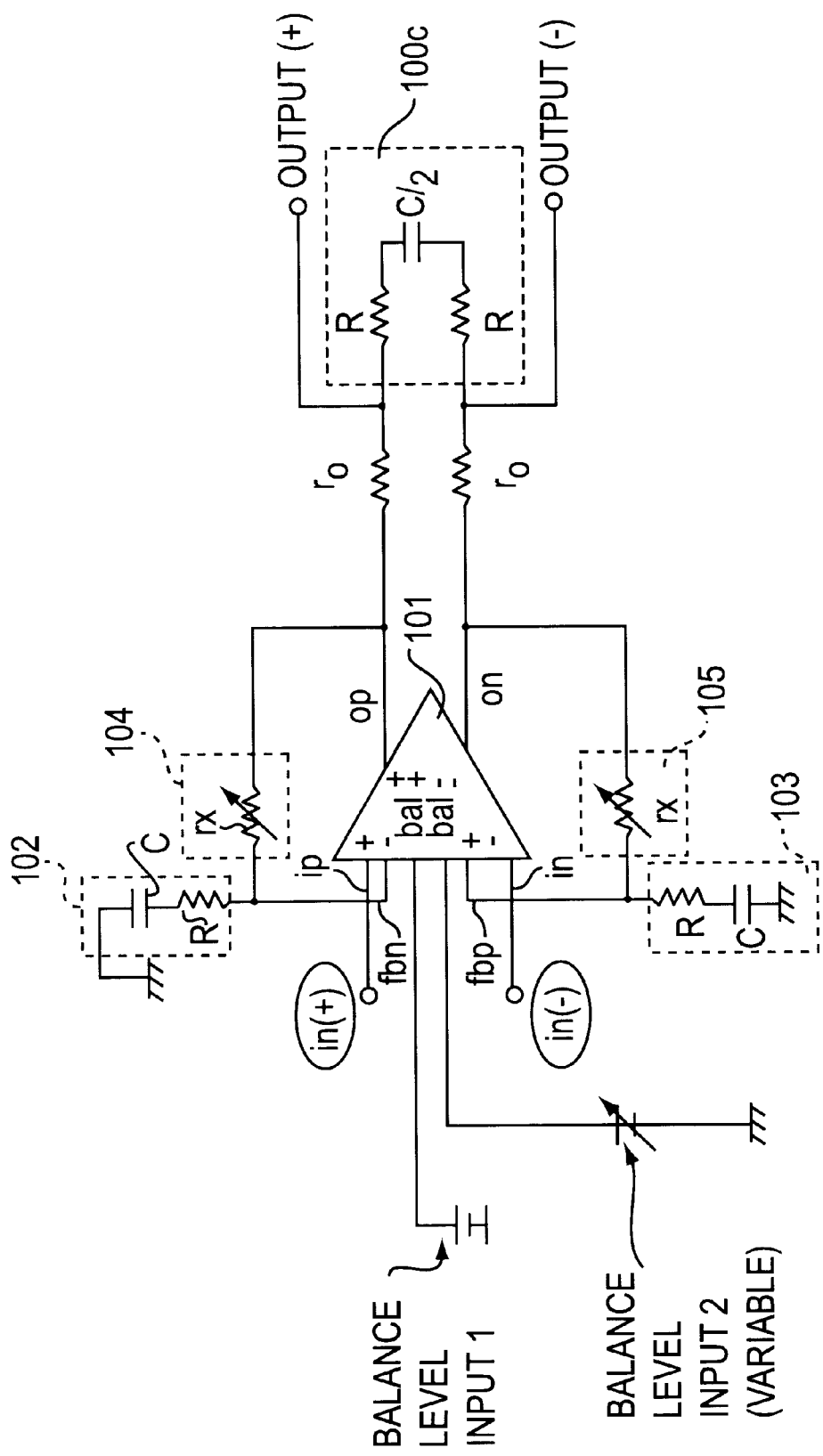
FIG. 15C is a differential √fAGC.

If the differential non-inverting amplifier circuit of FIG. 15A is applied to the √fAGC circuits of FIGS. 2A and 6A in the same manner as the differential non-inverting amplifier circuit of FIG. 9A, differential-type equalization can be performed. Further, a differential-type variable high-pass filter is constructed by replacing the passive elements 102~105 with resistors, capacitors and variable resistors in the manner of FIG. 15B, and this can be used as a differential-type √fAGC circuit. Furthermore, a differential-type √fAGC circuit can be constructed in the manner shown in FIG. 15C. A differential-type voltage follower can also be constructed by adopting the arrangement of the kind shown in FIG. 14A.

When differential non-inverting amplifier circuits are connected in a number of stages, the initial stage is made the differential non-inverting amplifier circuit of FIG. 15 and the stages from the second onward are made the differential non-inverting amplifier circuits of FIG. 9A, whereby the output DC offset quantity of the final stage is fed back to the variable balance input of the initial stage to cancel the offset.

(C) Slicer Circuit (a) Configuration of Slicer Circuit

The pulse width (duty) of slicer data output by the conventional slicer circuit is not constant, differences appear and balance is poor.

Figure 21:
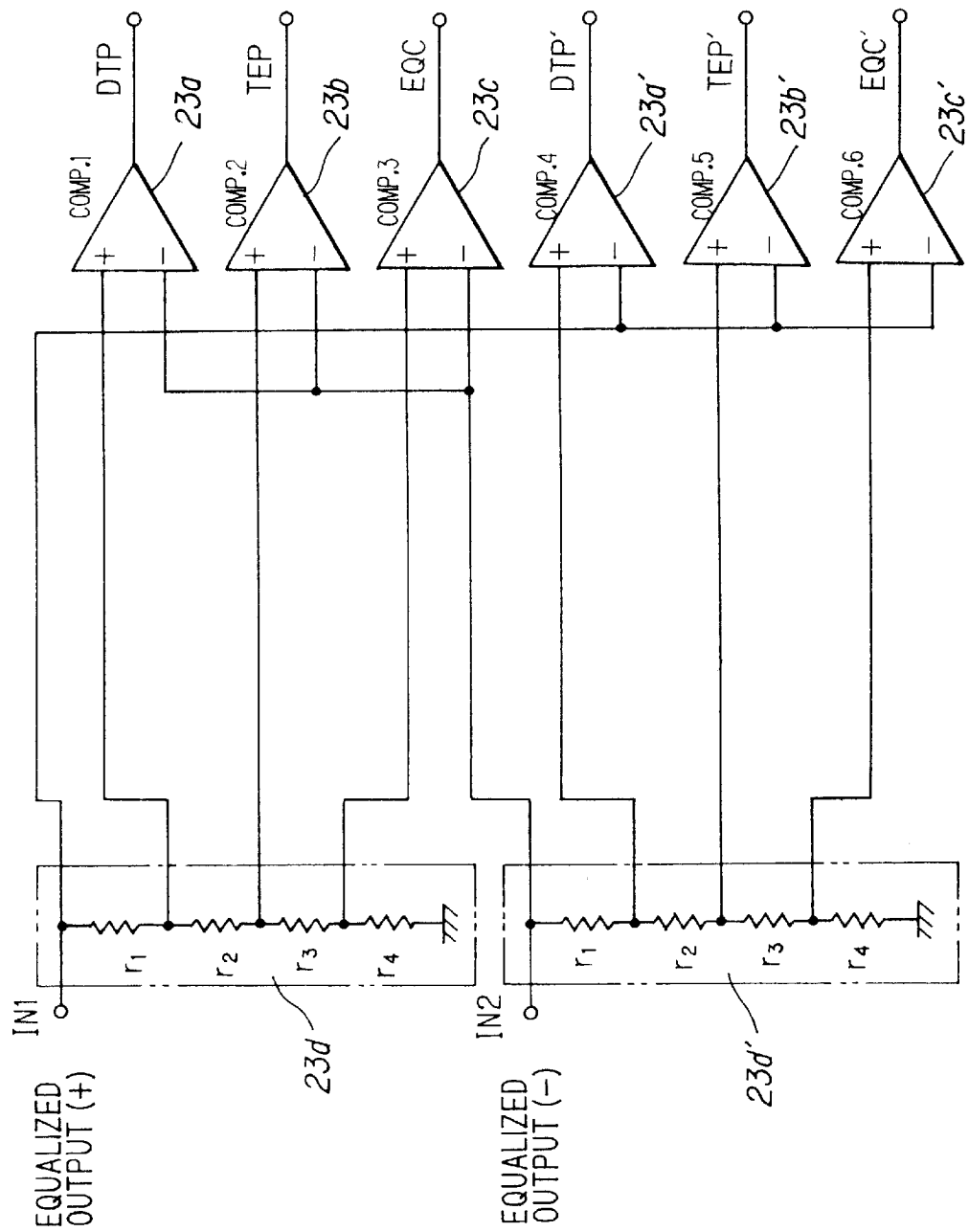
FIG. 21 is a diagram showing a first configuration of a differential slicer (comparator)

Accordingly, as shown in FIG. 21, the slicer circuit 23 is constructed by comparators 23a~23c, 23a'~23c' and resistance-divided level shifters 23d, 23d' provided in front of the comparators. Data pulses DTP, DTP', timing extraction pulses TEP, TEP' and equalization control pulses EQC, EQC' are output by the comparators, each of which compares signals from the level shifters 23d, 23d'.

The resistance-divided level shifter 23d has a first resistor $r_1$ provided between a first input terminal IN1 and the non-inverting input terminal of the first comparator 23a, a second resistor $r_2$ provided between the non-inverting input terminal of the first comparator 23a and the non-inverting input terminal of the second comparator 23b, a third resistor $r_3$ provided between the non-inverting input terminal of the second comparator 23b and the non-inverting input terminal of the third comparator 23c, and a fourth resistor $r_4$ provided between the non-inverting input terminal of the third comparator 23c and ground.

The resistance-divided level shifter 23d' has a fifth resistor $r_1$, the value of which is the same as that of the first resistor, provided between a second input terminal IN2 and the non-inverting input terminal of the fourth comparator 23a', a sixth resistor $r_2$, the value of which is the same as that of the second resistor, provided between the non-inverting input terminal of the fourth comparator 23a' and the non-inverting input terminal of the fifth comparator 23b', a seventh resistor $r_3$, the value of which is the same as that of the third resistor, provided between the non-inverting input terminal of the fifth comparator 23b' and the non-inverting input terminal of the sixth comparator 23c', and an eighth resistor $r_4$, the value of which is the same as that of the fourth resistor, provided between the non-inverting input terminal of the sixth comparator 23c' and ground.

Furthermore, the inverting input terminals of the first comparator 23a, second comparator 23b and third comparator 23c are connected to the second input terminal IN2, and the inverting input terminals of the fourth comparator 23a', fifth comparator 23b' and sixth comparator 23c' are connected to the first input terminal IN1.

Figure 22:
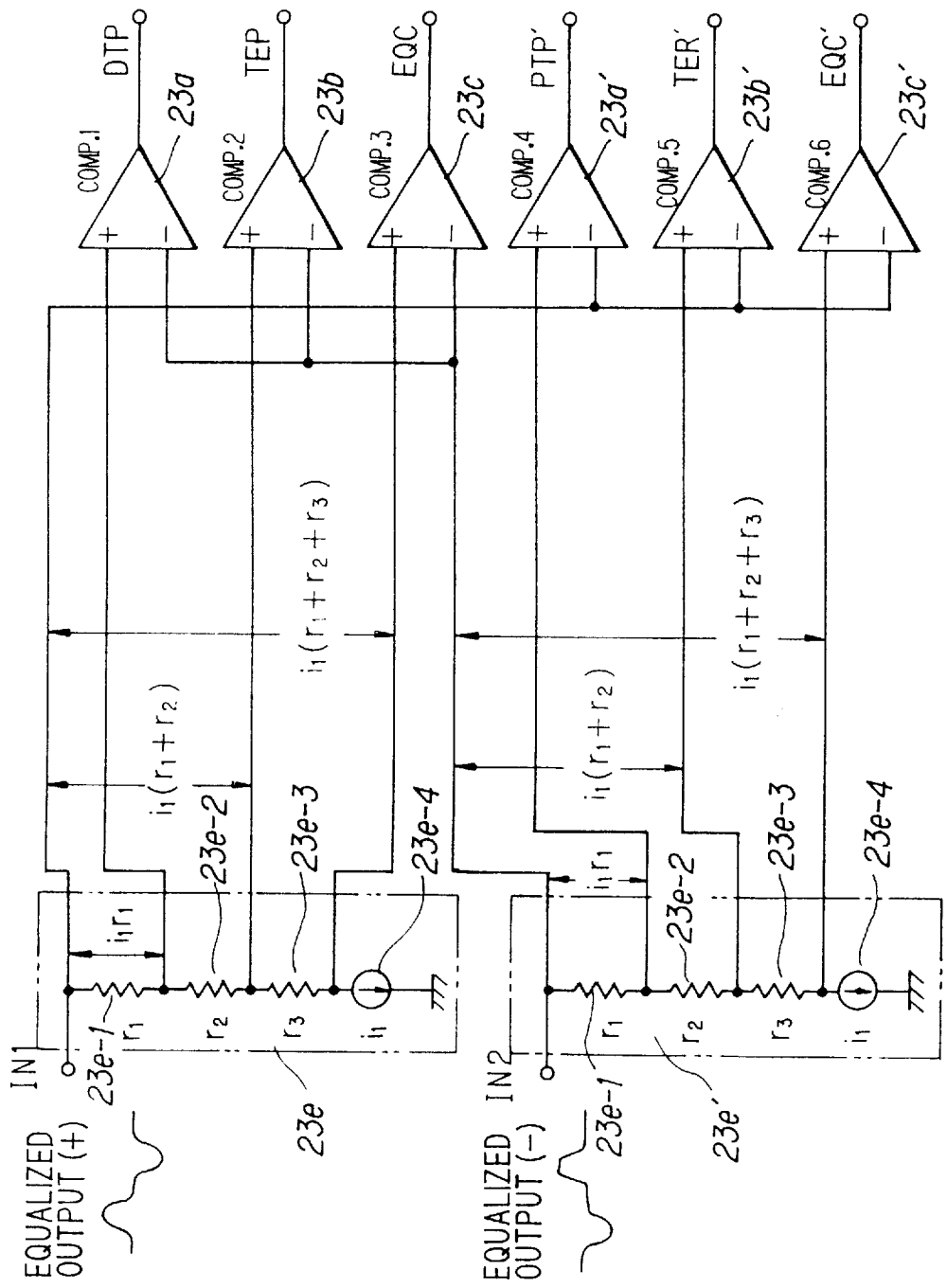
FIG. 22 is a diagram showing a second configuration of a differential slicer (comparator)

Level shifters 23e, 23e' shown in FIG. 22 also can be used as the above-mentioned level shifters. The level shifters 23e, 23e' each include resistors 23e-1~23e-3, which have resistance values $r_1$~$r_3$, respectively, and a constant-current source 23e-4.

Figure 23:
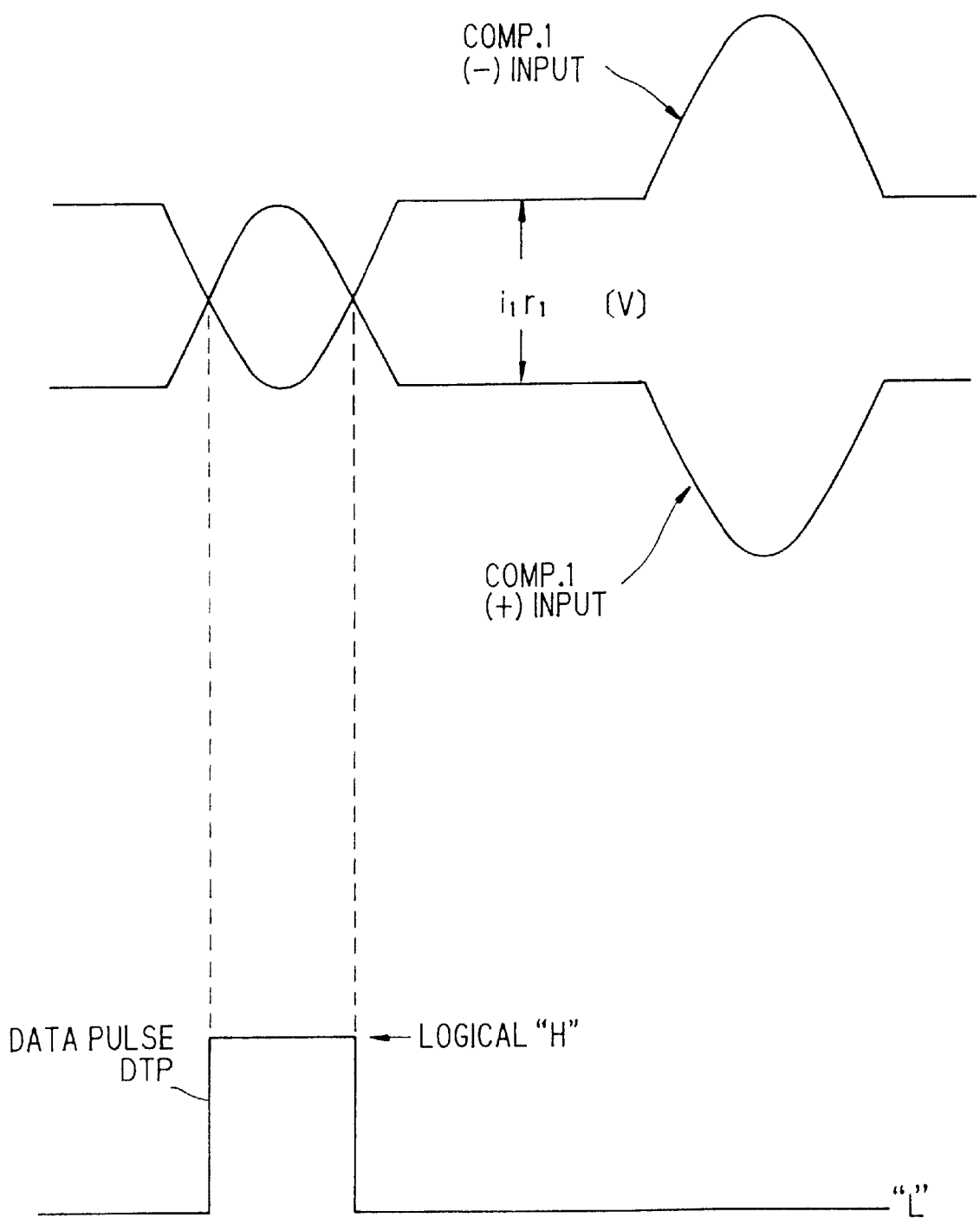
FIG. 23 is a time chart for describing the operation of a comparator for outputting data pulses.
Figure 24:
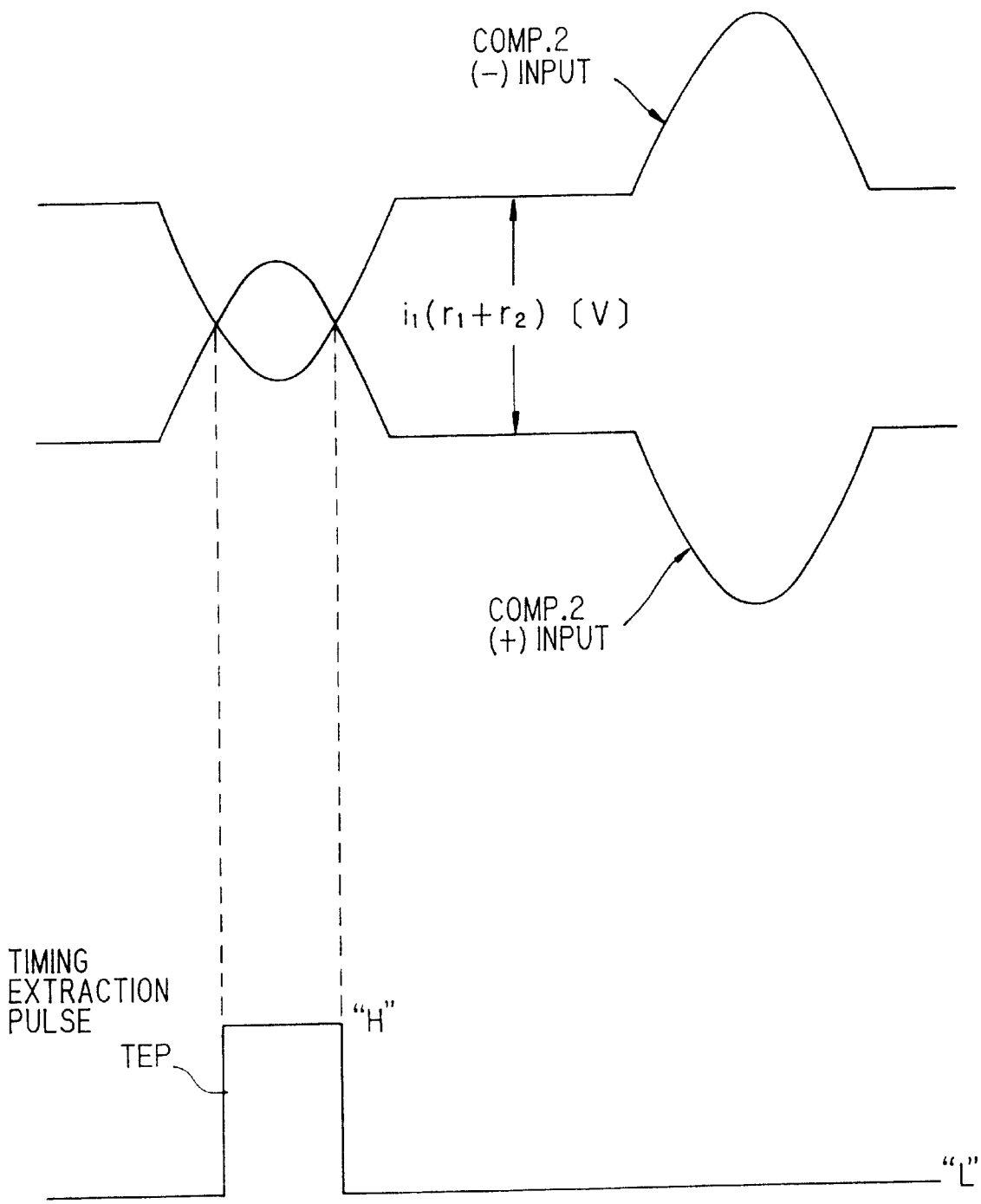
FIG. 24 is a time chart for describing the operation of a comparator which outputs pulses for timing extraction.
Figure 25:
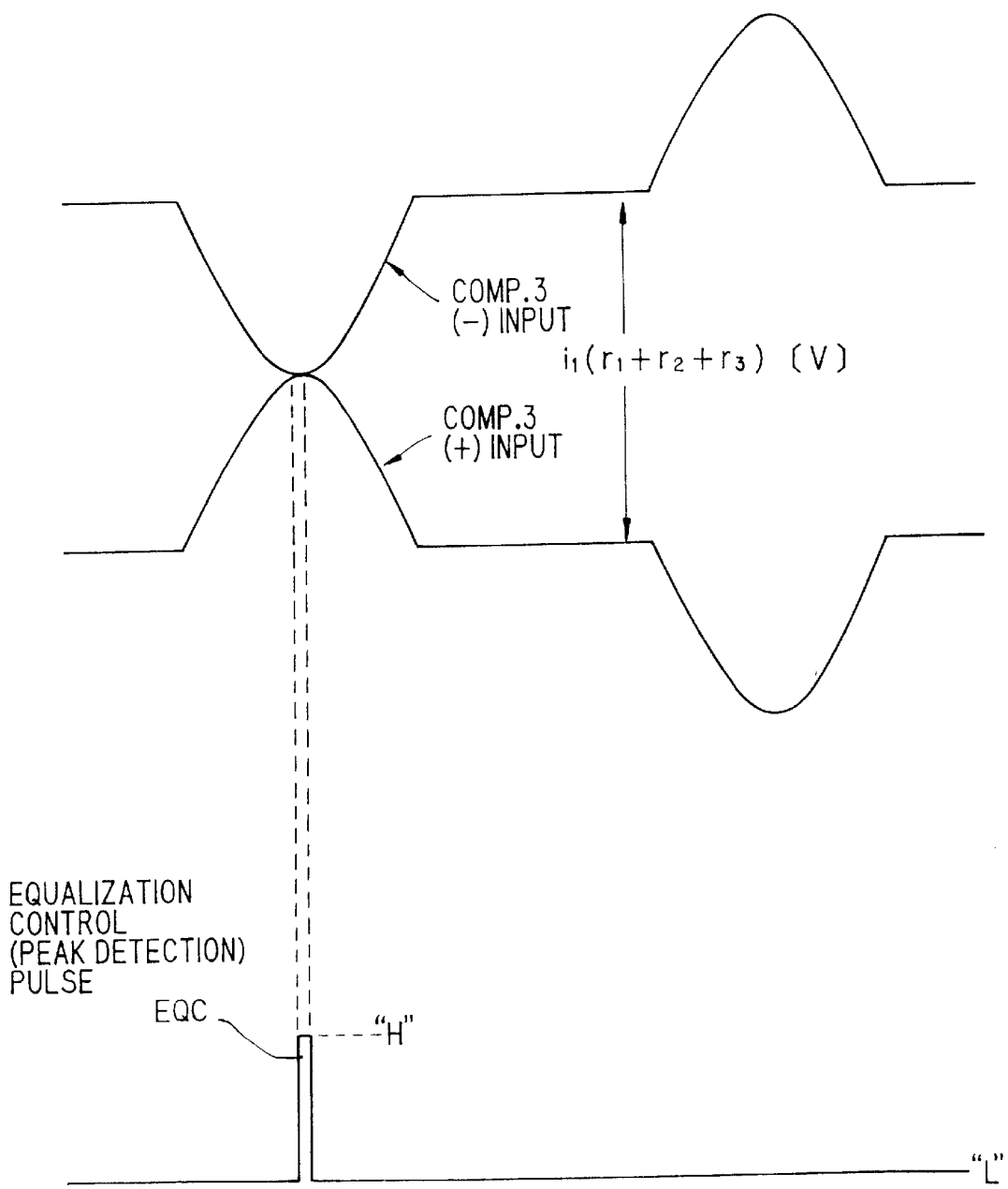
FIG. 25 is a time chart for describing the operation of a comparator which outputs pulses for controlling equalization.

FIG. 23 is a time chart of the comparator 23a which generates the data pulses DTP in FIG. 22, and FIG. 24 is a time chart of the comparator 23b which generates the timing extraction pulses TEP in FIG. 22. FIG. 25 is a time chart of the comparator 23c which generates the equalization control pulses EQC used when detecting the peak of the equalized output. The comparators 23a', 23b' and 23c' perform slicing in similar fashion.

(b) Current Source of Level Shifter

In the resistance-divided level shifter of FIG. 21, the amount of shift is dependent upon the DC component of the equalized output. When the DC component of the equalized output fluctuates, therefore, so does the signal output level that is the goal of the equalizing circuit, and an equalization deviation is produced. With the level shifter using the constant current of FIG. 22, the amount of shift varies owing to variance in resistance elements, and therefore an equalization deviation is produced owing to process variations.

Figure 26:
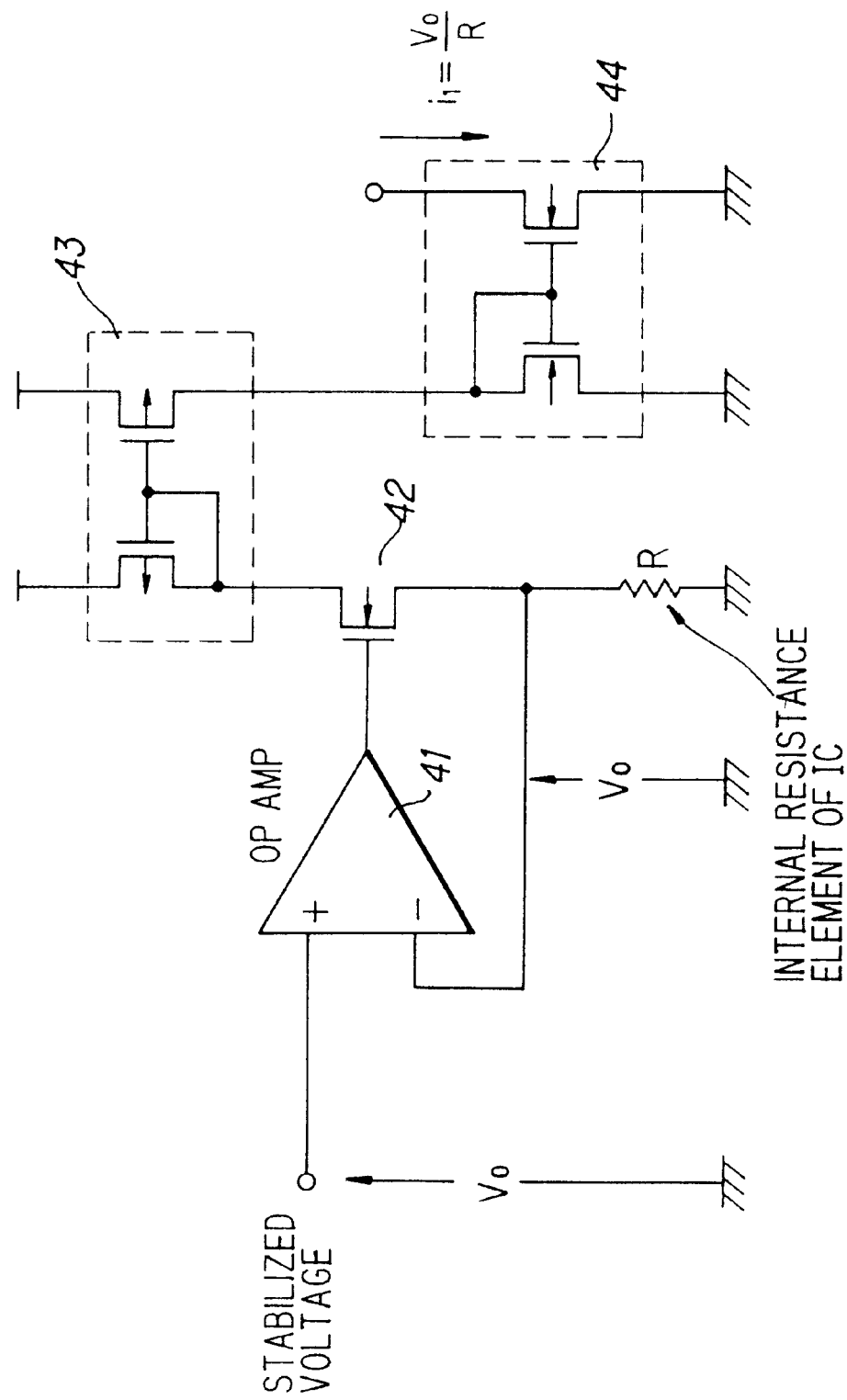
FIG. 26 is a diagram showing an example of a current source which keeps the amount of shift of a lever shifter constant.

Accordingly, a current source shown in FIG. 26 is used as the current source of FIG. 22 in order to obtain a fixed equalized output amplitude that is independent of manufacturing variance.

The current source of FIG. 26 includes an operational amplifier 41 to the non-inverting input of which a stabilized voltage $V_0$ is applied. A resistor R, which is an internal element of the integrated circuit, is connected between the inverting input of the operational amplifier 41 and ground, the gate of an N-channel MOSFET 42 is connected to the output terminal of the operational amplifier 41, and the source of the N-channel MOSFET 42 is connected to the inverting input of the operational amplifier 41. A constant current is extracted from the drain of the N-channel MOSFET 42. In the current source of FIG. 26, current mirror circuits 43, 44 are connected to the drain of the N-channel MOSFET 42, and the constant current is extracted from the current mirror circuit 44.

In such a current source, a level equal to the stabilized voltage $V_0$ is generated at the inverting input terminal of the operational amplifier 41. Accordingly, a current $V_0/R$ flows into the integrated-circuit resistor R, and this current is output through the current mirror means 43, 44.

A coefficient k, which is dependent upon manufacturing variance of the resistor constructed within the integrated circuit, is substantially constant within the same chip, and the resistor R in FIG. 26 and resistors $r_1, r_2, r_3$ in FIG. 22 can be expressed as follows:

$$R = k \cdot R_0$$
$$r_1 = k \cdot r_{10}$$
$$r_2 = k \cdot r_{20}$$
$$r_3 = k \cdot r_{30}$$

Accordingly, the levels shifted in $r_1, r_2$ and $r_3$ are as follows:

$$r_1 \cdot i_1 = r_1 \cdot V_0 / R$$
$$= (k \cdot r_{10}) \cdot V_0 / (k \cdot R_0)$$
$$= V_0 \cdot r_{10} / R_0$$

$$r_2 \cdot i_1 = V_0 \cdot r_{20}/R_0$$
$$r_3 \cdot i_1 = V_0 \cdot r_{30}/R_0$$

All of these are values that are independent of manufacturing variance.

Thus, if the resistor R and resistors $r_1, r_2$ and $r_3$ are formed within the same chip, a constant level shift can be performed without relation to manufacturing variances and equalization deviation due to such variances can be suppressed.

Further, if the circuit shown in FIG. 27 is used as the current mirror, a more accurate level shift is possible.

(c) Current Mirrors

Figure 27A:
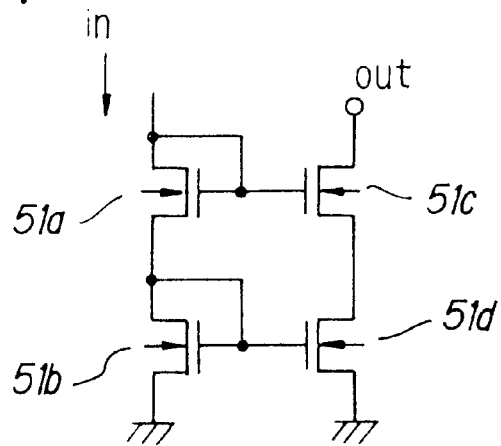
FIGS. 27A, 27B and 27C illustrate current mirrors.
Figure 27B:
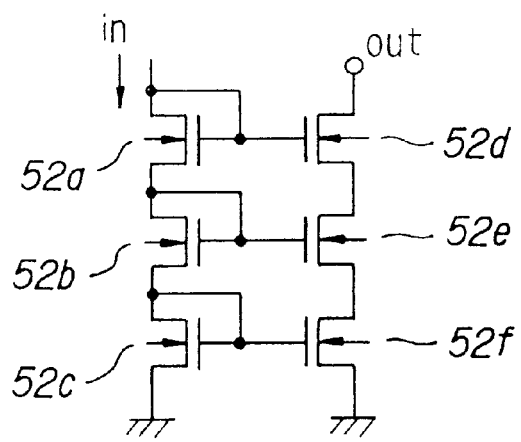
Figure 27C:
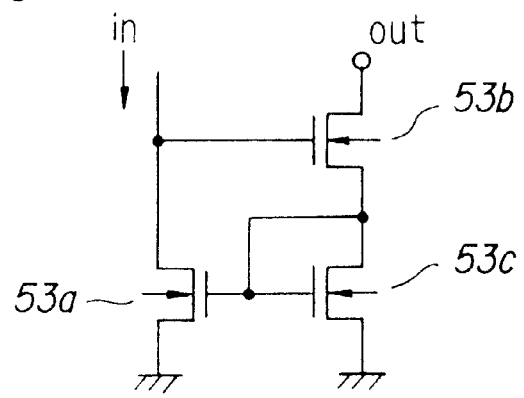

FIGS. 27A–27C illustrate embodiments of current mirrors, in which FIG. 27A is a cascode-type current mirror, FIG. 27B a three-stage cascode-type current mirror and FIG. 27C a Wilson-type current mirror circuit.

The cascode-type current mirror circuit of FIG. 27A (1) has a first N-channel MOSFET 51a, a second N-channel MOSFET 51b, a third N-channel MOSFIT 51c and a fourth N-channel MOSFET 51d, (2) uses the drain of the first N-channel MOSFET 51a as an input terminal and the drain of the third N-channel MOSFET 51c as an output terminal, (3) has the drain and gate of the first N-channel MOSFET 51a connected to the gate of the third N-channel MOSFET 51c, (4) has the source of the first N-channel MOSFET 51a, the drain and gate of the second N-channel MOSFET 51b and the gate of the fourth N-channel MOSFET 51d connected together, (5) has the source of the third N-channel MOSFET 51c connected to the drain of the fourth N-channel MOSFET 51d, and (6) has the source of the second N-channel MOSFET 51b connected to ground and the source of the fourth N-channel MOSFET 51d connected to ground.

The three-stage cascode-type current mirror circuit of FIG. 27B (1) has a first N-channel MOSFET 52a, a second N-channel MOSFET 52b, a third N-channel MOSFET 52c, a fourth N-channel MOSFET 52d, a fifth N-channel MOSFET 52e and a sixth N-channel MOSFET 52f, (2) uses the drain of the first N-channel MOSFET 52a as an input terminal and the drain of the fourth N-channel MOSFET 52d as an output terminal, (3) has the drain and gate of the first N-channel MOSFET 52a connected to the gate of the fourth N-channel MOSFET 52d, (4) has the source of the first N-channel MOSFET 52a, the drain and gate of the second N-channel MOSFET 52b and the gate of the fifth N-channel MOSFET 52e connected together, (5) has the source of the second N-channel MOSFET 52b, the drain and gate of the third N-channel MOSFET 52c and the gate of the sixth N-channel MOSFET 52f connected together, (6) has the source of the fourth N-channel MOSFET 52d connected to the drain of the fifth N-channel MOSFET 52e, (7) has the source of the fifth N-channel MOSFET 52e connected to the drain of the sixth N-channel MOSFET 52f, and (8) has the source of the third N-channel MOSFET 52c connected to ground and the source of the sixth N-channel MOSFET 52f connected to ground.

The Wilson-type current mirror circuit of FIG. 27C (1) has a first N-channel MOSFET 53a, a second N-channel MOSFET 53b and a third N-channel MOSFET 53c, (2) has the drain of the first N-channel MOSFET 53a connected to the gate of the second N-channel MOSFET 53b and uses this as an input, (3) has the source of the second N-channel MOSFET 53b and the drain and gate of the third N-channel MOSFET 53c connected together, (4) has the source of the first N-channel MOSFET 53a connected to ground and the drain of the second N-channel MOSFET 53b connected to ground, and (5) uses the drain of the second N-channel MOSFET 53b as an output.

(D) Gain Control Circuit (a) Configuration of Gain Control Circuit

Figure 28:
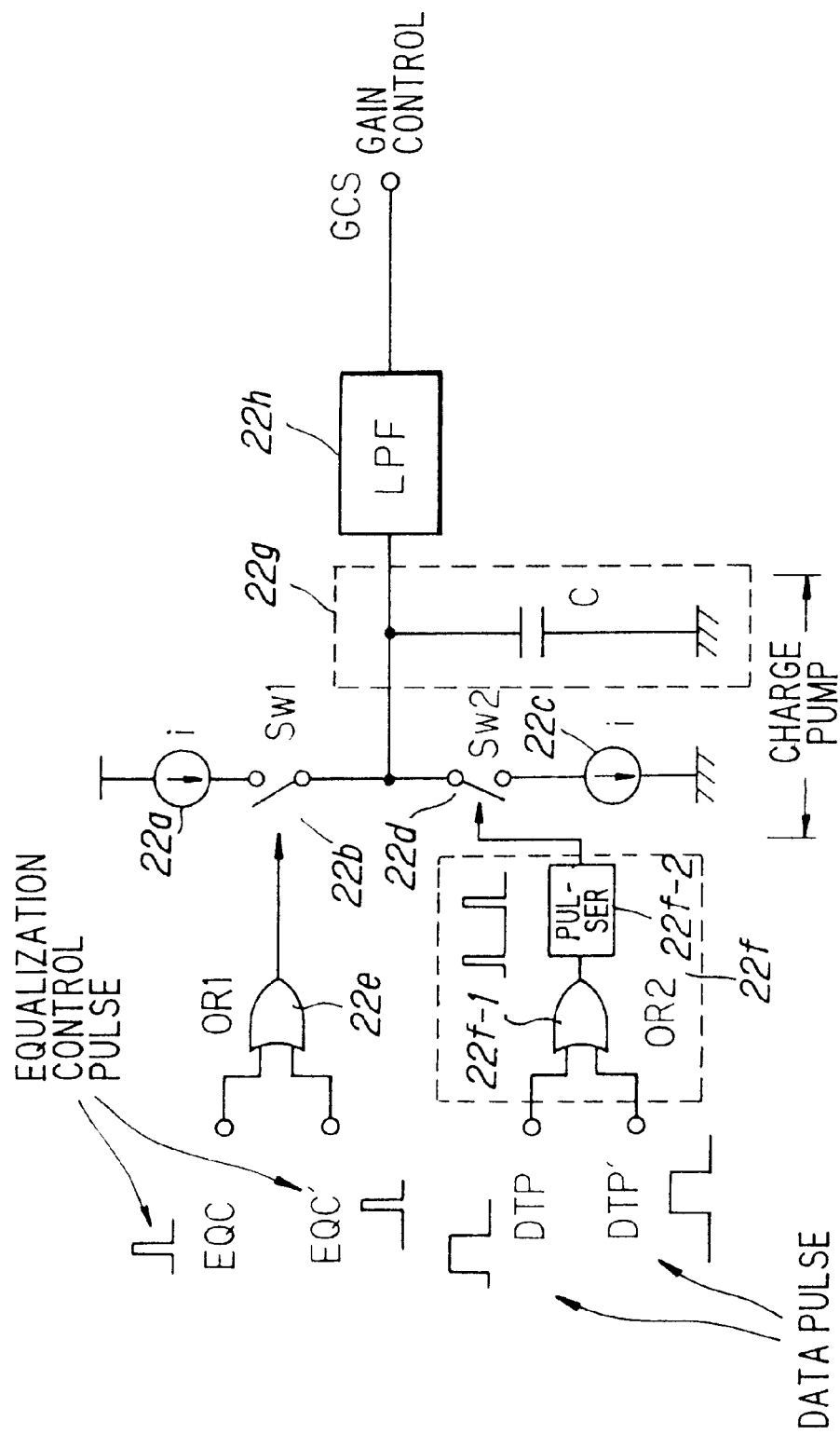
FIG. 28 shows a gain control circuit according to the present invention.

FIG. 28 is a diagram showing the configuration of the gain control circuit 22. The gain control circuit includes a first current source 22a for charging, a first switch 22b for controlling the first current source 22a, a second current source 22c for discharging, a second switch 22d for controlling the second current source 22c, an OR gate 22e for turning on the first switch 22b when the output signal amplitude of the equalizer (gain varying circuit) 21 exceeds a reference level, a switch control circuit 22f for turning the second switch 22d ON for a predetermined period of time whenever the equalizer output attains a high level, an integrating circuit 22g for integrating a difference between a charging current from the first current source 22a and a discharging current to the second current source 22c, and a low-pass filter 22h for delivering an output from the integrating circuit 22g as the gain control signal GCS of the equalizer 21. It should be noted that low-pass filter 22h is unnecessary if the charge pump preceding it provides an adequate time constant.

The OR gate 22 e outputs a high-level switch-on signal, thereby turning on the first switch 22b, when either of the equalization control pulses EQC, EQC' output by the slicer circuit 23 attains the high level. The switch control circuit 22c has an OR gate 22f-1 and a pulser 22f-2. The OR gate 22f-1 outputs a high-level signal when either of the data pulses DTP, DTP' output by the slicer circuit 23 attains the high level, and the pulser 22f-2 detects the leading edge of the output of the OR gate 22f-1 and outputs a switch-on signal of a predetermined length of time, thereby turning on the second switch 22d.

When the peak of the equalized output from the equalizer 21 is large, the length of time during which the first switch 22b is on increases; when the peak is small, the length of time during which the first switch 22b is on decreases. The second switch 22d, on the other hand, turns on for a fixed period of time. Accordingly, when the peak value is large, the charged current becomes larger than the discharged current and the integrated output increases. When the peak value is small, the discharged current becomes small and the integrated output decreases. As a result, a gain control signal GCS conforming to the magnitude of the peak value is output and the equalizer 21 control s the gain on the basis of this gain control signal GCS in such a manner that the peak of the equalized output is rendered constant.

Thus, in accordance with the gain control circuit of the present invention, equalization control independent of the pulse density of the input data becomes possible without external elements. This solves Problem 8 of the prior art.

(b) Input-Loss Detecting Circuit

Figure 29:
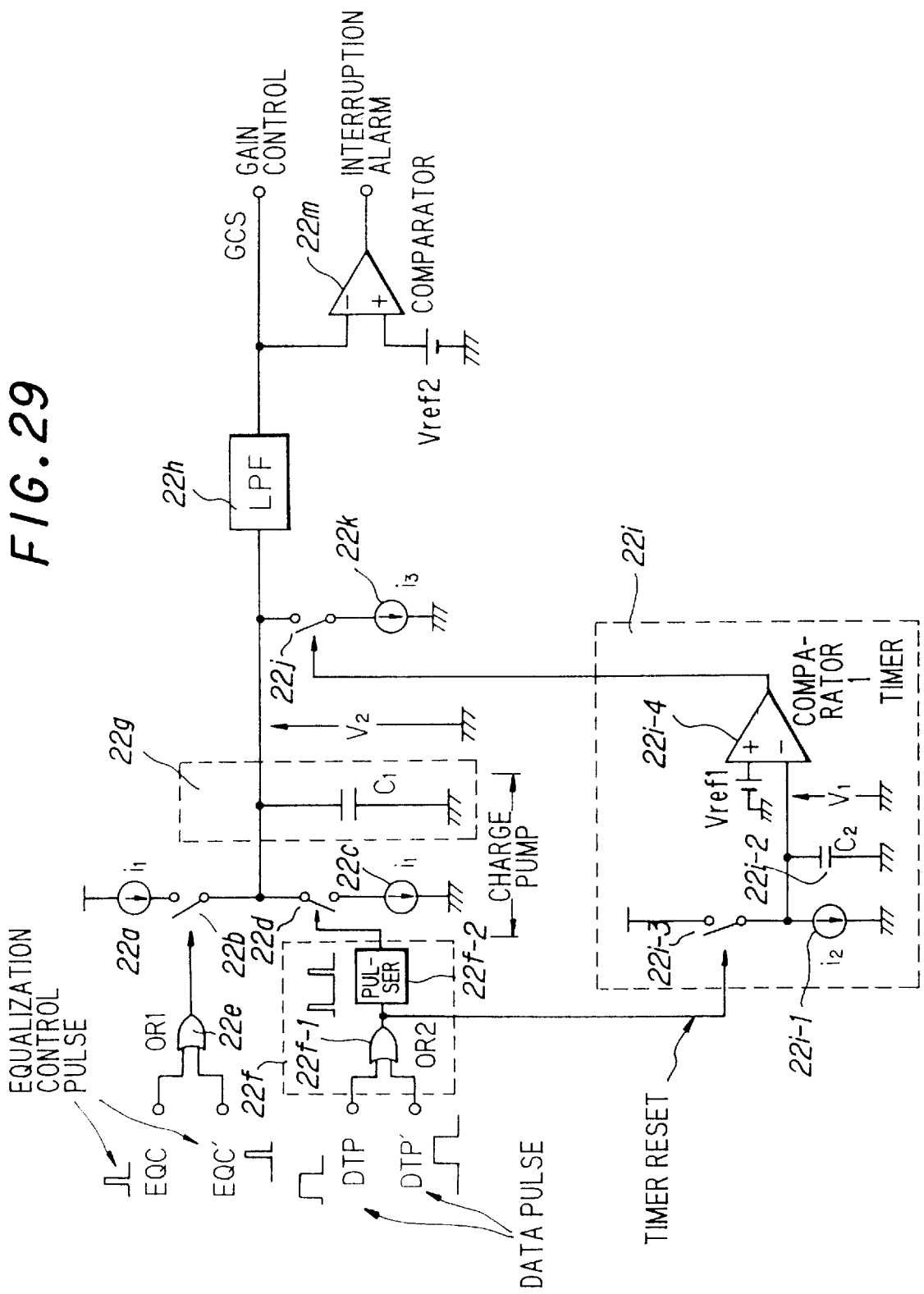
FIG. 29 is a circuit diagram of a circuit for detecting interruption of an input signal.

FIG. 29 is a diagram showing the configuration of a circuit for detecting a loss of input signal. The circuit includes a timer 22i which is reset when the output of the gain varying circuit (equalizer) 21 attains a high level, a third switch 22j controlled by the output of the timer 22i, a third current source 22k for discharging electric charge, which has accumulated in the capacitor C1 constituting the integrating circuit 22g, and a comparator (or hysteresis comparator) 22m for comparing the output of the gain control circuit and the reference voltage Vref2. Interruption of the input is detected based upon the output of the comparator or hysteresis comparator.

If data are not output by the equalizer 21, the equalization control pulses EQC, EQC' and data pulses DTP, DTP' are not output and the integrating circuit 22g is neither charged nor discharged. Consequently, the level of the gain control circuit GCS does not change and a loss of the input signal cannot be detected by comparing the level of the gain control circuit GCS with the reference level Vref2. Accordingly, the timer 22i, which is reset by entry of the data pulses DTP, DTP', is provided and the discharging current source 22k, which is controlled by the output of the timer 22i, is provided. The timer 22i has a discharging current source 22i-1, a capacitor 22i-2, a switch 22i-3 turned on for a period of time during which the data pulses DTP, DTP' mare at the high level, and a comparator 22i-4. When the data pulses DTP, DTP' attain the high level, the switch 22i-3 is turned on and the capacitor 22i-2 is charged. As a result, the terminal voltage V1 of the capacitor becomes larger than the reference voltage Vref1 and the third switch 22j does not turn on. Since the level of the gain control signal GCS is higher than that of the reference voltage Vref2 at this time, no input-signal loss alarm is issued.

While there is no entry of the data pulses DTP, DTP', the switch 22-3 turns on, the electric charge that has accumulated in the capacitor 22i-2 is discharged and the terminal voltage of the capacitor declines. If the data pulses DTP, DTP' arrive before the terminal voltage V1 of the capacitor becomes smaller than the reference voltage Vref1, the switch 22i-3 turns on, the capacitor 22i-2 is charged and the terminal voltage V1 of the capacitor does not become smaller than the reference voltage Vref1. However, when there is no entry of the data pulses DTP, DTP' in excess of a predetermined period of time, the terminal voltage V1 of the capacitor declines because of discharge and falls below the reference voltage Vref1. When the terminal voltage V1 of the capacitor becomes smaller than the reference voltage Vref1, the switch 22f turns on, a discharge is produced by the integrating circuit 22g and the level of the gain control circuit GCS gradually falls. When the level falls below the reference voltage Vref2, an input-signal loss alarm is output by the comparator 22m so that a break in the data can be detected.

Figure 30:
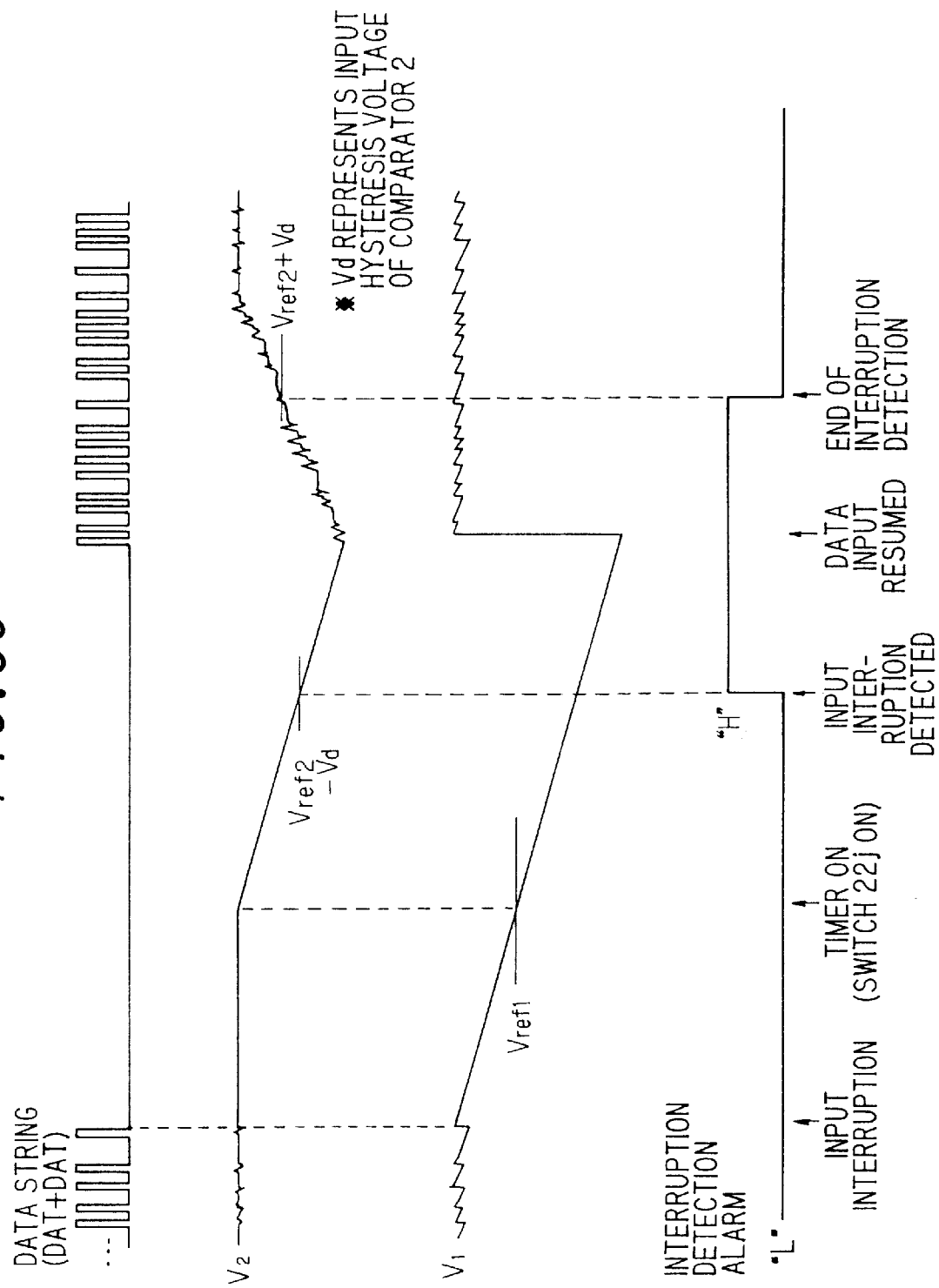
FIG. 30 is an alarm time chart for detecting interruption of an input signal.

The time chart associated with detection of an input signal loss is shown in FIG. 30.

(E) Detection of DC Feedback Level (a) The difference Between the DC Level of the equalized output on the non-inverted side and that on the inverted side is equal to the difference between the peak levels of those two outputs. Then, the difference between the DC level of the equalized output on the non-inverted side and that on the inverted side is proportional to the difference between pulse widths of the equalization control pulse EQC and that of EQC' on the negative side output by the slicer circuit 23. Accordingly, if the pulse width difference between the pulse EQC and EQC' can be detected, then the DC level difference between the equalized outputs can be detected.

(b) DC Feedback Level Detecting Circuit

Figure 31:
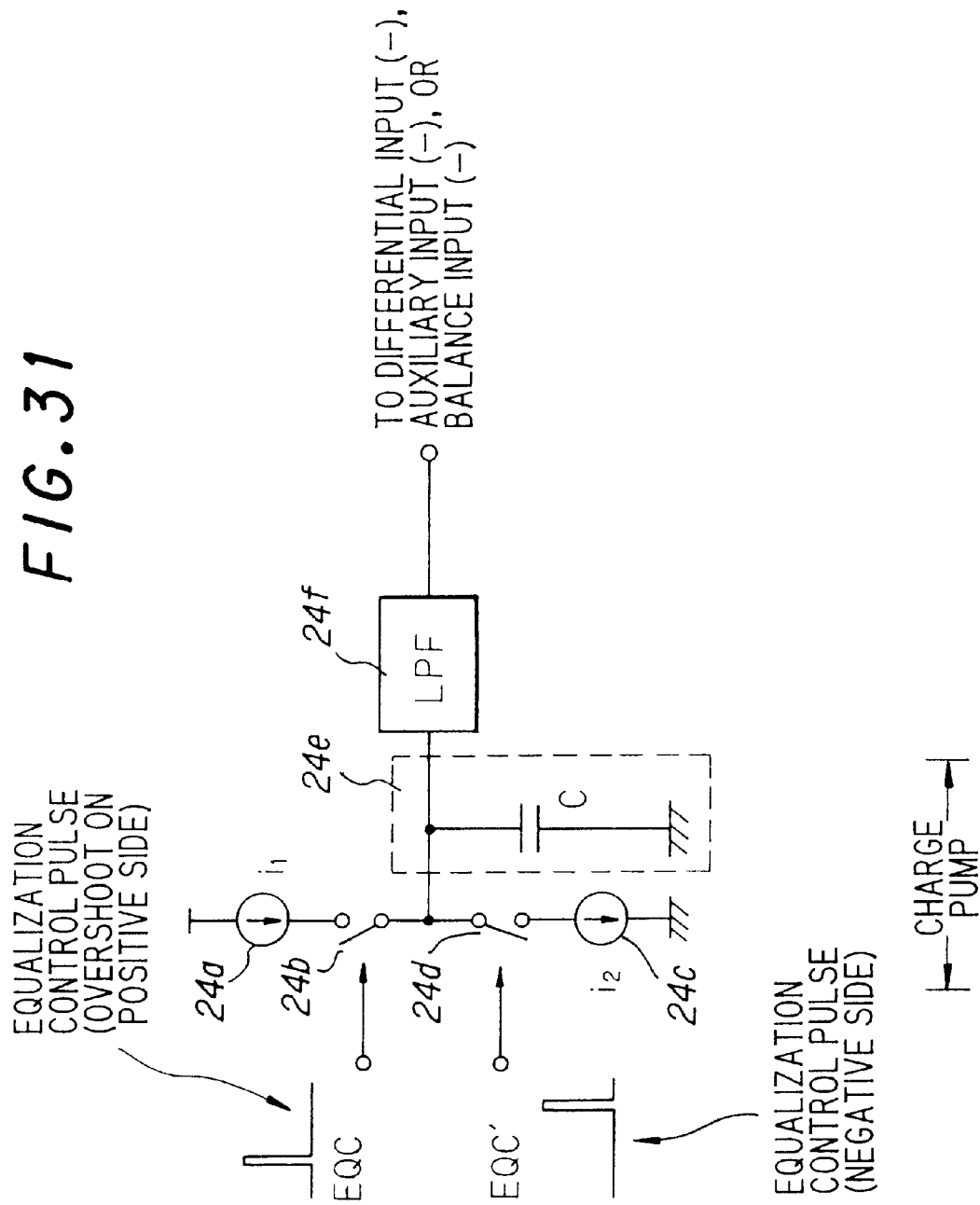
FIG. 31 is a diagram showing the configuration of a DC feedback level detecting circuit.

FIG. 31 is a diagram showing the configuration of a DC feedback level detecting circuit for detecting the DC feedback level in accordance with the principle described above. The detecting circuit includes a first current source 24a for charging, a first switch 24b which, when the equalization control pulse EQC on the positive side is at the high level, turns on to control the first current source 24a, a second current source 24c for discharging, a second switch 24d which, when the equalization control pulse EQC' on the negative side is at the high level, turns on to control the second current source 24c, an integrating circuit 24e for integrating a difference between a charging current from the first current source 24a and a discharging current to the second current source 24c, and a low-pass filter 24f. It should be noted that low-pass filter 24f is unnecessary if the charge pump preceding it provides an adequate time constant.

When the equalization control pulse EQC on the positive side attains the high level, the switch 24b turns on and the integrating circuit 24e is charged. When the equalization control pulse EQC' on the negative side attains the high level, the switch 24d turns on and the integrating circuit 24e starts discharging. When the DC level of the non-inverted output signal in the differential-type equalizer 21 is higher than the DC level of the inverted output, the electric charge that is charged exceeds the electric charge that is discharged. Conversely, when the DC level of the inverting output signal is higher than the DC level of the non-inverted output, the electric charge that is discharged exceeds the electric charge that is charged. As a result, a voltage proportional to the difference between the pulse widths of the equalization control pulse EQC on the positive side and the equalization control pulse EQC' on the negative side obtained from the integrating circuit 24e, namely a voltage proportional to the difference between the DC levels on the non-inverted and inverted sides, is output and a direct current is fed back to the equalizer 21. Accordingly, the equalizer 21 performs control in such a manner that the difference in DC levels is nulled, and stability is achieved when the non-inverted and inverted DC levels become equal.

If the pulse widths of the pulses that control charging and discharging and the values of the charging and discharging currents are set to be sufficiently small, then a large external element. (low-pass filter) of the kind needed in the conventional DC feedback circuit can be dispensed with, thereby solving Problem 5 of the prior art.

(c) Examples of Application of DC Feedback Level Detecting Circuit

Figure 32:
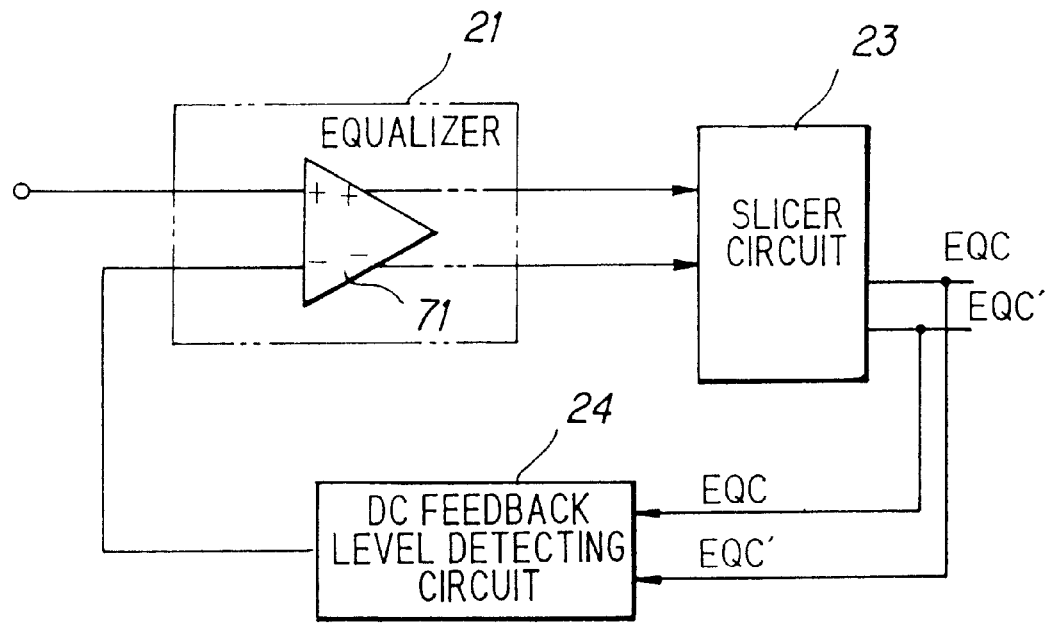
FIG. 32 illustrates a first example of application of the DC feedback level detecting circuit.
Figure 33:
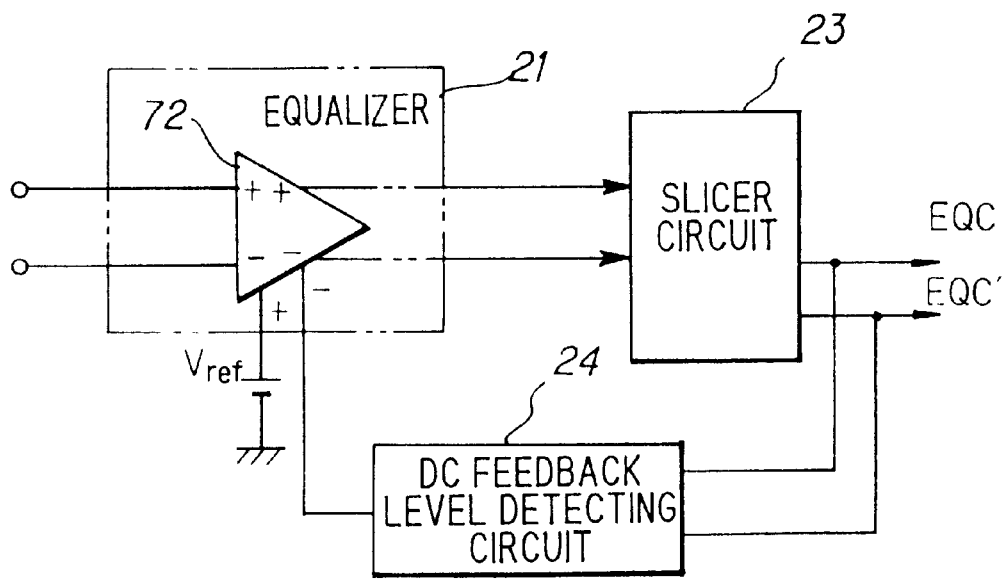
FIG. 33 illustrates a second example of application of the DC feedback level detecting circuit.
Figure 34:
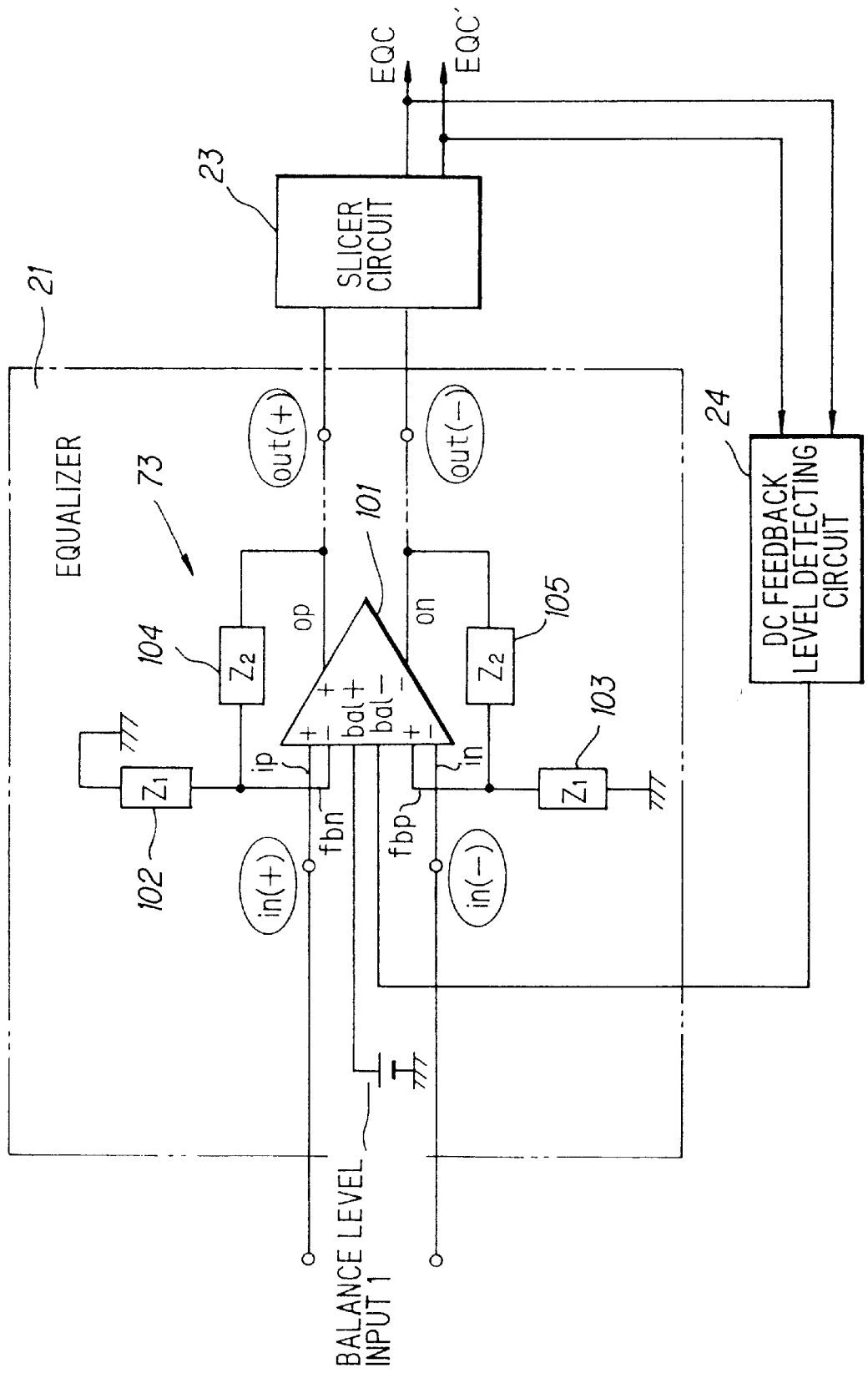
FIG. 34 illustrates a third example of application of the DC feedback level detecting circuit.

FIGS. 32~34 illustrates examples of application of the DC feedback level detecting circuit. These circuits are for canceling DC offset: and include the equalizer 21, slicer circuit 23 and DC feedback level detecting circuit 24.

As shown in FIG. 32, a non-inverted signal (equalization input) is applied to the non-inverted side of an amplifier 71 having a pair of differential inputs, and the output of the DC feedback level detecting circuit 24 enters the negative side inverted side of the pair of differential inputs.

In FIG. 33, differential signals enter a pair of differential input terminals of a differential amplifier 72 having a pair of differential inputs and a pair of auxiliary differential inputs, a reference voltage Vref is applied to the positive side of the pair of auxiliary differential inputs, and the output of the DC feedback level detecting circuit 24 enters the negative side of the pair of auxiliary differential inputs.

In FIG. 34, an amplifier 73 has two differential input circuits, one circuit comprising a non-inverting input terminal and an inverting feedback input terminal and the other circuit comprising an inverting input terminal and a non-inverting feedback input terminal, a pair of differential output circuit comprising a non-inverting output terminal and an inverting output terminal and two balance input means comprising two balance input terminals. A reference voltage is applied to the first balance input terminal of the operational amplifier 73 and the output of the DC feedback level detecting circuit 24 enters the second balance input terminal of the operational amplifier 73.

Figure 35:
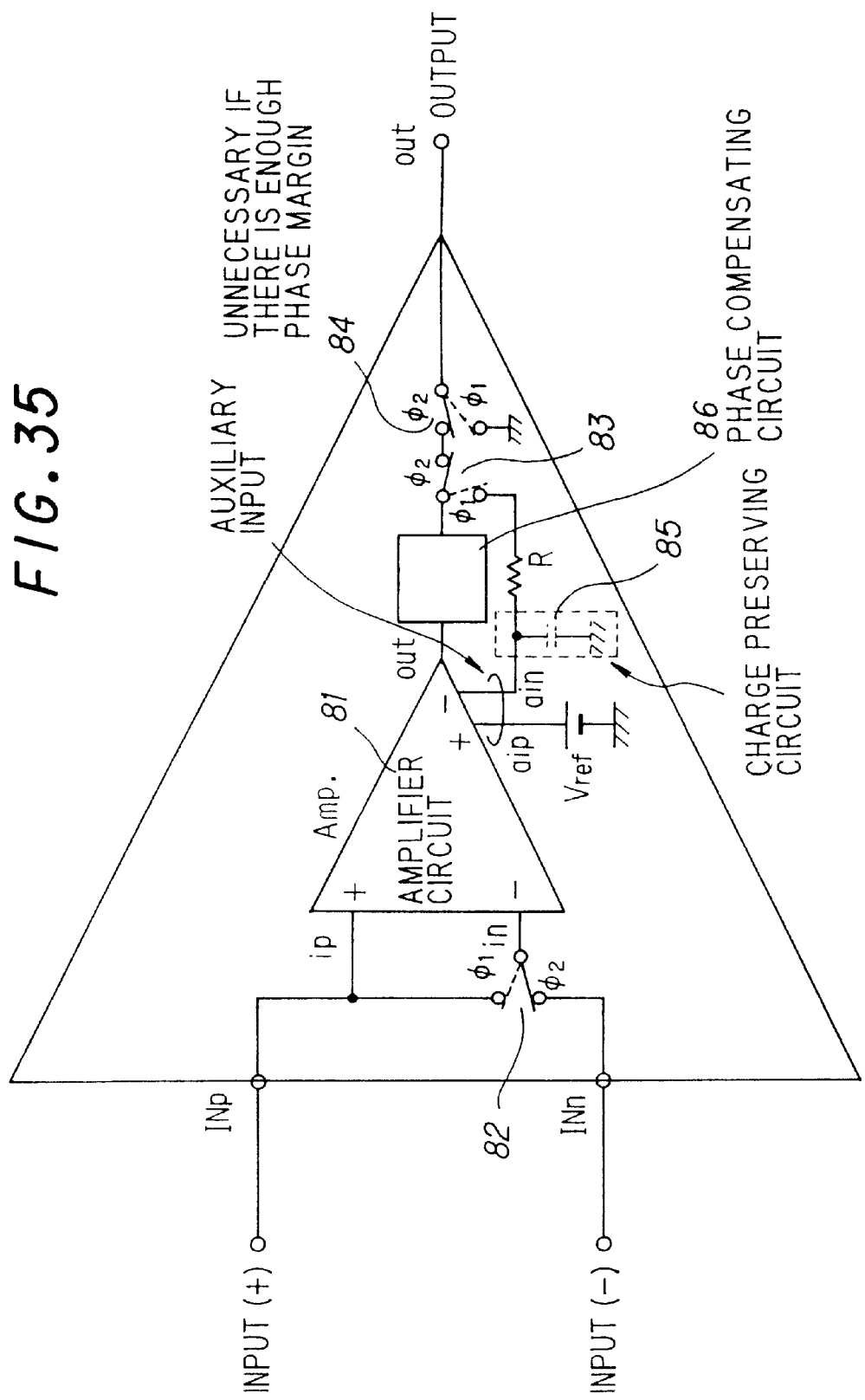
FIG. 35 is a diagram illustrating an automatic offset canceling comparator.

(F) Automatic Offset Canceling Comparator Applicable to Slicer Circuit (a) Automatic Offset Canceling Comparator FIG. 35 is a diagram illustrating the configuration of an automatic offset canceling comparator applicable to each comparator constituting the slicer circuit 23.

The comparator, which has a non-inverting input terminal INp, a inverting input terminal INn and an output terminal OUT, includes an amplifier circuit 81 having differential inputs and auxiliary differential inputs, first switch means 82 which short-circuits the non-inverted side ip and inverted side in of the amplifier circuit 81 in a first state $\phi_1$ and short-circuits the inverting input terminal INn and the inverted side in of the differential inputs of the amplifier circuit 81 in a second state $\phi_2$, and second and third switch means 83, 84 which connect the output terminal OUT of the amplifier circuit 81 and the inverted side ain of the auxiliary differential inputs of the amplifier circuit via a resistor R and short-circuits the output terminal OUT to ground in the first state $\phi_1$, and which short-circuits the output terminal OUT and the output OUT of the amplifier circuit 81 in the second state $\phi_2$ The non-inverting input terminal INp and the non-inverting side ip of the differential inputs of the amplifier circuit 81 are connected, a reference voltage Vref is applied to the non-inverting side aip of the auxiliary differential inputs of the amplifier circuit 81, a charge preserving circuit 85 is connected to the negative side of the auxiliary differential inputs of the amplifier circuit 81, and a phase compensating circuit 86 is connected between the output OUT of the amplifier circuit 81 and the second switch means 83. The phase compensating circuit 86 is unnecessary if there is enough phase margin.

The non-inverting and inverting inputs ip and in of the comparator are short-circuited in a time period $\phi_1$ (the first state, which is the offset canceling mode). The output of the amplifier circuit 81 is fed back to the inverting auxiliary input ain via the resistor R, the output level becomes equal to the reference voltage level Vref, and the comparator output is fixed at the low level ("L"). The phase compensating circuit 86 prevents oscillation due to feedback.

The level of the inverting auxiliary input ain of the amplifier circuit 81 at the time of operation in the time period $\phi_1$ is preserved in the charge preserving circuit 85. When the two input levels are equal in a time period $\phi_2$ (the second state, which is the ordinary mode), which is time other than the time period $\phi_1$, the output level of the comparator becomes Vref. Accordingly, if the reference voltage level Vref is set to be in the vicinity of a threshold value Vth of the next digital stage, the input offset of the comparator can be canceled. If the gain of the comparator is made sufficiently large, then the offset between Vref and Vth will become very small if calculated in terms of differential input offset.

(b) Application of Comparator to Slicer Circuit

Figure 36:
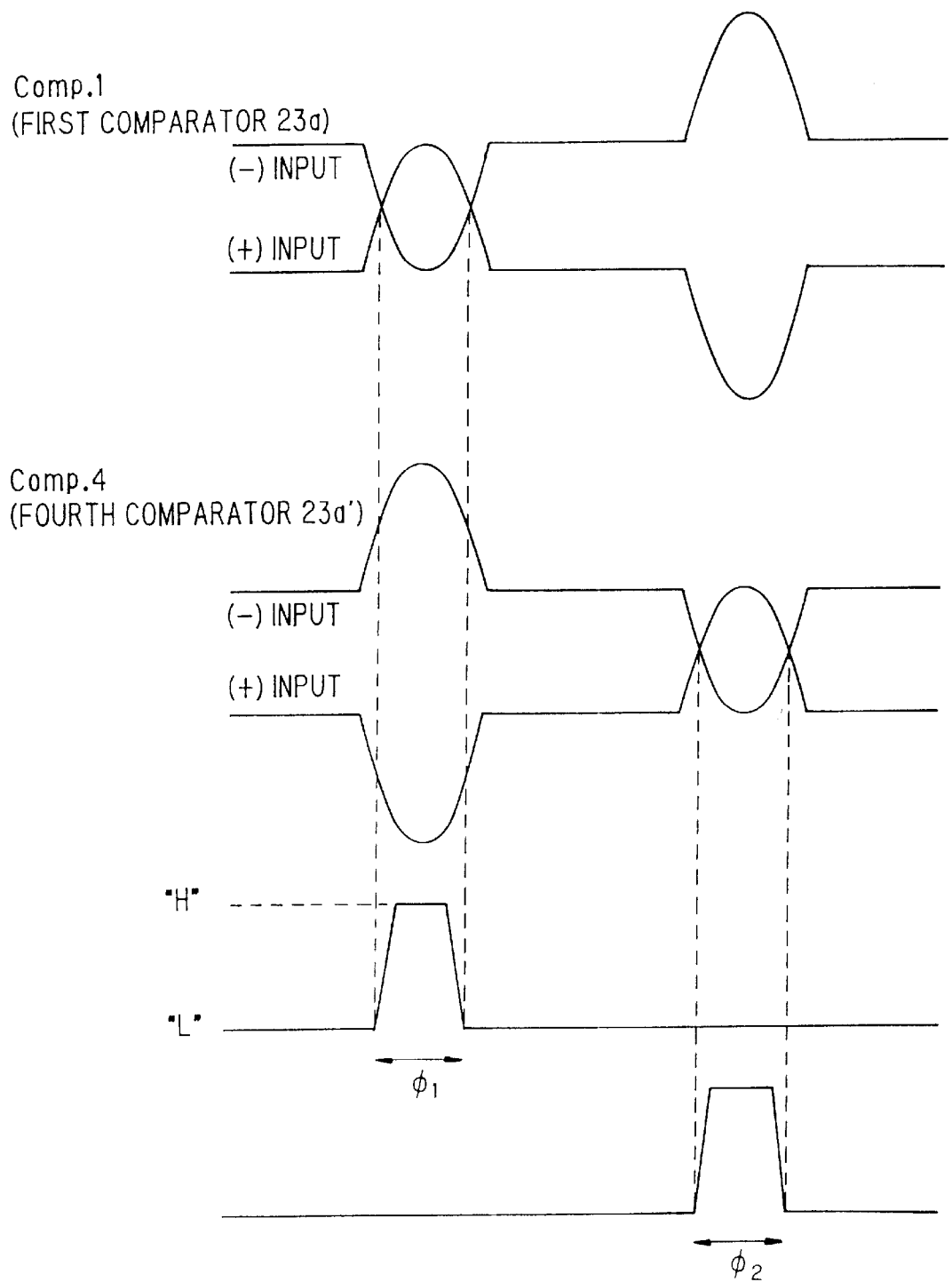
FIG. 36 is a time chart useful in describing offset cancellation.
Figure 37:
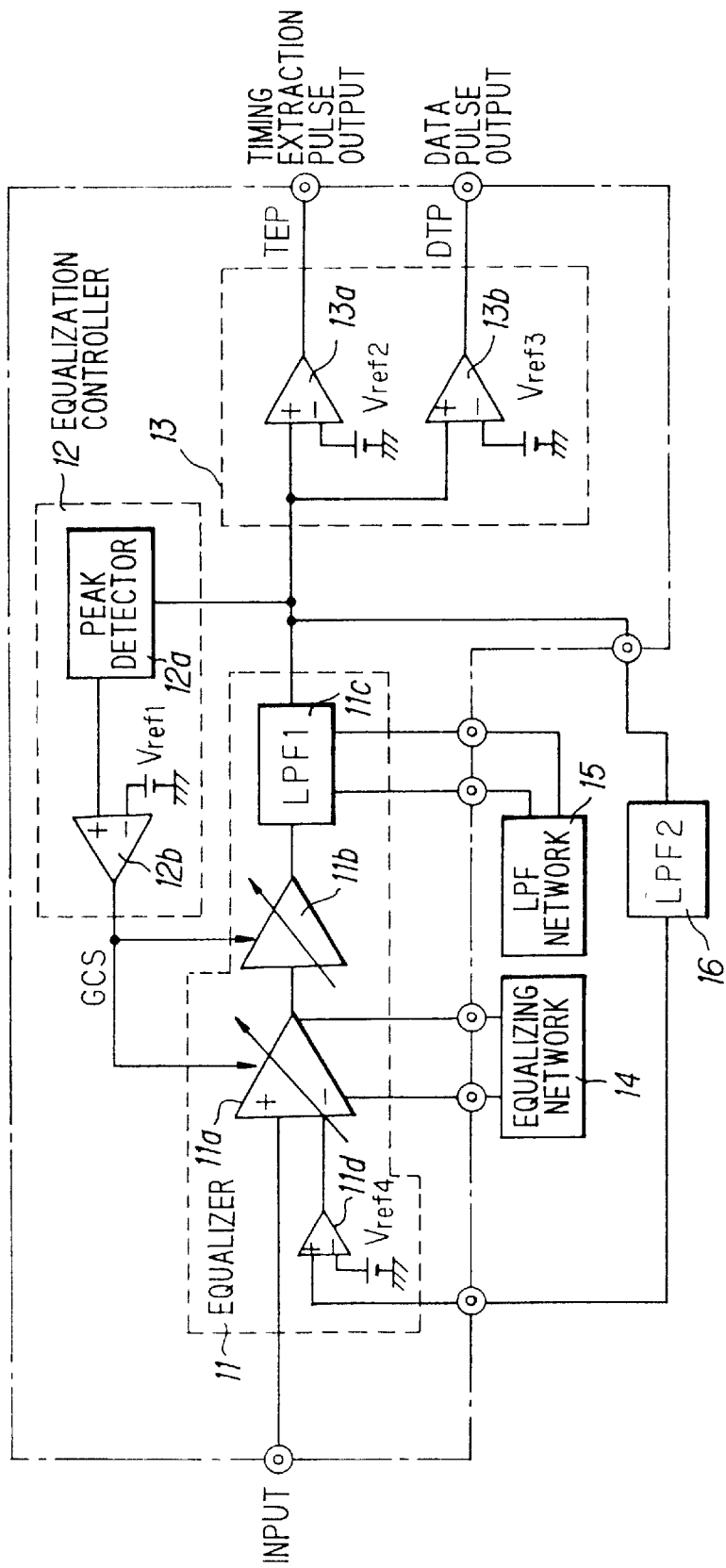
FIG. 37 is a diagram showing an example of the configuration of a transmission-line loss equalizing circuit according to the prior art.

The comparator of FIG. 35 is used in six comparators 23a~23c' shown in FIG. 22. The period of time during which the output of the first comparator 23 a for outputting the data pulses on the non-inverting side is at the "H" level is adopted as $\phi_1$ (see the time chart of FIG. 36), and the fourth through sixth comparators 23a'~23c' are placed in the offset canceling mode for this period of time. Similarly, the period of time during which the output of the fourth comparator 23a' for outputting the data pulses on the inverting side is at the "H" level is adopted as $\phi_2$, and the first through third comparators 23a~23c are placed in the offset canceling mode for this period of time.

More specifically, the fourth through sixth comparators 23a'~23c' assume the first state (the offset canceling mode) in the time period $\phi_1$ and the second state (the ordinary mode) at times other than the time period $\phi_1$. The first through third comparators 23a~23c assume the first state (the offset canceling mode) in the time period $\phi_2$ and the second state (the ordinary mode) at times other than the time period $\phi_2$.

Since it is not possible for the fourth through sixth comparators 23a'~23c' to attain the "H" level during the time period $\phi_1$, problems do not arise when these comparators are placed in the offset canceling mode. Similarly, problems do not arise when the first through third comparators 23a~23c are placed in the offset canceling mode for the time period $\phi_2$.

If the arrangement described above is adopted, input offset can be made sufficiently small and the equalized output waveform comprising a continuous signal can be sliced. Problem 7 of the prior art can thus be solved.

In accordance with the present invention, a differential non-inverting amplifier circuit can be constructed and applied to the √fAGC circuit of an equalizer to make differential-type equalization possible. This makes it possible to eliminate the influence of a fluctuation in power-supply voltage, a fluctuation in ground voltage, power-supply noise and ground noise that were problems in the prior art. Further, if the differential amplifier constructing the differential non-inverting amplifier circuit is used, it is easy to construct a differential-type voltage follower in which the DC levels of a pair of differential outputs can be made equal to the balance input level.

In accordance with the present invention, √fAGC circuits are cascade-connected in a plurality of stages and constructed within an integrated circuit, and an equalizing network also uses internal elements of the integrated circuit. As a result, an equalization curve can be set more precisely in comparison with the prior art, in which use is made of only a single √fAGC circuit. Moreover, a smaller equalization deviation can be realized without external elements.

In accordance with the present invention, an attenuating circuit is provided as the initial stage within an integrated circuit and a √fAGC circuit whose characteristic varies from low-pass to flat to high-pass is provided as the succeeding stage, thereby constructing an equalizing circuit. As a result, the number of external elements can be reduced by the number of external elements that construct the attenuating circuit. Moreover, by using √fAGC circuit whose characteristic varies from low-pass to flat to high-pass, there is no influence from pre-equalized components applied to a transmitted waveform, and an equalized waveform that is independent of transmission line length can be obtained.

In accordance with the present invention, a variable attenuating circuit is provided as an input stage as means for obtaining a change in gain in which the frequency characteristic is flat. As a result, the minimum value of the attenuating circuit output increases by the amount of change in the flat AGC, thermal noise can be reduced and the dynamic range can be broadened correspondingly.

In accordance with the present invention, a voltage proportional to the difference between the pulse widths of positive equalization control pulses and negative equalization control pulses, namely a voltage proportional to the difference between the DC levels on the non-inverted and inverted sides, is detected and DC feedback is applied. As a result, it is possible to detect the difference between the non-inverted and inverted DC levels and to apply DC feedback without using a low-pass filter that is required in the prior art.

In accordance with the present invention, a slicer circuit is constructed by providing resistance-divided level shifters or resistance-divided level shifters having current sources in front of comparators, wherein slice pulses are output by comparing signals. As a result, the balance of duties of positive and negative pulses can be improved. Further, a slicer circuit is constructed by incorporating a current source and a level shifter in the integrated circuit on one chip. This makes it possible to perform a constant level shift independently of manufacturing variances, to improve the duty balance of positive and negative pulses and to reduce equalization deviation. A more accurate level shift is made possible by using the current mirror of the invention.

In accordance with the present invention, a comparator is constructed in such a manner that an offset mode is established to cancel input offset when the output level is low, and this comparator is applied to a slicer circuit. As a result, input offset can be kept sufficiently small and an equalized output waveform consisting of a continuous signal can be sliced.

In accordance with the present invention, charged current becomes larger than discharged current and an integrated output (gain control signal) increases when the peak of an equalized output is large. When the peak value is small, the discharged current becomes larger and the integrated output (gain control signal) decreases. On the basis of such a gain control signal that conforms to the magnitude of the peak value, gain is controlled in such a manner that the peak of the equalized output is rendered constant. As a result, equalization control independent of the pulse density of input data becomes possible without external elements. Further, if arrival of data pulses is interrupted for longer than a predetermined period of time, the integrated output (gain control signal) declines with the passage of time. As a result, an interruption in an input signal can be detected with ease by monitoring the integrated output level.

As many apparently widely different embodiments of the present invention can be made without departing from the spirit and scope thereof, it is to be understood that the invention is not limited to the specific embodiments thereof except as defined in the appended claims.

What is claimed is:

1. A differential non-inverting amplifier circuit comprising:

two differential input circuits, one circuit comprising a non-inverting input terminal and an inverting feedback input terminal and the other circuit comprising an inverting input terminal and a non-inverting feedback input terminal;

one pair of differential outputs comprising a non-inverting output terminal and an inverting output terminal; and a balance level input terminal for deciding average DC levels of said pair of differential outputs, wherein the non-inverting input terminal, the inverting input terminal, the non-inverting output terminal and the inverting output terminal of said operational amplifier serve as a first signal input terminal, second signal input terminal, first signal output terminal and second signal output terminal, respectively, a first passive element is connected between the inverting feedback input terminal and ground, a second passive element having an impedance equal to that of the first passive element is connected between the non-inverting feedback input terminal and ground, a third passive element is connected between the inverting feedback input terminal and the and the non-inverting output terminal, and a fourth passive element having an impedance equal to that of the third passive element is connected between the non-inverting feedback input terminal and the inverting output terminal.

2. A differential-type variable high-pass filter according to claim 1, said high-pass filter having circuits, each of which is obtained by serially connecting a resistor and a capacitor, as the first and second passive elements of said differential non-inverting amplifier circuit, and variable resistors as the third and fourth passive elements of said differential non-inverting amplifier circuit.

3. The variable high-pass filter according to claim 2, wherein the non-inverting input terminal and inverting input terminal of said operational amplifier serve as differential input terminals, one end of a resistor is connected to the non-inverting output terminal, one end of a resistor having a resistance value equal to that of said first-mentioned resistor is connected to the inverting output terminal of said operational amplifier, other ends of these resistors each serve as a differential output terminal, and a circuit having an impedance value equal to that of the serially connected resistor-capacitor circuit serving as the first or second passive element is provided between said differential output terminals.

4. A transmission-line loss equalizing circuit according to claim 2, wherein said variable high-pass filter is provided as a √fAGC circuit.

5. A transmission-line loss equalizing circuit according to claim 2, wherein a plurality of said differential variable high-pass filters are cascade-connected inside an integrated circuit, and the first, second, third and fourth passive elements of each differential variable high-pass filter are provided inside the integrated circuit to construct a √fAGC circuit.

6. A differential voltage follower comprising:

two differential input circuits, one circuit comprising a non-inverting input terminal and an inverting feedback input terminal and the other circuit comprising an inverting input terminal and a non-inverting feedback input terminal;

one pair of differential outputs comprising a non-inverting output terminal and an inverting output terminal; and a balance level input terminal for deciding average DC levels of said pair of differential outputs, wherein the non-inverting input terminal of said operational amplifier serves as a non-inverting signal input terminal, the inverted input terminal of said operational amplifier serves as an inverting signal input terminal, the non-inverting output terminal and inverting feedback input terminal of said operational amplifier are short-circuited and serve as a non-inverting signal output terminal, and the inverting output terminal and non-inverting feedback input terminal of said operational amplifier are short-circuited and serve as an inverting signal output terminal.

7. An operational amplifier comprising:

two differential input circuits, one circuit comprising a non-inverting input terminal and an inverting feedback input terminal and the other circuit comprising an inverting input terminal and a non-inverting feedback input terminal;

one pair of differential outputs comprising a non-inverting output terminal and an inverting output terminal; and a balance level input terminal for deciding average DC levels of said pair of differential outputs;

a balance signal input means for entering a balance signal;

means for mirroring a sum of currents which flow through non-inverting sides of said two differential input circuits;

means for mirroring a sum of currents which flow through inverting sides of said two differential input circuits;

cascode amplifier stages in which the respective current sums are mirrored;

two phase compensating means connected to the output of the respective cascode amplifier stages;

means for detecting a common mode of the cascode amplifier stages;

a differential circuit to which the common mode and the balance signal are input; and means for mirroring each current, which flows through a non-inverted side and an inverted side of said differential circuit, in each cascode amplifier stage;

output signals of the respective cascode amplifier stages being delivered as a pair of differential output signals of said operational amplifier.

8. An operational amplifier comprising:

two differential input circuits, one circuit comprising a non-inverting input terminal and an inverting feedback input terminal and the other circuit comprising an inverting input terminal and a non-inverting feedback input terminal;

one pair of differential outputs comprising a non-inverting output terminal and an inverting output terminal;

a balance level input terminal for deciding average DC levels of said pair of differential outputs;

a balance signal input means for entering a balance signal;

means for mirroring a sum of currents which flow through non-inverted sides of said two differential input circuits;

means for mirroring a sum of currents which flow through inverted sides of said two differential input circuits;

cascode amplifier stages in which the respective current sums are mirrored;

two phase compensating means connected to the output of the respective cascode amplifier stages;

two output buffers connected to the output of the respective cascode amplifier stages;

means for detecting a common mode of the two output buffers;

a differential circuit to which the common mode and the balance signal are input; and means for mirroring each current, which flows through a non-inverted side and an inverted side of said differential circuit, in each of the two cascode amplifier stages;

output signals of the two output buffers being delivered as a pair of differential output signals of said operational amplifier.

9. An operational amplifier comprising:

two differential input circuits, one circuit comprising a non-inverting input terminal and an inverting feedback input terminal and the other circuit comprising an inverting input terminal and a non-inverting feedback input terminal;

one pair of differential outputs comprising a non-inverting output terminal and an inverting output terminal;

a balance level input terminal for deciding average DC levels of said pair of differential outputs;

a balance signal input means for entering a balance signal;

a cascode amplifier stage in which a sum of currents which flow through non-inverted sides of said two differential input circuits is current-folded;

a cascode amplifier stage in which a sum of currents which flow through inverted sides of said two differential input circuits is current-folded;

two phase compensating means connected to the output of the respective cascode amplifier stages;

means for detecting a common mode of the two cascode amplifier stages;

a differential circuit to which the common mode and the balance signal are input;

and means for mirroring each current, which flows through a non-inverted side and an inverted side of said differential circuit, in each of the two cascode amplifier stages;

output signals of the two cascode amplifier stages being delivered as a pair of differential output signals of said operational amplifier.

10. An operational amplifier comprising:

two differential input circuits, one circuit comprising a non-inverting input terminal and an inverting feedback input terminal and the other circuit comprising an inverting input terminal and a non-inverting feedback input terminal;

one pair of differential outputs comprising a non-inverting inverting output terminal and an inverting output terminal;

a balance level input terminal for deciding average DC levels of said pair of differential outputs;

a balance signal input means for entering a balance signal;

a cascode amplifier stage in which a sum of currents which flow through non-inverted sides of said two differential inputs is current-folded;

a cascode amplifier stage in which a sum of currents which flow through inverted sides of said two differential input circuits is current-folded;

two phase compensating means connected to the output of the respective cascode amplifier stages;

an output buffer connected to an output of each cascode amplifier stage;

means for detecting a common mode of the two output buffers;

a differential circuit to which the common mode and the balance signal are input; and means for mirroring each current, which flows through a non-inverted side and an inverted side of said pair of differential circuits, in each of the two cascode amplifier stages;

output signals of the two output buffers being delivered as a pair of differential output signals of said operational amplifier.

11. A differential non-inverting amplifier circuit comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals, wherein the non-inverting input terminal, the inverting input terminal, the non-inverting output terminal and the inverting output terminal of said operational amplifier serve as a first signal input terminal, second signal input terminal, first signal output terminal and second signal output terminal, respectively, a first passive element is connected between the inverting feedback input terminal and ground, a second passive element having an impedance equal to that of the first passive element is connected between the non-inverting feedback input terminal and ground, a third passive element is connected between the inverting feedback input terminal and the non-inverting output terminal, a fourth passive element having an impedance equal to that of the third passive element is connected between the non-inverting feedback input terminal and the inverting output terminal, a constant voltage level is input to one of the two balance level input terminals and a variable level is input to the other of the two balance level input terminals.

12. A differential-type variable high-pass filter according to claim 11, said high-pass filter having circuits, each of which is obtained by serially connecting a resistor and a capacitor, as the first and second passive elements of said differential non-inverting amplifier circuit, and variable resistors as the third and fourth passive elements of said differential non-inverting amplifier circuit.

13. The variable high-pass filter according to claim 12, wherein the non-inverting input terminal and inverting input terminal of said operational amplifier serve as differential input terminals, one end of a resistor is connected to the non-inverting output terminal, one end of a resistor having a resistance value equal to that of said first-mentioned resistor is connected to the inverting output terminal of said operational amplifier, other ends of these resistors each serve as a differential output terminal, and a circuit having an impedance value equal to that of the serially connected resistor-capacitor circuit serving as the first or second passive element is provided between said differential output terminals.

14. A transmission-line loss equalizing circuit according to claim 12, wherein said variable high-pass filter is provided as a $\sqrt{f}$AGC circuit.

15. A transmission-line loss equalizing circuit according to claim 12, wherein a plurality of said differential variable high-pass filters are cascade-connected inside an integrated circuit, and the first, second, third and fourth passive elements of each differential variable high-pass filter are provided inside the integrated circuit to construct a $\sqrt{f}$AGC circuit.

16. A differential voltage follower comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals, wherein the non-inverting input terminal of said operational amplifier serves as a non-inverting signal input terminal, the inverting input terminal of said operational amplifier serves as an inverting signal input terminal, the non-inverting output terminal and inverting feedback input terminal of said operational amplifier are short-circuited and serve as a non-inverting signal output terminal, and the inverting output terminal and non-inverting feedback input terminal of said operational amplifier are short circuited and serve as an inverting signal output terminal.

17. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non-inverting and inverting balance signals;

means for mirroring a sum of currents which flow through non-inverting sides of said two differential input circuits;

means for mirroring a sum of currents which flow through inverted sides of said two differential input circuits;

cascode amplifier stages in which the respective current sums are mirrored;

two phase compensating means connected to the output of the respective cascode amplifier stages;

means for detecting a common mode of the two cascode amplifier stages;

a differential circuit to which the common mode and the two non-inverting and inverting balance signals are input;

means for mirroring a current, which flows through a non-inverted side of said differential circuit, on a non-inverted side of said cascode amplifier stages; and means for mirroring a current, which flows through an inverted side of said differential circuit, on an inverted side of said cascode amplifier stages;

output signals of the two cascode amplifier stages being delivered as a pair of differential output signals of said operational amplifier.

18. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non-inverted and inverted balance signals;

a cascode amplifier stage in which a sum of currents which flow through non-inverted sides of said two differential input circuits is current-folded;

a cascode amplifier stage in which a sum of currents which flow through inverted sides of said two differential input circuits is current-folded;

two phase compensating means connected to the output of the respective cascode amplifier stages;

means for detecting a common mode of the two cascode amplifier stages;

a differential circuit to which the common mode and the two balance signals are input;

means for mirroring a current, which flows through a non-inverted side of said differential circuit, on a non-inverted side of said cascode amplifier stages; and means for mirroring a current, which flows through an inverted side of said differential circuit, on an inverted side of said cascode amplifier stages;

output signals of the two cascode amplifier stages being delivered as a pair of differential output signals of said operational amplifier.

19. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal inputs for entering non-inverted and inverted balance signals;

a cascode amplifier stage in which a sum of currents which flow through non-inverted sides of said two differential input circuits is current-folded;

a cascode amplifier stage in which a sum of currents which flow through inverted sides of said two differential input circuits is current-folded;

two phase compensating means connected to the output of the respective cascode amplifier stages;

two output buffers connected to the output of the respective cascode amplifier stages;

means for detecting a common mode of the two output buffers;

a differential circuit to which the common mode and the two balance signals are input;

means for mirroring a current, which flows through a non-inverted side of said differential circuit, on a non-inverted side of said cascode amplifier stages; and means for mirroring a current, which flows through an inverted side of said differential circuit, on an inverted side of said cascode amplifier stages;

output signals of the two output buffers being delivered as a pair of differential output signals of said operational amplifier.

20. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non-inverted and inverted balance signals;

first mirror means for mirroring a sum of currents which flow through non-inverted sides of the two differential input circuits;

second mirror means for mirroring a sum of currents which flow through inverted sides of the two differential input circuits;

a first cascode amplifier stage in which said sum of the current is mirrored by said first mirror means;

a second cascode amplifier stage in which said sum of the current is mirrored by said second mirror means;

two phase compensating means connected to the output of the respective cascode amplifier stages;

means for detecting a common mode off the two cascode amplifier stages;

a first differential common-mode feedback circuit to which the common mode and the non-inverted balance signal are input;

a second differential common-mode feedback circuit to which the common mode and the inverted balance signal are input;

third mirror means for mirroring a current, which flows through one side of said first differential common-mode feedback circuit, in said first cascode amplifier stage; and fourth mirror means for mirroring a current, which flows through one side of said second differential common-mode feedback circuit, in said second cascode amplifier stage;

output signals of the two cascode amplifier stages being delivered as a pair of differential output signals of said operational amplifier.

21. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal inputs for entering non-inverted and inverted balance signals;

first mirror means for mirroring a sum of currents which flow through non-inverted sides of the two differential input circuits;

second mirror means for mirroring a sum of currents which flow through inverted sides of the two differential input circuits;

a first cascode amplifier stage in which said sum of the current is mirrored by said first mirror means;

a second cascode amplifier stage in which said sum of the current is mirrored by said second mirror means;

two phase compensating means connected to the output of the respective cascode amplifier stages;

two output buffers connected to the output of the respective cascode amplifier stages;

means for detecting a common mode of the two output buffers;

a first differential common-mode feedback circuit to which the common mode and the non-inverted balance signal are input;

a second differential common-mode feedback circuit to which the common mode and the inverted balance signal are input;

third mirror means for mirroring a current, which flows through one side of said first differential common-mode feedback circuit, in said first cascode amplifier stage; and fourth mirror means for mirroring a current, which flows through one side of said second differential common-mode feedback circuit, in said second cascode amplifier stage;

output signals of the two output buffers being delivered as a pair of differential output signals of said operational amplifier.

22. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non inverted and inverted balance signals;

a cascode amplifier stage in which a sum of currents which flow through non-inverted sides of said two differential input circuits is current-folded;

a cascode amplifier stage in which a sum of currents which flow through inverted sides of said two differential input circuits is current-folded;

two phase compensating means connected to the output of the respective cascode amplifier stages;

means for detecting a common mode of the two cascode amplifier stages;

a first differential common-mode feedback circuit to which the common mode and the non-inverted balance signal are input;

a second differential common-mode feedback circuit to which the common mode and the inverted balance signal are input;

means for mirroring a current, which flows through one side of said first differential common-mode feedback circuit, in one of said cascode amplifier stages; and means for mirroring a current, which flows through one side of said second pair of differential common-mode feedback circuit, in the other of said cascode amplifier stages;

output signals of the two cascode amplifier stages being delivered as a pair of differential output signals of said operational amplifier.

23. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal inputs for entering non-inverted and inverted balance signals;

a cascode amplifier stage in which a sum of currents which flow through non-inverted sides of said differential input circuit is current-folded;

a cascode amplifier stage in which a sum of currents which flow through inverted sides of said two differential input circuits is current-folded;

two phase compensating means connected to the output of the respective cascode amplifier stages;

two output buffer connected to the output of the respective cascode amplifier stage;

means for detecting a common mode of the two output buffers;

a first differential common-mode feedback circuit to which the common mode and the non-inverted balance signal are input;

a second differential common-mode feedback circuit to which the common mode and the inverting balance signal are input;

means for mirroring a current, which flows through one side of said first pair of differential common-mode feedback circuit, in one of said cascode amplifier stages; and means for mirroring a current, which flows through one side of said second differential common-mode feedback circuit, in the other of said cascode amplifier stages;

output signals of the two output buffers being delivered as a pair of differential output signals of said operational amplifier.

24. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non inverted and inverted balance signals;

mirror means for mirroring a sum of currents which flow through non-inverted sides of the two pairs of differential input circuit;

mirror means for mirroring a sum of currents which flow through inverted sides of the two differential input circuit;

two cascode amplifier stages in which the respective current sums are mirrored;

two phase compensating means connected to the output of the respective cascode amplifier stages;

means for detecting a common mode of the output of the two cascode amplifier stages;

a first differential common-mode feedback circuit to which the common mode and the non-inverted balance signal are input;

a second differential common-mode feedback circuit to which the common mode and the inverted balance signal are input;

means for folding a current, which flows through one side of said first differential common-mode feedback circuit, in one of said cascode amplifier stages; and means for folding a current, which flows through one side of said second differential common-mode feedback circuit, in the other of said cascode amplifier stages;

output signals of the two cascode amplifier stages being delivered as a pair of differential output signals of said operational amplifier.

25. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non inverted and inverted balance signals;

mirror means for mirroring a sum of currents which flow through non-inverted sides of the two differential input circuit;

mirror means for mirroring a sum of currents which flow through inverting sides of the two differential input circuit;

two cascode amplifier stages in which the respective current sums are mirrored;

phase compensating means connected to an output of each cascode amplifier stage;

two output buffers connected to the output of the respective cascode amplifier stages;

means for detecting a common mode of the two output buffers;

a first differential common-mode feedback circuit to which the common mode and the non-inverted balance signal are input;

a second differential common-mode feedback circuit to which the common mode and the inverted balance signal are input;

means for folding a current, which flows through one side of said first differential common-mode feedback circuit, in one of said cascode amplifier stages; and means for folding a current, which flows through one side of said second differential common-mode feedback circuit, in the other of said cascode amplifier stages;

output signals of the two output buffers being delivered as a pair of differential output signals of said operational amplifier.

26. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non inverted and inverted balance signals;

a cascode amplifier stage in which a sum of currents which flow through non-inverted sides of said two differential input circuit is current-folded;

a cascode amplifier stage in which a sum of currents which flow through inverted sides of said two differential input circuit is current-folded;

two phase compensating means connected to the output of the respective cascode amplifier stages;

means for detecting a common mode of the outputs of said two cascode amplifier stages;

a first differential common-mode feedback circuit to which the common mode and the non-inverted balance signal are input;

a second differential common-mode feedback circuit to which the common mode and the inverted balance signal are input;

means for folding a current, which flows through one side of said first differential common-mode feedback circuit, in one of said cascode amplifier stages; and means for folding a current, which flows through one side of said second differential common-mode feedback circuit, in the other of said cascode amplifier stages;

output signals of the two cascode stages being delivered as a pair of differential output signals of said operational amplifier.

27. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non inverted and inverted balance signals;

a cascode amplifier stage in which a sum of currents which flow through non-inverted sides of said two differential input circuit is current-folded;

a cascode amplifier stage in which a sum of currents which flow through inverted sides of said two pairs of differential input circuit is current-folded;

two phase compensating means connected to the output of the respective cascode amplifier stages;

two output buffers connected to the output of the respective cascode amplifier stages;

means for detecting a common mode of the two output buffers;

a first differential common-mode feedback circuit to which the common mode and the non-inverted balance signal are input;

a second pair of differential common-mode feedback circuit to which the common mode and the inverted balance signal are input;

means for folding a current, which flows through one side of said first differential common-mode feedback circuit, in one of said cascode amplifier stages; and means for folding a current, which flows through one side of said second differential common-mode feedback circuit, in the other of said cascode amplifier stages;

output signals of the two output buffers being delivered as a pair of differential output signals of said operational amplifier.

28. An operational amplifier comprising:

two differential input circuits, one circuit comprising a non-inverting input terminal and an inverting feedback input terminal and the other circuit comprising an inverting input terminal and a non-inverting feedback input terminal;

one pair of differential output terminals comprising a non-inverting output terminal and an inverting output terminal;

a first balance level input terminal for deciding an average DC level of a non-inverted output of said pair of differential output terminals;

and a second balance level input terminal for deciding an average DC level of an inverted output of said pair of differential output terminals;

balance signal input means for entering non inverted and inverted balance signals;

means for mirroring a sum of currents which flow through non-inverted sides of said two differential input circuit;

means for mirroring a sum of currents which through inverting sides of said two differential circuit;

two cascode amplifier stages in which the respective current sums are mirrored;

two phase compensating means connected to the output of the respective cascode amplifier stages;

two output buffers connected to the output of the respective cascode amplifier stages;

means for detecting a common mode of the two output buffers;

one differential circuit to which the common mode and the two non-inverted and inverted balance signals are input;

means for mirroring a current, which flows through a non-inverted side of said differential circuit, on a non-inverted side of said cascode amplifier stages; and means for mirroring a current, which flows through an inverted side of said differential circuit, on an inverted side of said cascode amplifier stages;

output signals of the two output buffers being delivered as a pair of differential output signals of said operational amplifier.

29. A differential circuit comprising a first differential non-inverting amplifier circuit provided as an initial stage and a second differential non-inverting amplifier circuit provided as stages from a second stage onward;

said first differential non-inverting amplifier circuit including an operational amplifier having a non-inverting input terminal, an inverting input terminal, a non-inverting output terminal and an inverting output terminal serving as a first signal input terminal, second signal input terminal, first signal output terminal and second signal output terminal, respectively; a first passive element connected between the inverting feedback input terminal and ground; a second passive element having an impedance equal to that of the first passive element connected between the non-inverting feedback input terminal and ground; a third passive element connected between the inverting feedback input terminal and the non-inverting output terminal; a fourth passive element having an impedance equal to that of the third passive element connected between the non-inverting feedback input terminal and the inverting output terminal; and two balance input terminals; wherein a constant-voltage level is input to one of said two balance input terminals and a variable voltage level is input to the other of said two balance input terminals;

said second differential non-inverting amplifier circuit including an operational amplifier having a non-inverting input terminal, an inverting input terminal, a non-inverting output terminal and an inverting output terminal serving as a first signal input terminal, second signal input terminal, first signal output terminal and second signal output terminal, respectively; a first passive element connected between the inverting feedback input terminal and ground; a second passive element having an impedance equal to that of the first passive element connected between the non-inverting feedback input terminal and ground; a third passive element connected between the inverting feedback input terminal and the non-inverting output terminal; a fourth passive element having an impedance equal to that of the third passive element connected between the non-inverting feedback input terminal and the inverting output terminal; and one balance input terminal; wherein a constant-voltage level is input to said one balance input terminal.

* * * * *